(12) United States Patent
Yu et al.

(10) Patent No.: US 11,444,034 B2
(45) Date of Patent: Sep. 13, 2022

(54) REDISTRIBUTION STRUCTURE FOR INTEGRATED CIRCUIT PACKAGE AND METHOD OF FORMING SAME

(71) Applicant: Taiwan Semiconductor Manufacturing Co., Ltd., Hsinchu (TW)

(72) Inventors: Chen-Hua Yu, Hsinchu (TW); An-Jhih Su, Taoyuan (TW); Der-Chyang Yeh, Hsinchu (TW); Li-Hsien Huang, Zhubei (TW); Ming Shih Yeh, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/015,370

(22) Filed: Sep. 9, 2020

(65) Prior Publication Data

US 2021/0358854 A1 Nov. 18, 2021

Related U.S. Application Data

(60) Provisional application No. 63/026,378, filed on May 18, 2020.

(51) Int. Cl.
*H01L 23/31* (2006.01)
*H01L 23/538* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01);
(Continued)

(58) Field of Classification Search
CPC ............ H01L 23/5389; H01L 23/3128; H01L 23/5383; H01L 23/5386; H01L 21/4853; H01L 21/4857; H01L 21/565; H01L 21/568; H01L 21/6835; H01L 24/19; H01L 24/20; H01L 25/0657; H01L 25/105; H01L 2221/68372; H01L 2224/214; H01L 2225/0651; H01L 2225/06568; H01L 2225/06586; H01L 2225/1035; H01L 2225/1058
See application file for complete search history.

(56) References Cited

U.S. PATENT DOCUMENTS

| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |

(Continued)

FOREIGN PATENT DOCUMENTS

TW 201401458 A 1/2014

*Primary Examiner* — Timor Karimy
(74) *Attorney, Agent, or Firm* — Slater Matsil, LLP

(57) ABSTRACT

A redistribution structure for a semiconductor device and a method of forming the same are provided. The semiconductor device includes a die encapsulated by an encapsulant, the die including a pad, and a connector electrically connected to the pad. The semiconductor device further includes a first via in physical contact with the connector. The first via is laterally offset from the connector by a first non-zero distance in a first direction. The first via has a tapered sidewall.

20 Claims, 64 Drawing Sheets

(51) Int. Cl.
*H01L 25/10* (2006.01)
*H01L 23/00* (2006.01)
*H01L 21/683* (2006.01)
*H01L 21/48* (2006.01)
*H01L 21/56* (2006.01)
*H01L 25/065* (2006.01)

(52) U.S. Cl.
CPC .......... *H01L 23/5386* (2013.01); *H01L 24/19* (2013.01); *H01L 24/20* (2013.01); *H01L 25/0657* (2013.01); *H01L 25/105* (2013.01); *H01L 2221/68372* (2013.01); *H01L 2224/214* (2013.01); *H01L 2225/0651* (2013.01); *H01L 2225/06568* (2013.01); *H01L 2225/06586* (2013.01); *H01L 2225/1035* (2013.01); *H01L 2225/1058* (2013.01)

(56) References Cited

U.S. PATENT DOCUMENTS

| | | | |
|---|---|---|---|
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2013/0341774 | A1* | 12/2013 | Chang .................. H01L 21/568 257/666 |
| 2016/0093580 | A1 | 3/2016 | Scanlan et al. |
| 2017/0084526 | A1 | 3/2017 | Lin et al. |
| 2018/0350745 | A1* | 12/2018 | Hsieh ..................... H01L 24/83 |
| 2019/0131233 | A1 | 5/2019 | Liu et al. |
| 2019/0181093 | A1 | 6/2019 | Dominguez et al. |
| 2020/0144191 | A1 | 5/2020 | Lee et al. |

* cited by examiner

US 11,444,034 B2

REDISTRIBUTION STRUCTURE FOR INTEGRATED CIRCUIT PACKAGE AND METHOD OF FORMING SAME

PRIORITY CLAIM AND CROSS-REFERENCE

This application claims the benefit of U.S. Provisional Application No. 63/026,378, filed on May 18, 2020, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
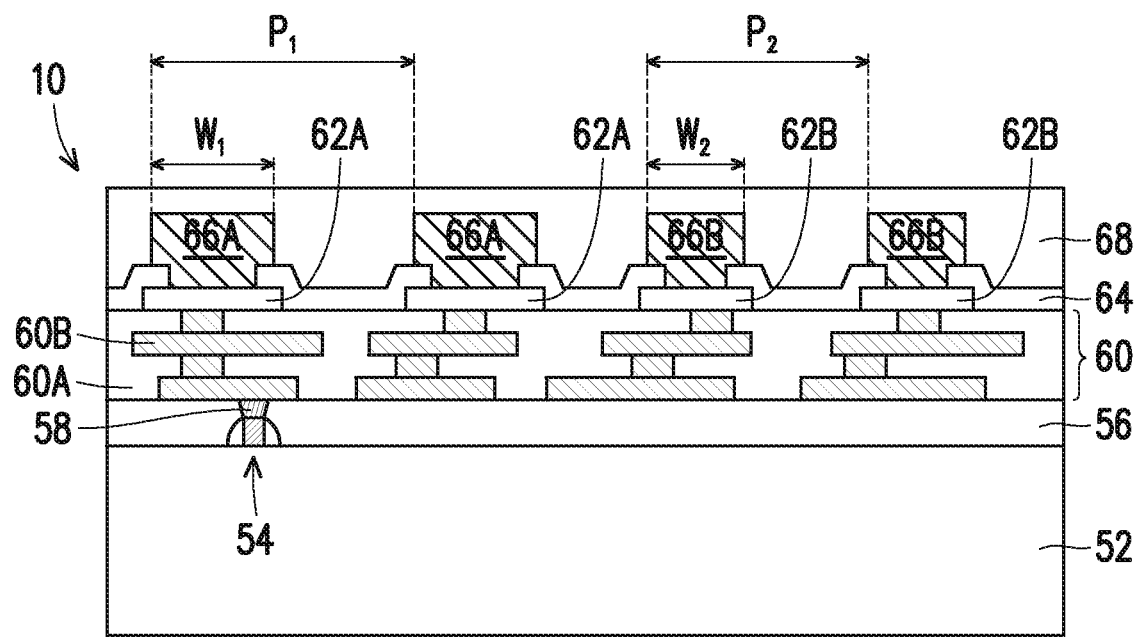
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a package, such as an integrated fan-out (InFO) package, and a method of forming the same. Various embodiments presented herein allow for packaging integrated circuit dies with connectors having reduced size and pitch. Various embodiments presented herein further allow for enlarged die shift/rotation window by forming redistribution structures over integrated circuit dies, such that vias of the redistribution structures are laterally shifted with respect to corresponding connectors of the integrated circuit dies and partially land on the corresponding connectors of the integrated circuit dies.

FIG. 1 illustrates a cross-sectional view of an integrated circuit die 10 in accordance with some embodiments. The integrated circuit die 10 will be packaged in subsequent processing to form an integrated circuit package. The integrated circuit die 10 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 10 may be formed in a wafer, which may include different device regions that are singulated in subsequent steps to form a plurality of integrated circuit dies. The integrated circuit die 10 may be processed according to applicable manufacturing processes to form integrated circuits. For example, the integrated circuit die 10 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, or the like. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), the like, or combinations thereof.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns 60B in dielectric layers 60A on the ILD 56. The metallization patterns 60B include metal lines and vias formed in one or more low-k dielectric layers 60A. The metallization patterns 60B of the interconnect structure 60 are electrically coupled to the devices 54 by the conductive plugs 58. In some embodiments, interconnect structure 60 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The integrated circuit die 10 further includes pads 62A and 62B, such as aluminum pads, to which external connections are made. The pads 62A and 62B are on the active side of the integrated circuit die 10, such as in and/or on the interconnect structure 60. In some embodiments, a width of the pads 62A is greater than a width of the pads 62B. In some embodiments, a pitch of the pads 62A is greater than a pitch of the pads 62B. One or more passivation films 64 are on the integrated circuit die 10, such as on portions of the interconnect structure 60 and the pads 62A and 62B. In some embodiments, the one or more passivation films 64 may comprise silicon oxide, silicon nitride, silicon oxynitride, the like, or a combination thereof. Openings extend through the passivation films 64 to the pads 62A and 62B.

Die connectors 66A and 66B, such as conductive pillars (for example, formed of a metal such as copper), extend through the openings in the passivation films 64 and are physically and electrically coupled to respective ones of the pads 62A and 62B. The die connectors 66A and 66B may be formed by, for example, plating, or the like. The die connectors 66A and 66B are electrically coupled to the respective integrated circuits of the integrated circuit die 10. In some embodiments, a width $W_1$ of the die connectors 66A is greater than a width $W_2$ of the die connectors 66B. In some embodiments, a pitch $P_1$ of the die connectors 66A is greater than a pitch $P_2$ of the die connectors 66B. In some embodiments, the die connectors 66B have a higher density than the die connectors 66A. Accordingly, the die connectors 66B may be also referred to as high-density die connectors and the die connectors 66A may be also referred to as low-density die connectors. In some embodiments, the width $W_1$ is between about 40 μm and about 70 μm. In some embodiments, the width $W_2$ is between about 15 μm and about 25 μm. In some embodiments, the pitch $P_1$ is between about 70 μm and about 110 μm. In some embodiments, the pitch $P_2$ is between about 19 μm and about 32 μm.

Optionally, solder regions (e.g., solder balls or solder bumps) may be disposed on the die connectors 66A and 66B. The solder balls may be used to perform chip probe (CP) testing on the integrated circuit die 10. The CP testing may be performed on the integrated circuit die 10 to ascertain whether the integrated circuit die 10 is a known good die (KGD). Thus, only integrated circuit dies 10, which are KGDs, undergo subsequent processing and are packaged, and dies, which fail the CP testing, are not packaged. After testing, the solder regions may be removed in subsequent processing steps.

An insulating layer 68 may (or may not) be on the active side of the integrated circuit die 10, such as on the passivation films 64 and the die connectors 66A and 66B. The insulating layer 68 laterally encapsulates the die connectors 66A and 66B, and the insulating layer 68 is laterally coterminous with the integrated circuit die 10. In some embodiments, the insulating layer 68 may bury the die connectors 66A and 66B, such that the topmost surface of the insulating layer 68 is above the topmost surfaces of the die connectors 66A and 66B. In some embodiments where solder regions are disposed on the die connectors 66A and 66B, the insulating layer 68 may bury the solder regions as well. Alternatively, the solder regions may be removed prior to forming the insulating layer 68.

The insulating layer 68 may be a polymer such as polybenzoxazole (PBO), polyimide, benzocyclobutene (BCB), or the like; a nitride such as silicon nitride or the like; an oxide such as silicon oxide, PSG, BSG, BPSG, or the like; the like, or a combination thereof. The insulating layer 68 may be formed, for example, by spin coating, lamination, chemical vapor deposition (CVD), or the like. In some embodiments, the die connectors 66A and 66B are exposed through the insulating layer 68 during formation of the integrated circuit die 10. In other embodiments, the die connectors 66A and 66B remain buried and are exposed during a subsequent process for packaging the integrated circuit die 10. Exposing the die connectors 66A and 66B may remove any solder regions that may be present on the die connectors 66A and 66B.

In some embodiments, the integrated circuit die 10 is a stacked device that includes multiple semiconductor substrates. For example, the integrated circuit die 10 may be a memory device such as a hybrid memory cube (HMC) module, a high bandwidth memory (HBM) module, or the like that includes multiple memory dies. In such embodiments, the integrated circuit die 10 includes multiple semiconductor substrates interconnected by through-substrate vias (TSVs). Each of the semiconductor substrates may (or may not) have an interconnect structure.

Figure 2:
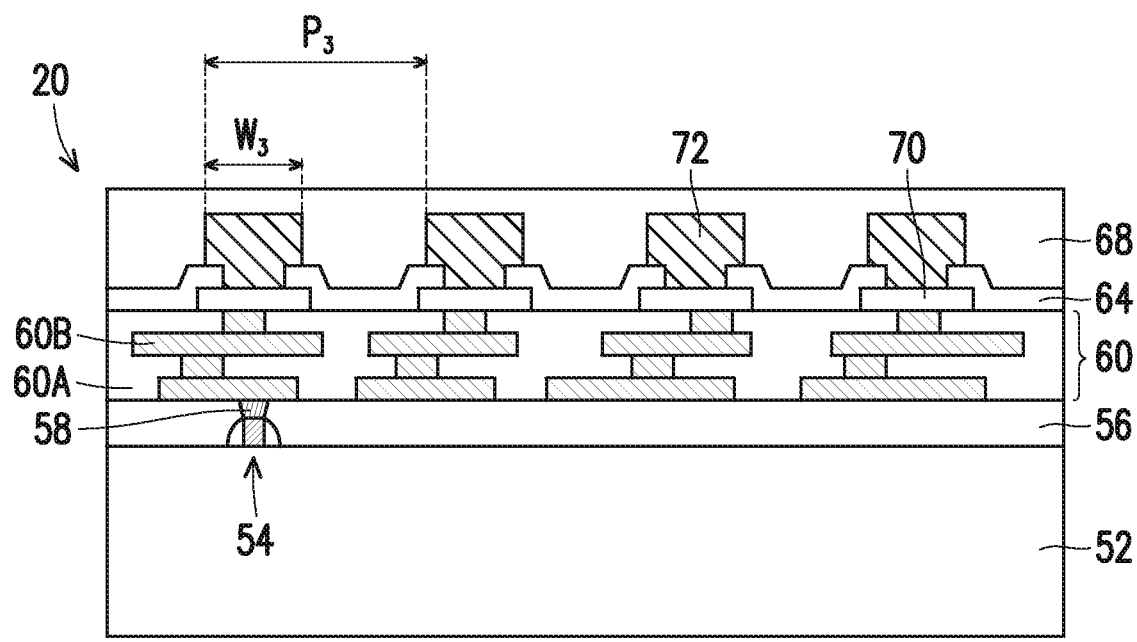
FIG. 2 illustrates a cross-sectional view of an integrated circuit die in accordance with some embodiments.

FIG. 2 illustrates a cross-sectional view of an integrated circuit die 20 in accordance with some embodiments. The integrated circuit die 20 will be packaged in subsequent processing to form an integrated circuit package. The integrated circuit die 20 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the integrated circuit die 20 is similar to the integrated circuit die 10 (see FIG. 1), with similar features being labeled with similar numerical references, and descriptions of the similar features are not repeated herein. In some embodiments, the integrated circuit die 20 may be formed using the process steps described above with reference to FIG. 1 and the description is not repeated herein.

The integrated circuit die 20 includes pads 70, such as aluminum pads, to which external connections are made. The pads 70 are on the active side of the integrated circuit die 20, such as in and/or on the interconnect structure 60. In some embodiments, the pads 70 have a uniform width and a uniform pitch. In some embodiments, the width and the pitch of the pads 70 are less than the width and the pitch of the pads 62A (see FIG. 1).

Die connectors 72, such as conductive pillars (for example, formed of a metal such as copper), extend through the openings in the passivation films 64 and are physically and electrically coupled to respective ones of the pads 70. In some embodiments, the pads 70 may be formed using similar materials and method as the pads 62A and 62B described above with reference to FIG. 1 and the description is not repeated herein. In some embodiments, the die connectors 72 have a uniform width $W_3$ and a uniform pitch $P_3$. In some embodiments, the width $W_3$ and the pitch $P_3$ of the die connectors 72 are less than the width $W_1$ and the pitch $P_1$ of the die connectors 66A (see FIG. 1), respectively. Accordingly, the die connectors 72 may be also referred to as high-density die connectors. In some embodiments, the width $W_3$ and the pitch $P_3$ of the die connectors 72 equal to the width $W_2$ and the pitch $P_2$ of the die connectors 66B (see FIG. 1), respectively. In other embodiments, the width $W_3$ and the pitch $P_3$ of the die connectors 72 are different from the width $W_2$ and the pitch $P_2$ of the die connectors 66B (see FIG. 1), respectively. In some embodiments, the width $W_3$ is between about 40 μm and about 70 μm. In some embodiments, the pitch $P_3$ is between about 70 μm and about 110 μm.

FIGS. 3-12 illustrate top and cross-sectional views of intermediate steps during a process for forming a package component wo in accordance with some embodiments. A package region 100A of the package component wo is illustrated. In some embodiments, the package component wo comprises a plurality of package regions (such as the package region 100A), and one or more of the integrated circuit dies (such as the integrated circuit dies 10 and 20 illustrated in FIGS. 1 and 2, respectively) are packaged to form an integrated circuit package in each of the package regions. In some embodiments, the package component wo is a wafer-level packaged structure, such as an integrated fan-out (InFO) wafer-level packaged structure.

Figure 3:
FIGS. 3-12 illustrate top and cross-sectional views of intermediate steps during a process for forming a package component in accordance with some embodiments.

In FIG. 3, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

In some embodiments, an insulating layer 106 is formed over the release layer 104. In some embodiments, the insulating layer 106 may be formed using similar materials and methods as the passivation layers 64 described above with reference to FIG. 1 and the description is not repeated herein. In other embodiments, the insulating layer 106 may be formed using similar materials and methods as the insulating layer 68 described above with reference to FIG. 1 and the description is not repeated herein. In some embodiments, the insulating layer 106 may be omitted.

Figure 4:
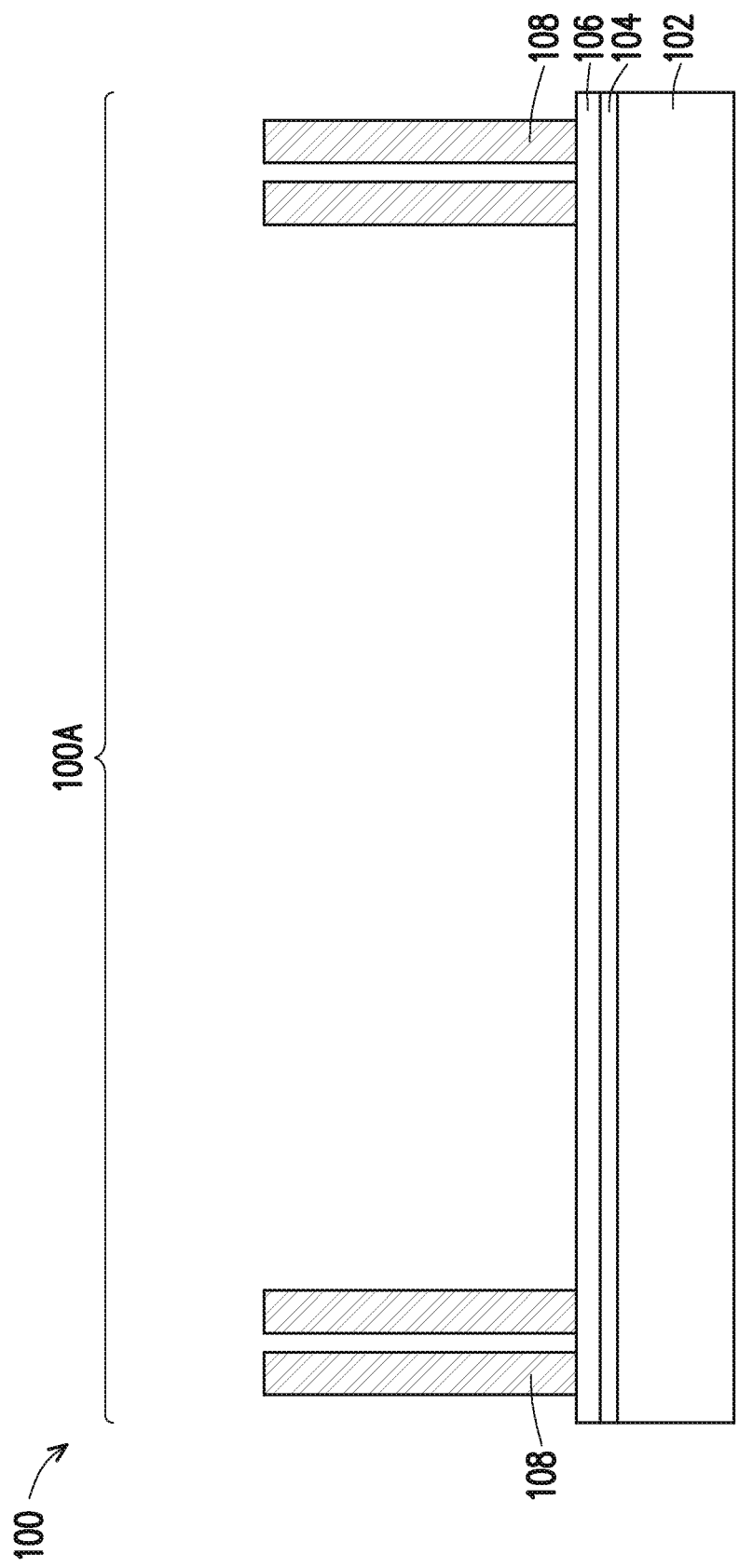

In FIG. 4, through vias 108 are formed over and extending away from the insulating layer 106. As an example to form the through vias 108, a seed layer (not shown) is formed over the insulating layer 106. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist (not shown) is formed and patterned on the seed layer. The photoresist may be formed by spin coating or the like and may be exposed to light for patterning. The pattern of the photoresist corresponds to through vias 108. The patterning forms openings through the photoresist to expose the seed layer. A conductive material is formed in the openings of the photoresist and on the exposed portions of the seed layer. The conductive material may be formed by plating, such as electroplating, electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 108. In some embodiments when the insulating layer 106 is omitted, the through vias 108 are formed over the release layer 104.

Figure 5:
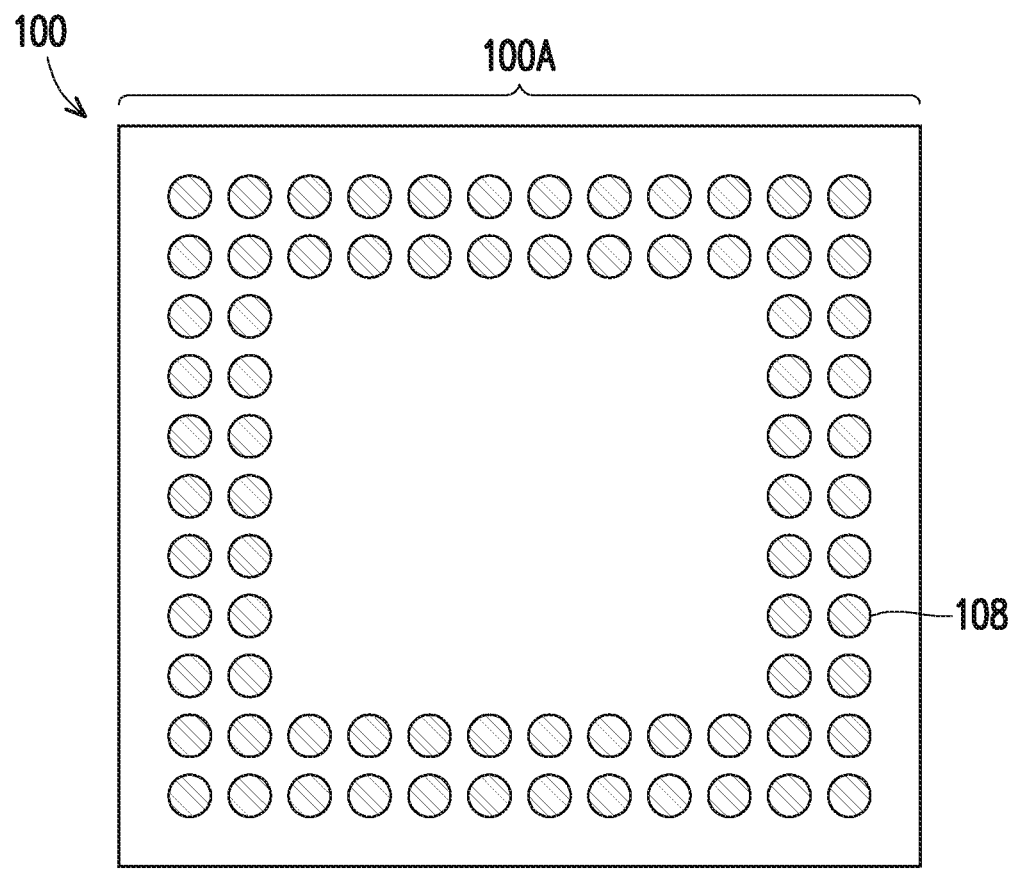

In FIG. 5, a top view of the package region 100A of the package component 100 is illustrated. In some embodiments, the through vias 108 are formed in an peripheral region of each package region (such as the package region 100A) of the package component 100, such that the through vias 108 surround an interior region of each package region of the package component 100. In the illustrated embodiment, two concentric rows of vias 108 are formed in the package region 100A. In other embodiments, more than two rows of vias 108 may be formed in each package region of the package component 100 based on functional requirements for the package component 100.

Figure 6:
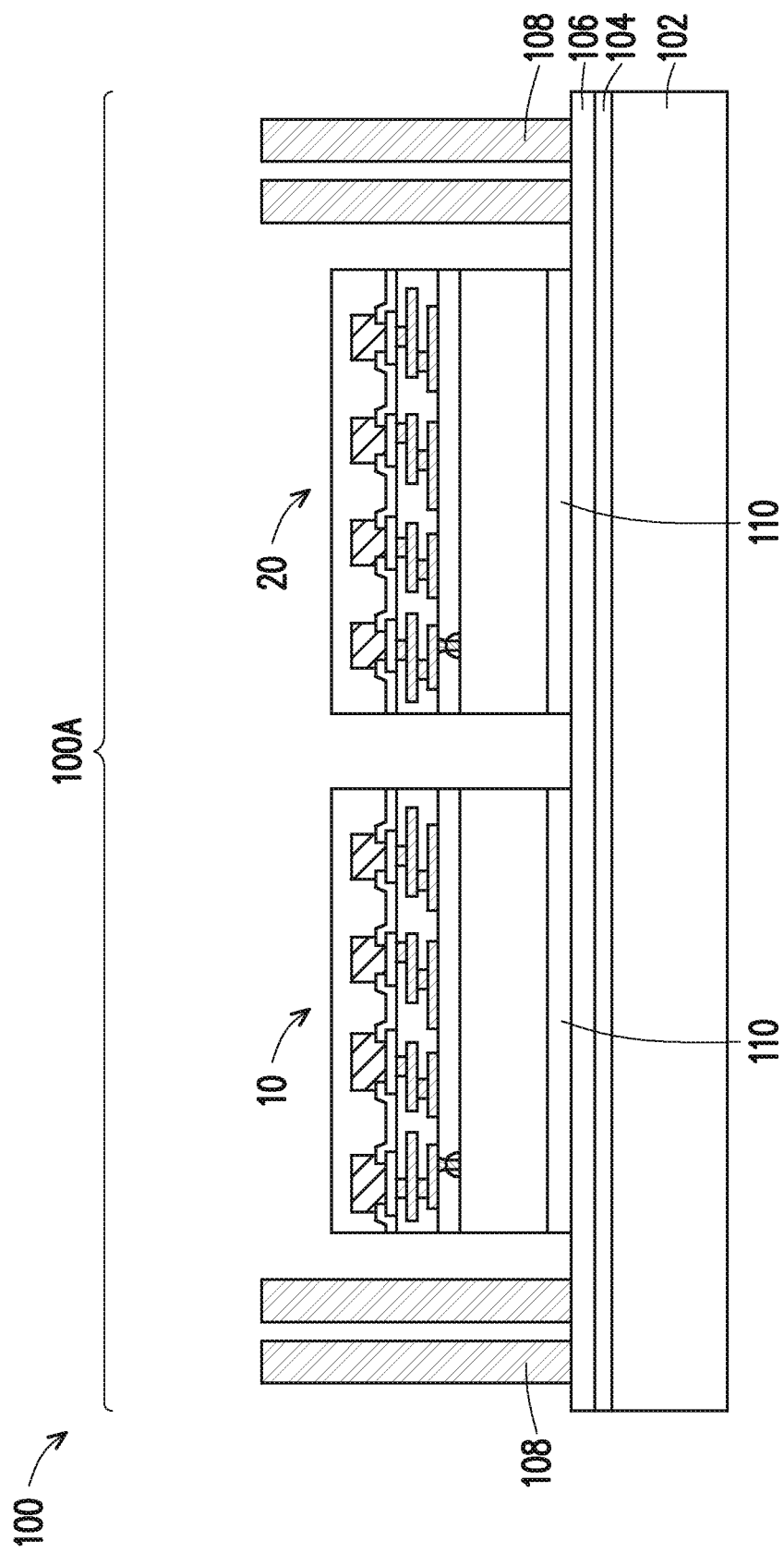

In FIG. 6, the integrated circuit dies 10 and 20 are adhered to the insulating layer 106 by adhesive layers 110. In other embodiments when the insulating layer 106 is omitted, the integrated circuit dies 10 and 20 are adhered to the release layer 104. A desired type and quantity of integrated circuit dies are adhered in each of the package regions (such as the package region 100A) of the package component 100. In the illustrated embodiment, one of the integrated circuit dies 10 and one of the integrated circuit dies 20 are adhered adjacent one another in each of the package regions of the package component 100. The integrated circuit die 10 may be a logic device, such as a central processing unit (CPU), a graphics processing unit (GPU), a system-on-a-chip (SoC), a microcontroller, or the like. The integrated circuit die 20 may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 10 and 20 may be the same type of dies, such as SoC dies. The integrated circuit die 10 and the integrated circuit die 20 may be formed in processes of a same technology node, or may be formed in processes of different technology nodes. The integrated circuit dies 10 and 20 may have different sizes (e.g., different heights and/or surface areas), or may have the same size (e.g., same heights and/or surface areas).

The adhesive layers 110 are formed on backsides of the integrated circuit dies 10 and 20, and adhere the integrated circuit dies 10 and 20 to the insulating layer 106. The adhesive layers 110 may comprise any suitable adhesive, epoxy, die attach film (DAF), or the like. The adhesive layers 110 may be applied to the backsides of the integrated circuit dies 10 and 20, may be applied over the surface of the carrier substrate 102 if no insulating layer 106 is utilized, or may be applied to an upper surface of the insulating layer 106. For example, the adhesive layers 110 may be applied to the backsides of the integrated circuit dies 10 and 20 before singulating respective wafers into separate integrated circuit dies 10 and 20.

Figure 7:
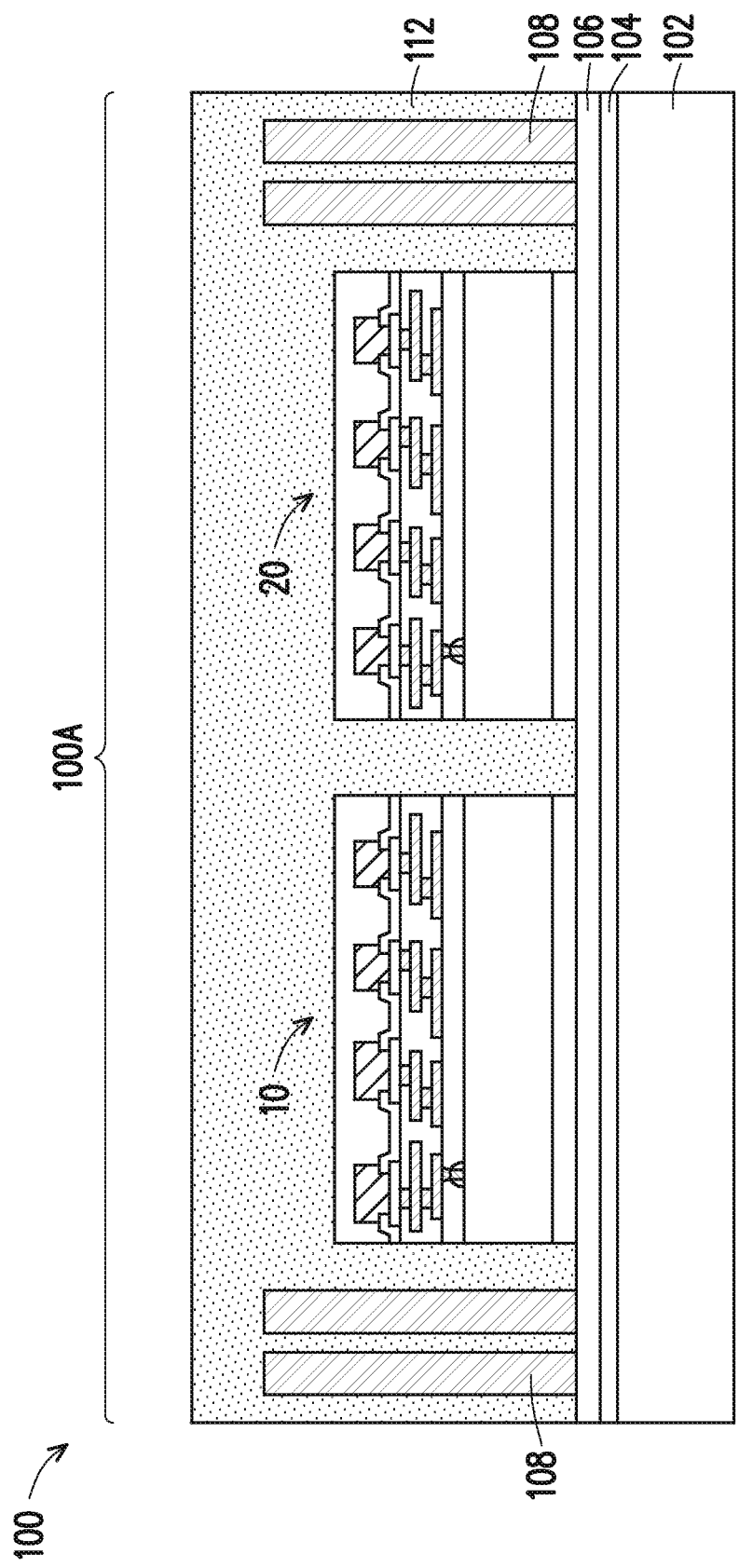

In FIG. 7, an encapsulant 112 is formed on and around the various components. After formation, the encapsulant 112 encapsulates the through vias 108 and the integrated circuit dies 10 and 20. The encapsulant 112 may be a molding compound, epoxy, or the like. The encapsulant 112 may be applied by compression molding, transfer molding, or the like, and may be formed over the carrier substrate 102 such that the through vias 108 and/or the integrated circuit dies 10 and 20 are buried or covered. The encapsulant 112 is further formed in gap regions between the integrated circuit die 10 and the integrated circuit die 20. The encapsulant 112 may be applied in liquid or semi-liquid form and then subsequently cured.

Figure 8:
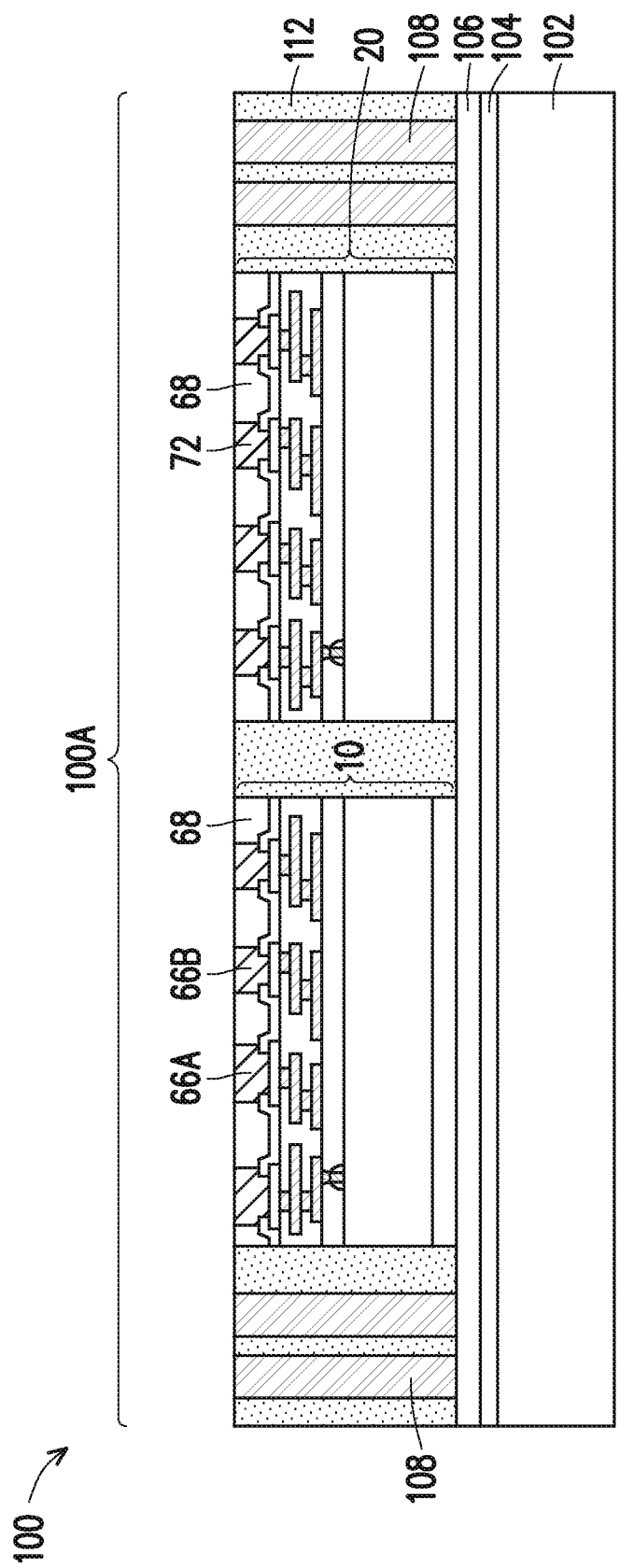

In FIG. 8, a planarization process is performed on the encapsulant 112 to expose the through vias 108, the die connectors 66A and 66B of the integrated circuit die 10, and the die connectors 72 of the integrated circuit die 20. The planarization process may also remove material of the through vias 108, the insulating layers 68, and/or die connectors 66A, 66B and 72 until the die connectors 66A, 66B and 72, and the through vias 108 are exposed. Top surfaces of the through vias 108, the die connectors 66A, 66B and 72, the insulating layers 68, and the encapsulant 112 are substantially coplanar or level after the planarization process within process variations. The planarization process may be, for example, a chemical-mechanical polish (CMP), a grinding process, or the like. In some embodiments, the planarization may be omitted, for example, if the through vias 108 and/or die connectors 66A, 66B and 72 are already exposed.

Figure 9:
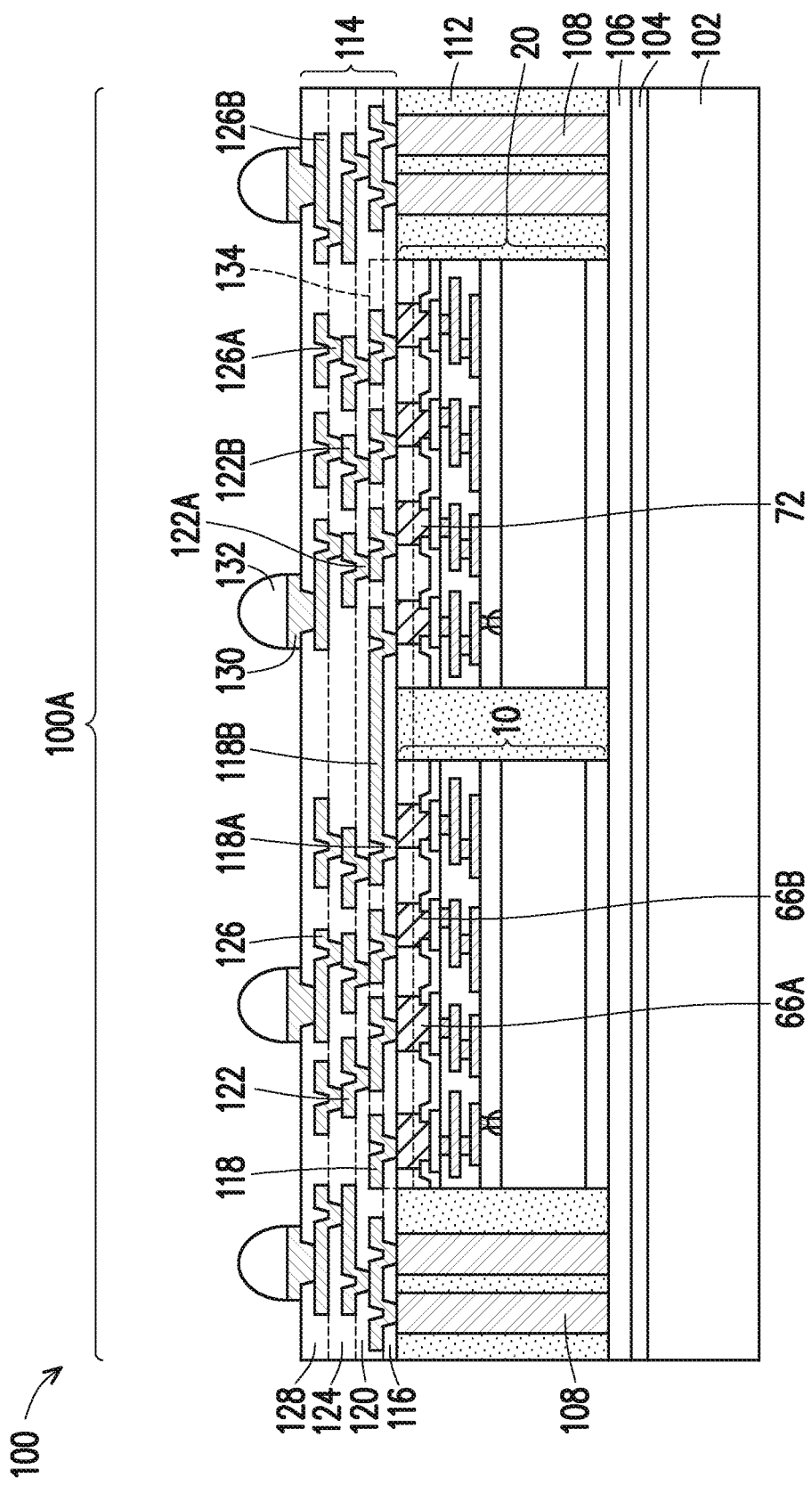

In FIG. 9, a redistribution structure 114 is formed over the encapsulant 112, the through vias 108, and the integrated circuit dies 10 and 20. The redistribution structure 114 may be also referred to as a front-side redistribution structure. The redistribution structure 114 includes insulating layers 116, 120, 124, and 128; and metallization patterns 118, 122, and 126. The metallization patterns may also be referred to as redistribution layers or redistribution lines. The redistribution structure 114 is shown as an example having three layers of metallization patterns. More or fewer insulating layers and metallization patterns may be formed in the redistribution structure 114. If fewer insulating layers and metallization patterns are to be formed, steps and processes discussed below may be omitted. If more insulating layers and metallization patterns are to be formed, steps and processes discussed below may be repeated.

In some embodiments, the formation of the redistribution structure 114 starts with depositing the insulating layer 116 over the encapsulant 112, the through vias 108, and the die connectors 66A, 66B and 72. In some embodiments, the insulating layer 116 is formed of a photo-sensitive material such as PBO, polyimide, BCB, the like, or a combination thereof, which may be patterned using a lithography mask. The insulating layer 116 may be formed by spin coating, lamination, CVD, the like, or a combination thereof. The insulating layer 116 is then patterned. The patterning forms openings exposing portions of the through vias 108 and the die connectors 66A, 66B and 72. The patterning may be by an acceptable process, such as by exposing and developing the insulating layer 116 to light when the insulating layer 116 is a photo-sensitive material or by etching using, for example, an anisotropic etch.

After forming the insulating layer 116, the metallization pattern 118 is formed. The metallization pattern 118 includes portions (such as conductive lines or traces 118B) on and extending along the major surface of the insulating layer 116. The metallization pattern 118 further includes portions (such as conductive vias 118A) extending through the insulating layer 116 to physically and electrically couple to the through vias 108 and the connectors 66A, 66B and 72 of the integrated circuit dies 10 and 20.

As an example to form the metallization pattern 118, a seed layer is formed over the insulating layer 116 and in the openings extending through the insulating layer 116. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 118. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. In some embodiments, the conductive material is formed in a conformal manner such that the conductive material partially fills the openings through the photoresist. The combination of the conductive material and underlying portions of the seed layer form the metallization pattern 118. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After forming the metallization pattern 118, the insulating layer 120 is deposited on the metallization pattern 118 and the insulating layer 116. The insulating layer 120 may be formed using similar materials and methods as the insulating layer 116 and the description is not repeated herein.

After forming the insulating layer 120, the metallization pattern 122 is formed. The metallization pattern 122 includes portions (such as conductive lines or traces 122B) on and extending along the major surface of the insulating layer 120. The metallization pattern 122 further includes portions (such as conductive vias 122A) extending through the insulating layer 120 to physically and electrically couple to the metallization pattern 118. The metallization pattern 122 may be formed using similar materials and methods as the metallization pattern 118 and the description is not repeated herein.

After forming the metallization pattern 122, the insulating layer 124 is deposited on the metallization pattern 122 and the insulating layer 120. The insulating layer 124 may be formed using similar materials and methods as the insulating layer 116 and the description is not repeated herein.

After forming the insulating layer 124, the metallization pattern 126 is formed. The metallization pattern 126 includes portions (such as conductive lines or traces 126B) on and extending along the major surface of the insulating layer 124. The metallization pattern 126 further includes portions (such as conductive vias 126A) extending through the insulating layer 124 to physically and electrically couple the metallization pattern 122. The metallization pattern 126 may be formed using similar materials and methods as the metallization pattern 118 and the description is not repeated herein.

After forming the metallization pattern 126, the insulating layer 128 is deposited on the metallization pattern 126 and the insulating layer 124. The insulating layer 128 may be formed using similar materials and methods as the insulating layer 116 and the description is not repeated herein.

In some embodiments, the insulating layer 128 is the topmost insulating layer of the redistribution structure 114. As such, all of the metallization patterns of the redistribution structure 114 (e.g., the metallization patterns 118, 122, and 126) are disposed between the insulating layer 128 and the integrated circuit dies 10 and 20. Further, all of the intermediate insulating layers of the redistribution structure 114 (e.g., the insulating layers 116, 120, and 124) are disposed between the insulating layer 128 and the integrated circuit dies 10 and 20.

In some embodiments, the redistribution structure 114 is formed such that vias of adjacent metallization patterns that are formed over the high-density die connectors 66B and 72 are laterally shifted with respect to one another, such that the vias form a staggering or a zigzag pattern. In the illustrated embodiment, the vias 122A are laterally shifted with respect to corresponding ones of the vias 118A in a first direction (such as a direction extending from the integrated circuit die 20 to the integrated circuit die 10) and the vias 126A are laterally shifted with respect to corresponding ones of the vias 122A in a second direction (such as a direction extending from the integrated circuit die 10 to the integrated circuit die 20) opposite to the first direction.

Further in FIG. 9, after forming redistribution structure 114, under-bump metallizations (UBMs) 130 are formed for external connection to the redistribution structure 114. The UBMs 130 have bump portions on and extending along the major surface of the insulating layer 128, and have via portions extending through the insulating layer 128 to physically and electrically couple to the metallization pattern 126. As a result, the UBMs 130 are electrically coupled to the integrated circuit dies 10 and 20 through the redistribution structure 114. The UBMs 130 may be formed of the same material as the metallization pattern 126.

After forming the UBMs 130, conductive connectors 132 are formed on the UBMs 130. The conductive connectors 132 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 132 may include a conductive material such as solder, copper, aluminum, gold, nickel, silver, palladium, tin, the like, or a combination thereof. In some embodiments, the conductive connectors 132 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 132 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 10:
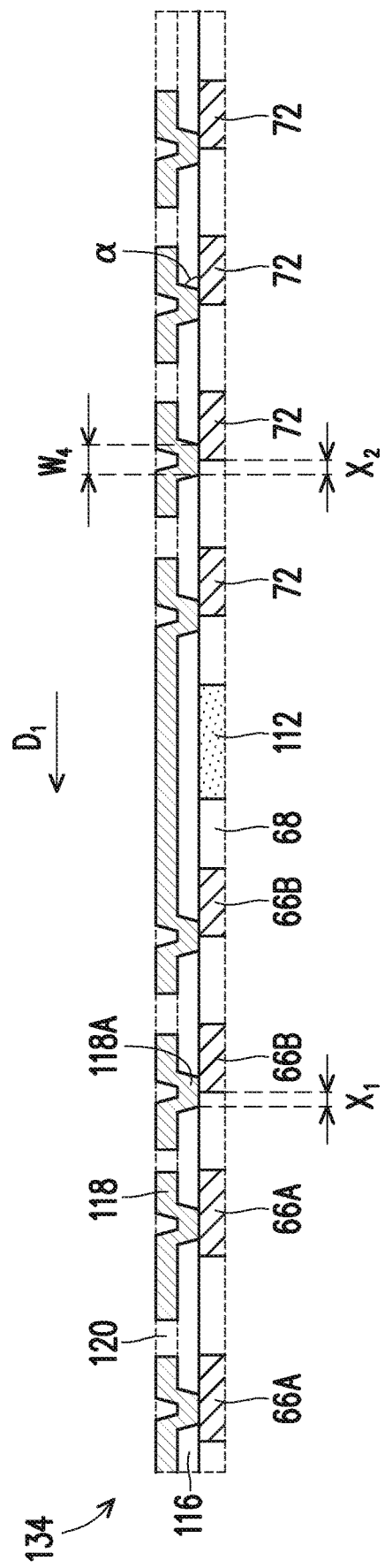
Figure 11:
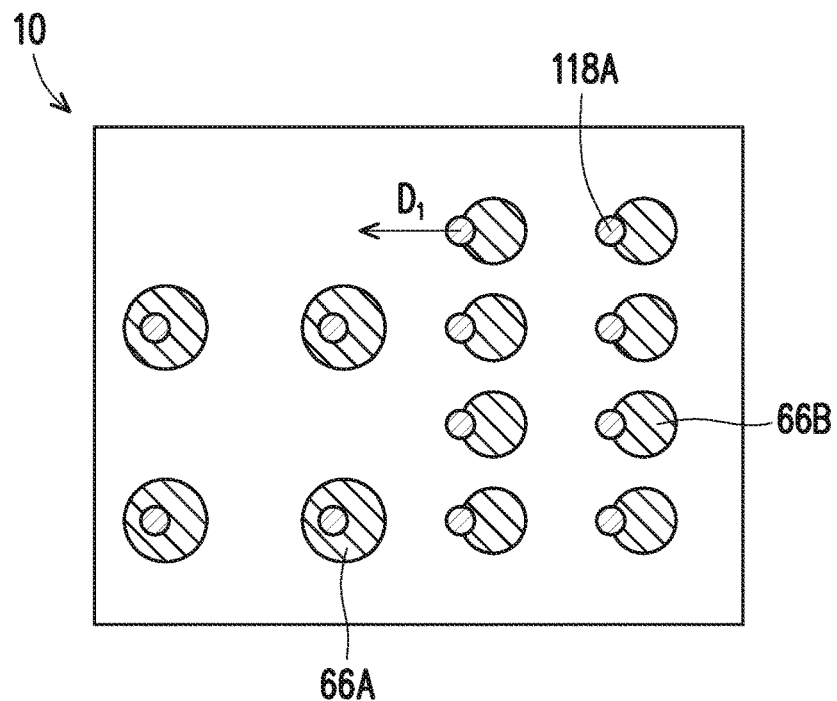
Figure 12:
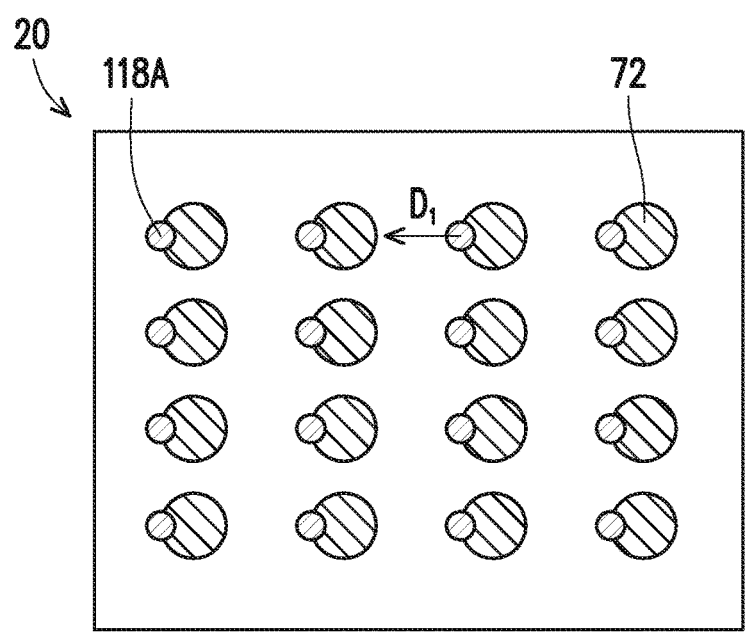

FIG. 10 illustrates a region 134 of the package component 100 of FIG. 9 showing an interface between the redistribution structure 114 and the integrated circuit dies 10 and 20. FIG. 11 illustrates a planar view of the integrated circuit die 10 showing the die connectors 66A and 66B with corresponding vias 118A of the redistribution structure 114. FIG. 12 illustrates a planar view of the integrated circuit die 20 showing the die connectors 72 with corresponding vias 118A of the redistribution structure 114. Referring to FIGS. 10-12, in some embodiments, the vias 118A of the metallization pattern 118 fully land on corresponding low-density die connectors 66A and partially land on corresponding high-density die connectors 66B and 72. In some embodiments, the partial landing of the vias 118A is caused by shifts of the integrated circuit dies 10 and 20 during attaching the integrated circuit dies 10 and 20 to the insulating layer 106 (or to the release layer 104 when the insulating layer 106 is omitted) (see FIG. 6). In some embodiments, the partial landing of the vias 118A is further caused due misalignment of the openings in the insulating layer 116 during patterning the insulating layer 116. In some embodiments, the vias 118A are laterally shifted with respect to corresponding die connectors 66B and 72 in a first direction $D_1$. In the illustrated embodiment, the first direction $D_1$ is parallel to the top surfaces of the integrated circuit dies 10 and 20, and extends from the integrated circuit die 20 to the integrated circuit die 10.

In some embodiments, the vias 118A have sloped sidewalls. The sidewalls of the vias 118A form an angle α with top surfaces of respective ones of the die connectors 66B and 72. In some embodiments, the angle α is between about 70 degrees and about 89 degrees. The vias 118A have a bottom width $W_4$ at top surfaces of respective ones the die connectors 66B and 72. In some embodiments, the width $W_4$ is between about 3 μm and about 15 μm. Portions of the vias 118A extend beyond an edge of corresponding ones of the die connectors 66B, such that sidewalls of the vias 118A are laterally spaced apart from sidewalls of the corresponding ones of the die connectors 66B by a distance $X_1$. In some embodiments, the distance $X_1$ is greater than zero and less than or equal to ⅔ of the width $W_4$. Portions of the vias 118A extend beyond an edge of corresponding ones of the die connectors 72, such that sidewalls of the vias 118A are laterally spaced apart from sidewalls of the corresponding ones of the die connectors 72 by a distance $X_2$. In some embodiments, the distance $X_2$ is greater than zero and less than or equal to ⅔ of the width $W_4$. In some embodiments, the distance $X_1$ and the distance $X_2$ are substantially equal. In other embodiments, the distance $X_1$ is different from the distance $X_2$.

Figure 13:
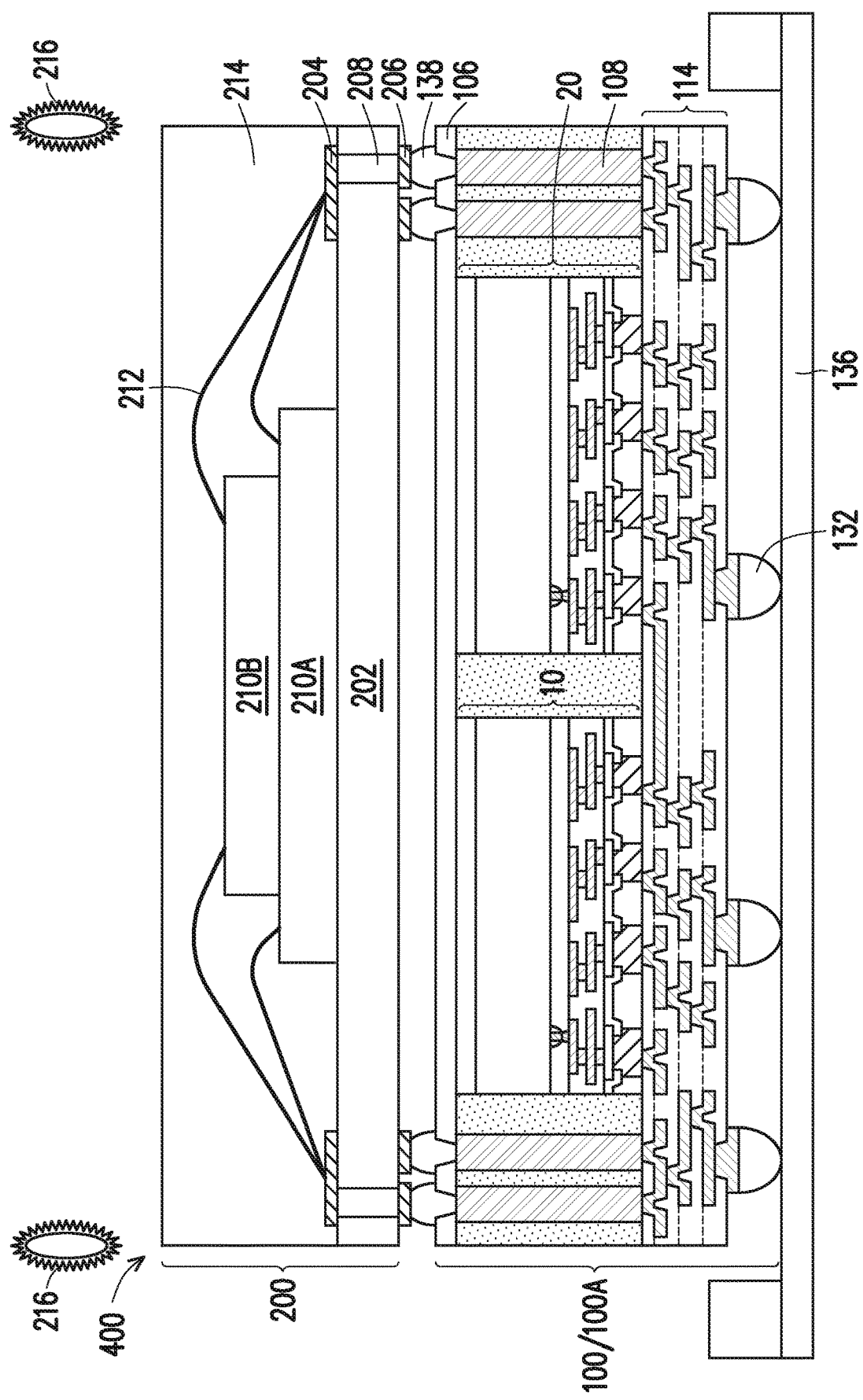
FIGS. 13 and 14 illustrate cross-sectional views of formation and implementation of device stacks in accordance with some embodiments.
Figure 14:
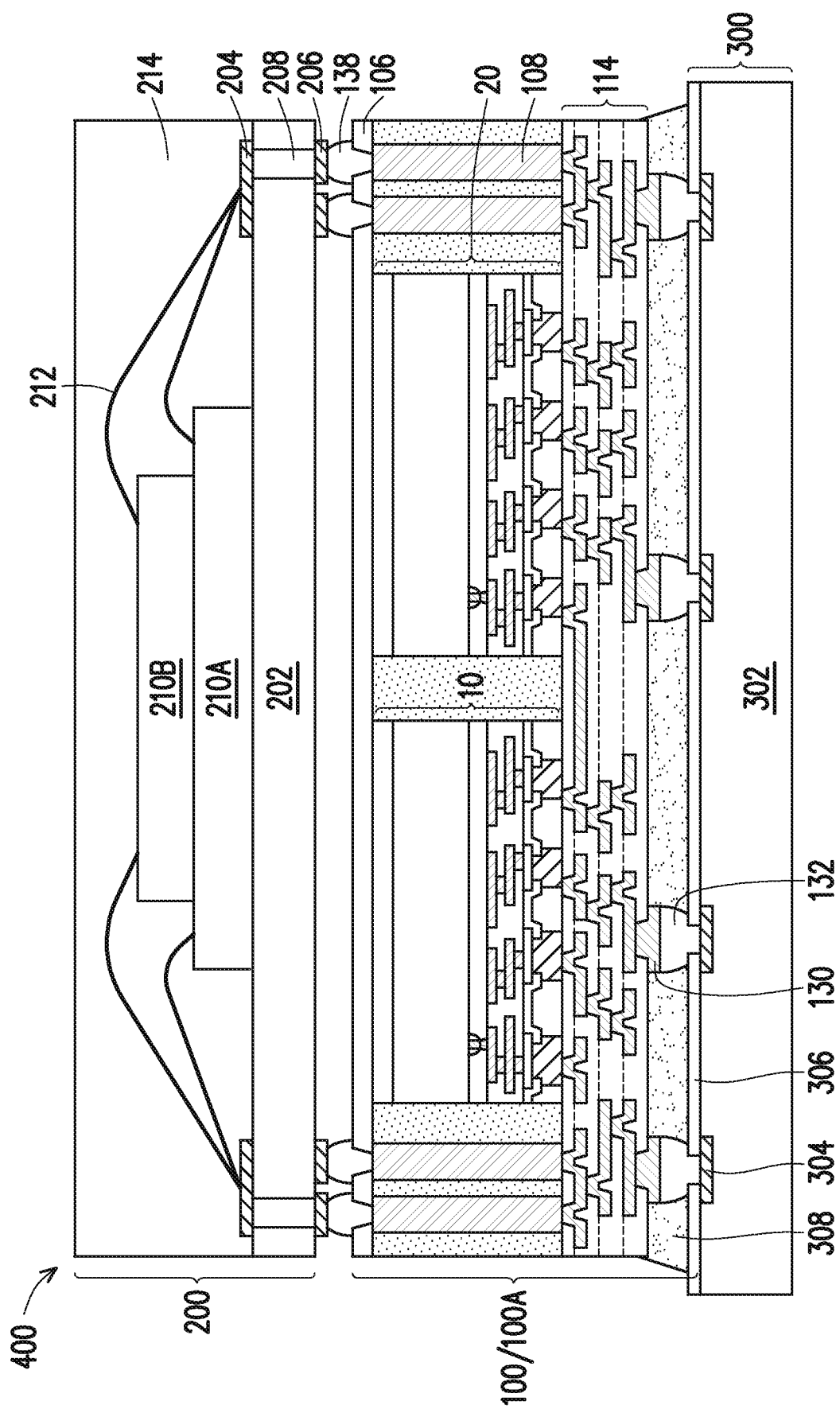

FIGS. 13 and 14 illustrate formation and implementation of a device stack 400 in accordance with some embodiments. The device stacks are formed from the integrated circuit packages formed in the package component 100. The device stack 400 may also be referred to as a package-on-package (PoP) structure.

In FIG. 13, a carrier substrate de-bonding is performed to detach (or "de-bond") the carrier substrate 102 (see FIG. 9) from the package component 100. In some embodiments, the de-bonding includes projecting a light such as a laser light or an UV light on the release layer 104 (see FIG. 9) so that the release layer 104 decomposes under the heat of the light and the carrier substrate 102 can be removed. After de-bonding the carrier substrate 102, the package component 100 is flipped and is placed on a dicing tape 136.

After placing the package component 100 on a dicing tape 136, conductive connectors 138 are formed extending through the insulating layer 106 to contact the through vias 108. Openings are formed through the insulating layer 106 to expose portions of the through vias 108. The openings may be formed, for example, using laser drilling, etching, or the like. The conductive connectors 138 are formed in the openings. In some embodiments, the conductive connectors 138 comprise flux and are formed in a flux dipping process. In some embodiments, the conductive connectors 138 comprise a conductive paste such as solder paste, silver paste, or the like, and are dispensed in a printing process. In some embodiments, the conductive connectors 138 may be formed using similar materials and methods as the conductive connectors 132 described above with reference to FIG. 9 and the description is not repeated herein. In other embodiments when the insulating layer 106 is omitted, the process steps described above for patterning the insulating layer 106 are also omitted.

Further in FIG. 13, package components 200 are coupled to the package component 100, such that one of the package components 200 is coupled in each of the package regions (such as the package region 100A) of the package component 100. The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side and coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not shown). A wide variety of devices such as transistors, capacitors, resistors, combinations of these, and the like may be used to generate the structural and functional requirements of the design for the package components 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 138. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by an encapsulant 214. In some embodiments, the encapsulant 214 is a molding compound, a polymer, an epoxy, silicon oxide filler material, the like, or a combination thereof. The encapsulant 214 may be molded on the stacked dies 210 and the wire bonds 212, for example, using compression molding. A curing process may be performed to cure the encapsulant 214. The curing process may be a thermal curing, a UV curing, the like, or a combination thereof. In some embodiments, the stacked dies 210 and the wire bonds 212 are buried in the encapsulant 214, and after the curing of the encapsulant 214, a planarization step, such as a grinding, CMP, or the like, is performed to remove excess portions of the encapsulant 214 and provide a substantially planar surface for the package components 200.

After the package components 200 are formed, the package components 200 are mechanically and electrically bonded to the package component 100 by way of the conductive connectors 138 and the bond pads 206. In some embodiments, the stacked dies 210 may be coupled to the integrated circuit dies 10 and 20 through the wire bonds 212, the bond pads 204 and 206, the conductive vias 208, the conductive connectors 138, the through vias 108, and the redistribution structure 114.

In some embodiments, a solder resist (not shown) is formed on the side of the substrate 202 opposing the stacked dies 210. The conductive connectors 138 may be disposed in openings in the solder resist to be electrically and mechanically coupled to conductive features (e.g., the bond pads 206) in the substrate 202. The solder resist may be used to protect areas of the substrate 202 from external damage. In some embodiments, the conductive connectors 138 have an epoxy flux (not shown) formed thereon before they are reflowed with at least some of the epoxy portion of the epoxy flux remaining after the package components 200 are attached to the package component 100.

In some embodiments, an underfill (not shown) is formed between the package component 100 and the package components 200, surrounding the conductive connectors 138. The underfill may reduce stress and protect the joints resulting from the reflowing of the conductive connectors 138. The underfill may be formed by a capillary flow process after the package components 200 are attached, or may be formed by a suitable deposition method before the package components 200 are attached. In embodiments where the epoxy flux is formed, it may act as the underfill.

Subsequently, a singulation process 216 is performed by sawing along scribe line regions, e.g., between adjacent package regions of the package component 100. The sawing singulates the package regions (such as the package region 100A) of the package component 100 from each other. In some embodiments, the singulation process 216 comprises sawing, etching, the like, or a combination thereof. The singulation process 216 results in forming singulated device stacks (such as a device stack 400). Each of the singulated device stacks comprise one of the package components 200 bonded to a respective singulated package component 100. In the illustrated embodiment, the singulation process 216 is performed after the package components 200 are coupled to the package component 100. In other embodiments, the singulation process 216 is performed before the package components 200 are coupled to the package component 100, such as after the carrier substrate 102 (see FIG. 9) is de-bonded and the conductive connectors 138 are formed.

In FIG. 14, the device stack 400 may be mounted to a substrate 300 using the conductive connectors 132. The substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 132 are reflowed to attach the device stack 400 to the bond pads 304 of the substrate 300. The conductive connectors 132 electrically and/or physically couple the substrate 300, including metallization layers in the substrate core 302, to the device stack 400. In some embodiments, a solder resist 306 is formed on the substrate core 302. The conductive connectors 132 may be disposed in openings in the solder resist 306 to be electrically and mechanically coupled to the bond pads 304. The solder resist 306 may be used to protect areas of the substrate 300 from external damage.

The conductive connectors 132 may have an epoxy flux (not shown) formed thereon before they are reflowed with at least some of the epoxy portion of the epoxy flux remaining after the device stack 400 is attached to the substrate 300. This remaining epoxy portion may act as an underfill to reduce stress and protect the joints resulting from reflowing the conductive connectors 132. In some embodiments, an underfill 308 may be formed between the device stack 400 and the substrate 300 and surrounding the conductive connectors 132. The underfill 308 may be formed by a capillary flow process after the device stack 400 is attached or may be formed by a suitable deposition method before the device stack 400 is attached.

In some embodiments, passive devices (e.g., surface mount devices (SMDs), not shown) may also be attached to the package component 100 (e.g., to the UBMs 130) or to the substrate 300 (e.g., to the bond pads 304). For example, the passive devices may be bonded to a same surface of the package component 100 or the substrate 300 as the conductive connectors 132. The passive devices may be attached to the singulated package component 100 prior to mounting the device stack 400 on the substrate 300, or may be attached to the substrate 300 prior to or after mounting the device stack 400 on the substrate 300.

In the illustrated embodiments, the package component 100 is implemented in a PoP structure. In other embodiments, the package component 100 may be implemented in other device stacks. For example, the package component 100 may also be implemented in a Flip Chip Ball Grid Array (FCBGA) package. In such embodiments, the package component 100 is mounted to a substrate such as the substrate 300, but the package component 200 is omitted. Instead, a lid or heat spreader may be attached to the package component 100.

Figure 15:
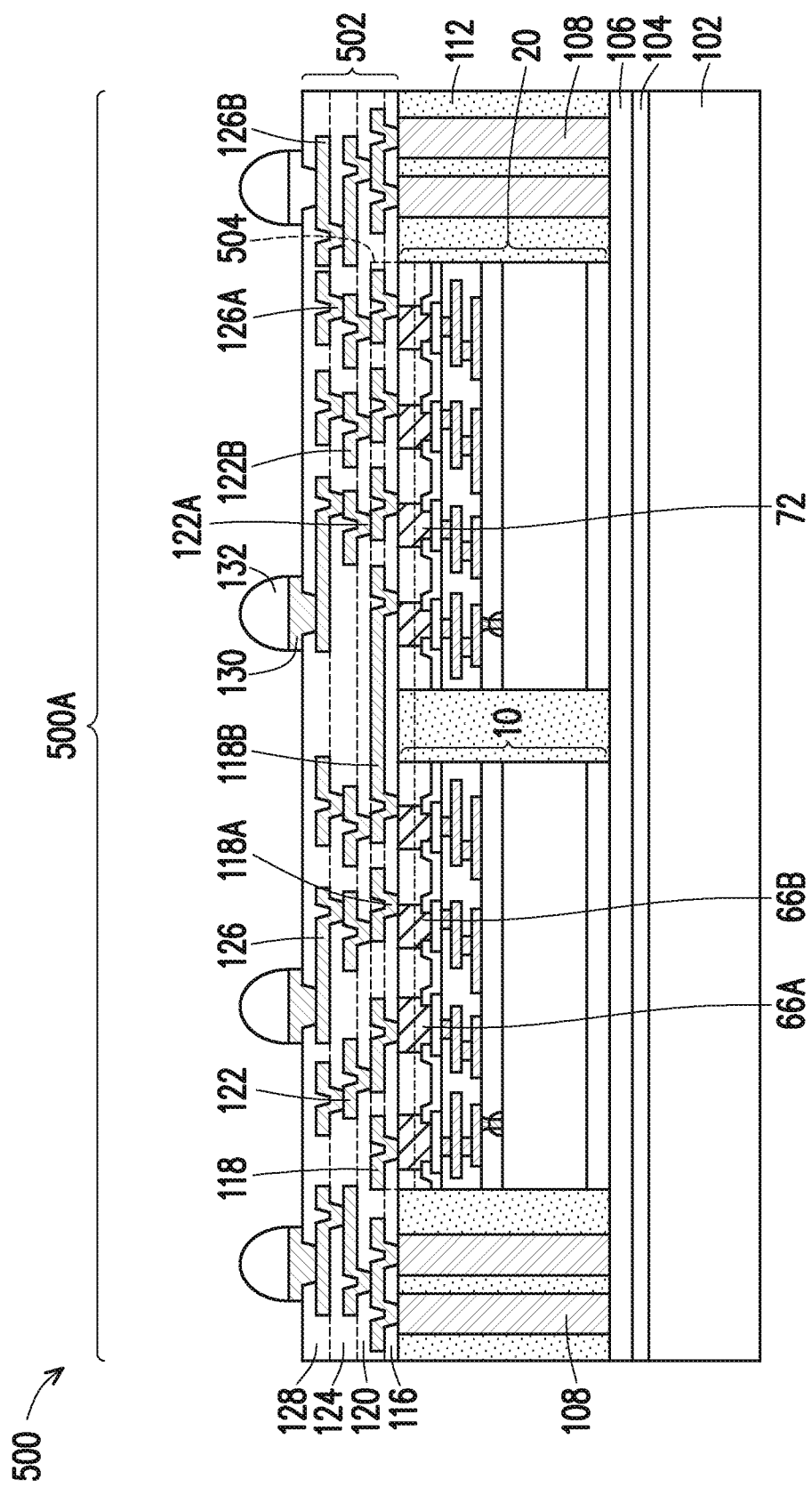
FIGS. 15-18 illustrate top and cross-sectional views of a package component in accordance with some embodiments.
Figure 16:
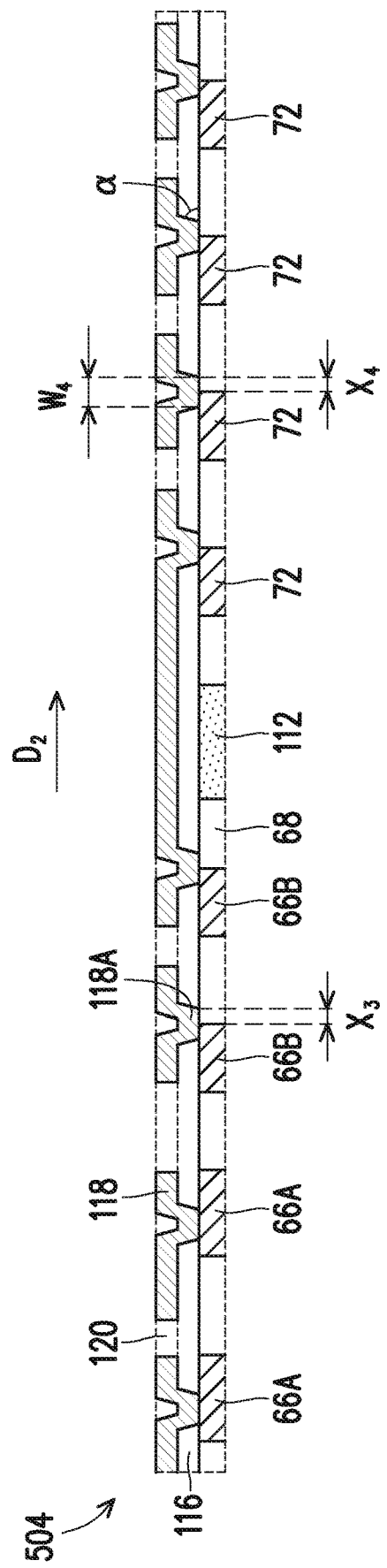
Figure 17:
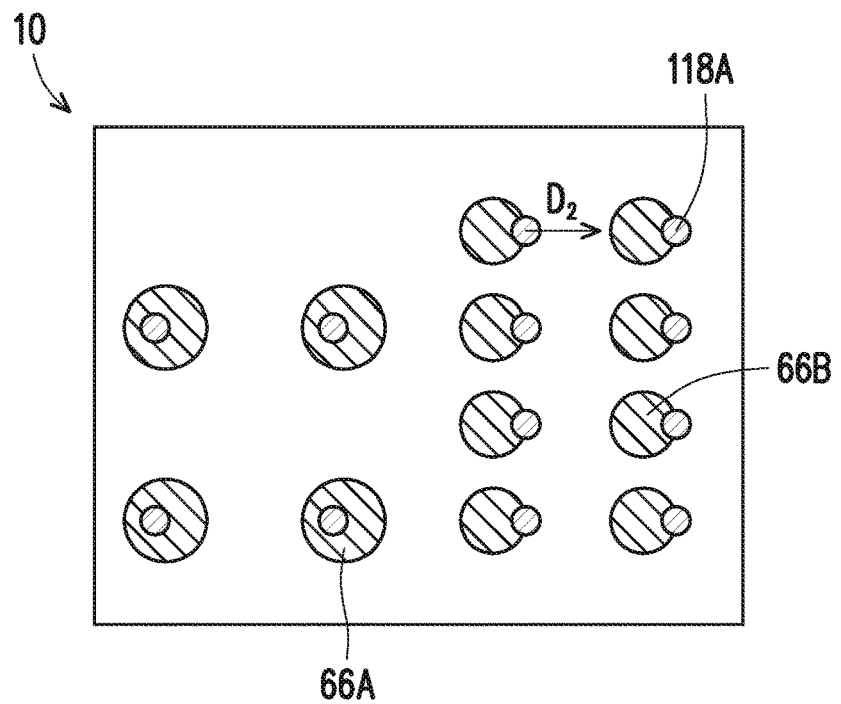
Figure 18:
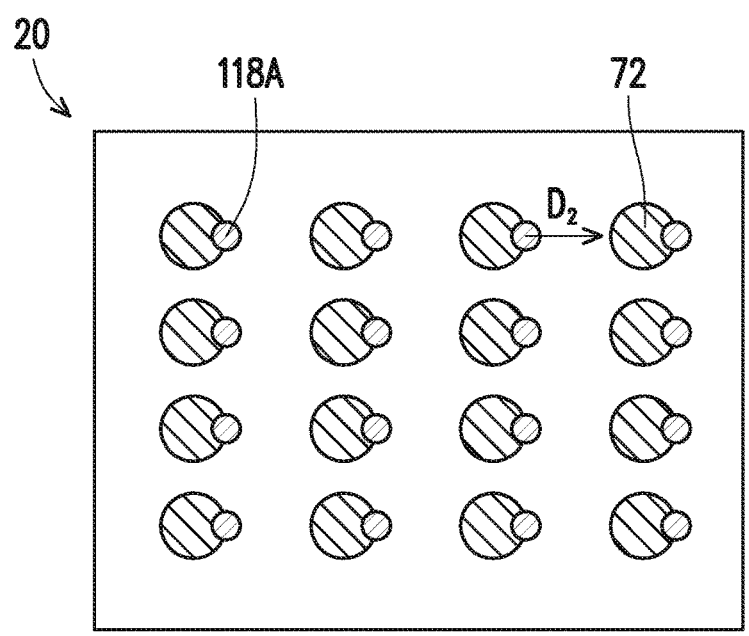

FIGS. 15-18 illustrate top and cross-sectional views of a package component 500 in accordance with some embodiments. FIG. 15 illustrates a cross-sectional view of the package component 500 in accordance with some embodiments. FIG. 16 illustrates a region 504 of the package component 100 showing an interface between a redistribution structure 502 and the integrated circuit dies 10 and 20. FIG. 17 illustrates a planar view of the integrated circuit die 10 of the package component 500 showing the die connectors 66A and 66B with corresponding vias 118A of the redistribution structure 502. FIG. 18 illustrates a planar view of the integrated circuit die 20 of the package component 500 showing the die connectors 72 with corresponding vias 118A of the redistribution structure 502.

In FIG. 15, a package region 500A of the package component 500 is illustrated. In some embodiments, the package component 500 comprises a plurality of package regions (such as the package region 500A). The package component 500 may also be referred to as a wafer-level packaged structure, such as an InFO wafer-level packaged structure. The package component 500 is similar to the package component 100 illustrated in FIG. 9, with similar features being labeled by similar numerical references, and descriptions of the similar features are not repeated herein. In some embodiments, the package component 500 may be formed using process steps similar to the process steps described above with reference to FIGS. 3-9, and the description is not repeated herein. In some embodiments, the redistribution structure 502 includes insulating layers 116, 120, 124, and 128 and metallization patterns 118, 122, and 126, and may be formed in a similar manner as the redistribution structure 114 described above with reference to FIG. 9, and the description is not repeated herein.

In FIGS. 15-18, the vias 118A of the redistribution structure 502 fully land on corresponding die connectors 66A and partially land on corresponding die connectors 66B and 72. In some embodiments, the partial landing of the vias 118A is caused by shifts of the integrated circuit dies 10 and 20 during attaching the integrated circuit dies 10 and 20 to the insulating layer 106. In some embodiments, the partial landing of the vias 118A is further caused due misalignment of the openings in the insulating layer 116 during patterning the insulating layer 116. In some embodiments, the vias 118A are laterally shifted with respect to corresponding die connectors 66B and 72 in a direction $D_2$. In the illustrated embodiment, the direction $D_2$ is parallel to the tops surfaces of the integrated circuit dies 10 and 20, and extends from the integrated circuit die 10 to the integrated circuit die 20.

In some embodiments, the vias 118A have sloped sidewalls. The sidewalls of the vias 118A form an angle α with top surfaces of respective ones of the die connectors 66B and 72. In some embodiments, the angle α is between about 70 degrees and about 89 degrees. The vias 118A have a width $W_4$ at top surfaces of respective ones the die connectors 66B and 72. In some embodiments, the width $W_4$ is between about 3 μm and about 15 μm. Portions of the vias 118A extend beyond an edge of corresponding ones of the die connectors 66B, such that sidewalls of the vias 118A are laterally spaced apart from sidewalls of the corresponding ones of the die connectors 66B by a distance $X_3$. In some embodiments, the distance $X_3$ is greater than zero and less than or equal to ⅔ of the width $W_4$. Portions of the vias 118A extend beyond an edge of corresponding ones of the die connectors 72, such that sidewalls of the vias 118A are laterally spaced apart from sidewalls of the corresponding ones of the die connectors 72 by a distance $X_4$. In some embodiments, the distance $X_4$ is greater than zero and less than or equal to ⅔ of the width $W_4$. In some embodiments, the distance $X_3$ and the distance $X_4$ are substantially equal. In other embodiments, the distance $X_3$ is different from the distance $X_4$.

Figure 19:
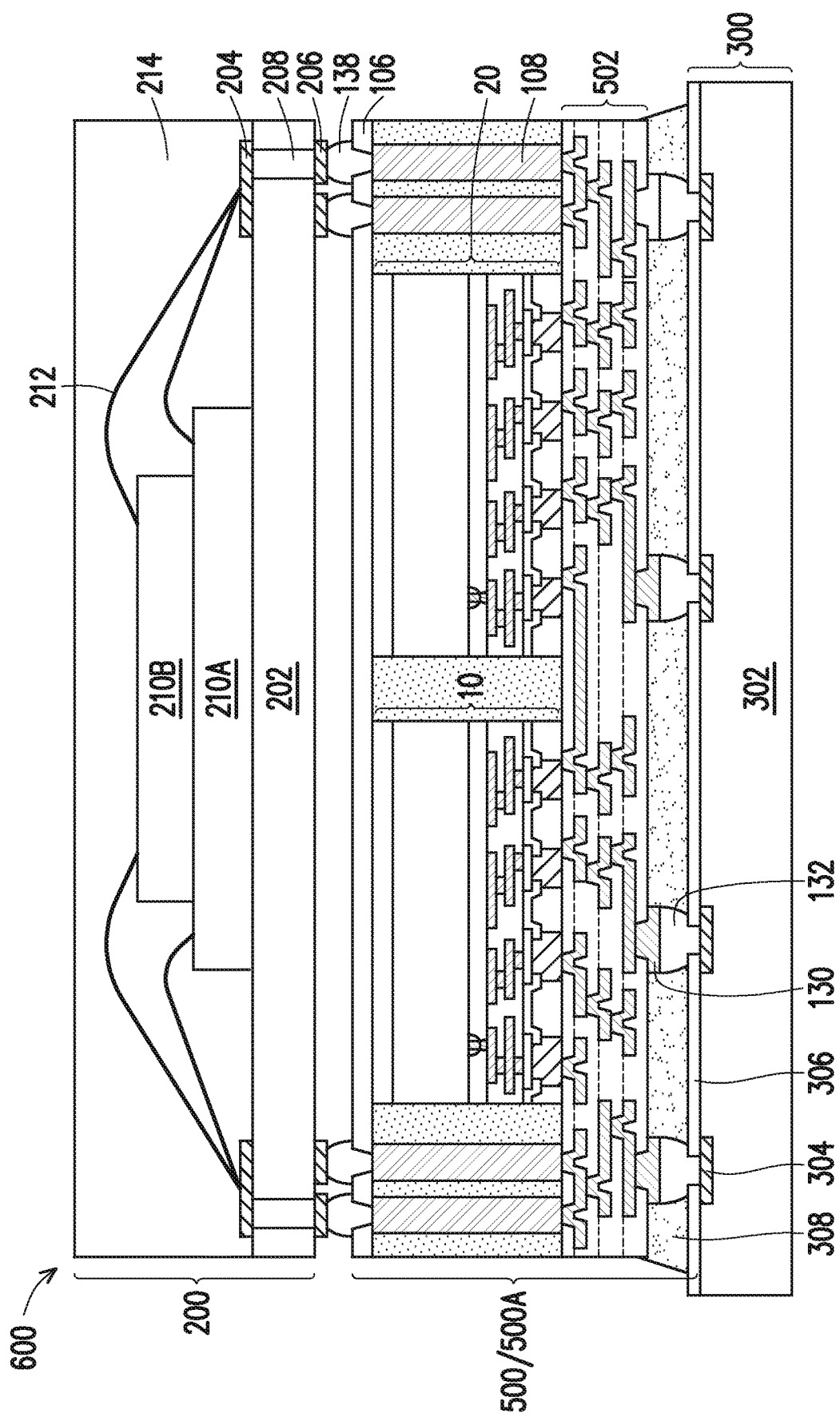
FIG. 19 illustrates a cross-sectional view of a device stack in accordance with some embodiments.

FIG. 19 illustrates a cross-sectional view of a device stack 600 bonded to a substrate 300 in accordance with some embodiments. The device stack 600 is similar to the device stack 400 illustrated in FIG. 14, with similar features being labeled by similar numerical references, and descriptions of the similar features are not repeated herein. In some embodiments, the device stack 600 may be formed by performing process steps described above with reference to FIGS. 13 and 14 on the package component 500 illustrated in FIG. 15. In some embodiments, the device stack 600 is bonded to the substrate 300 as described above with reference to FIG. 14.

Figure 20:
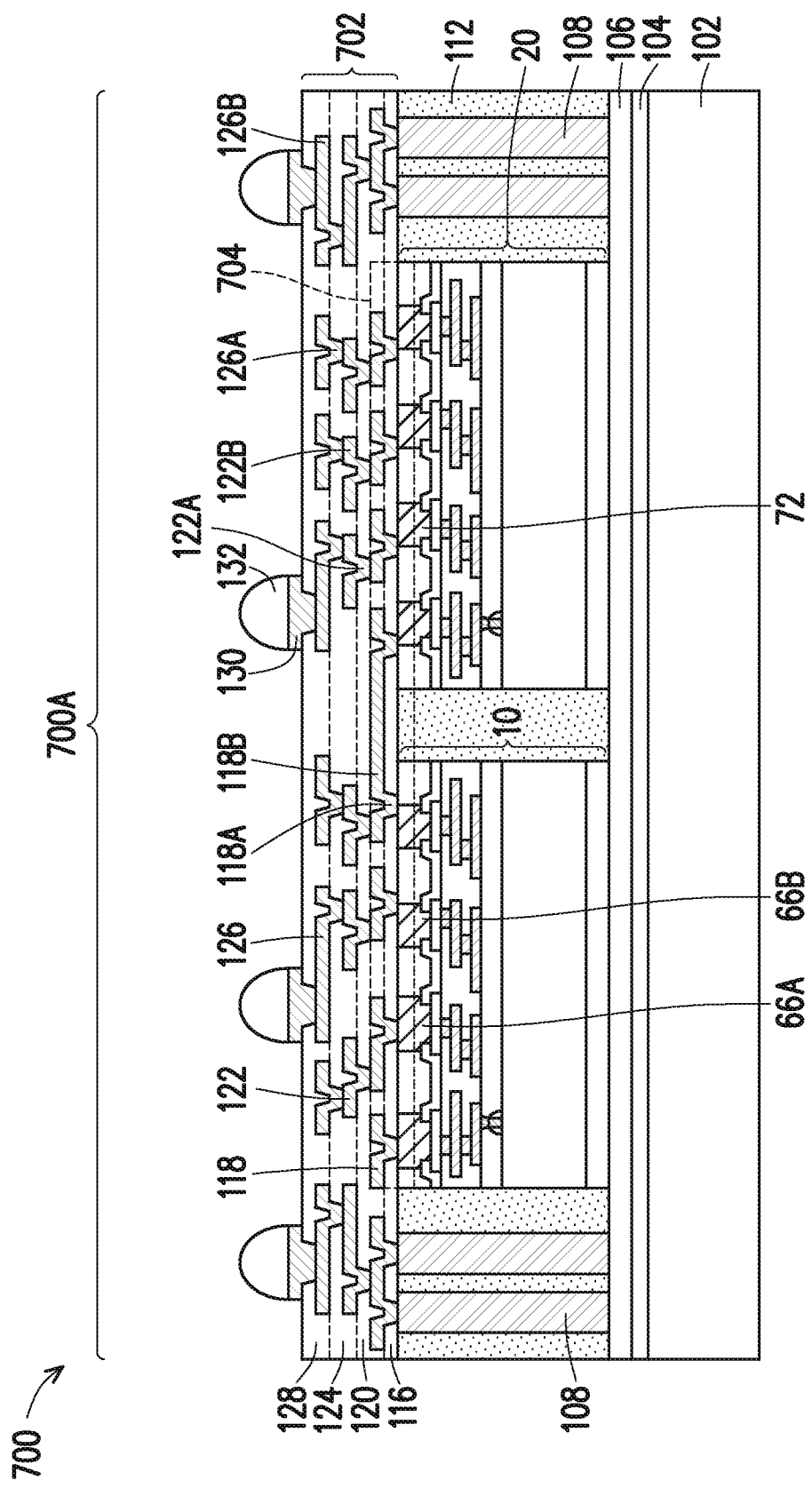
FIGS. 20-23 illustrate top and cross-sectional views of a package component in accordance with some embodiments.
Figure 21:
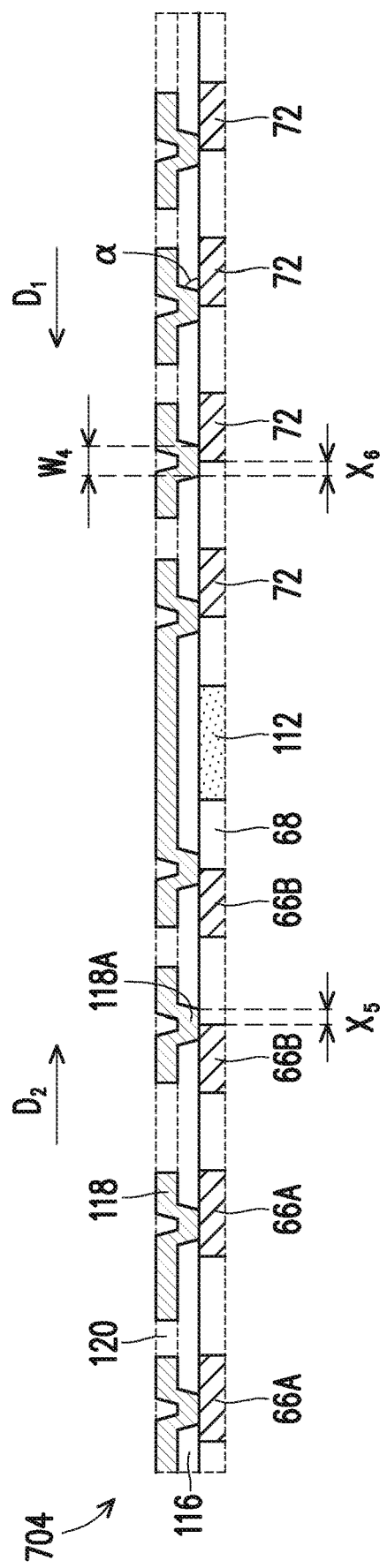
Figure 22:
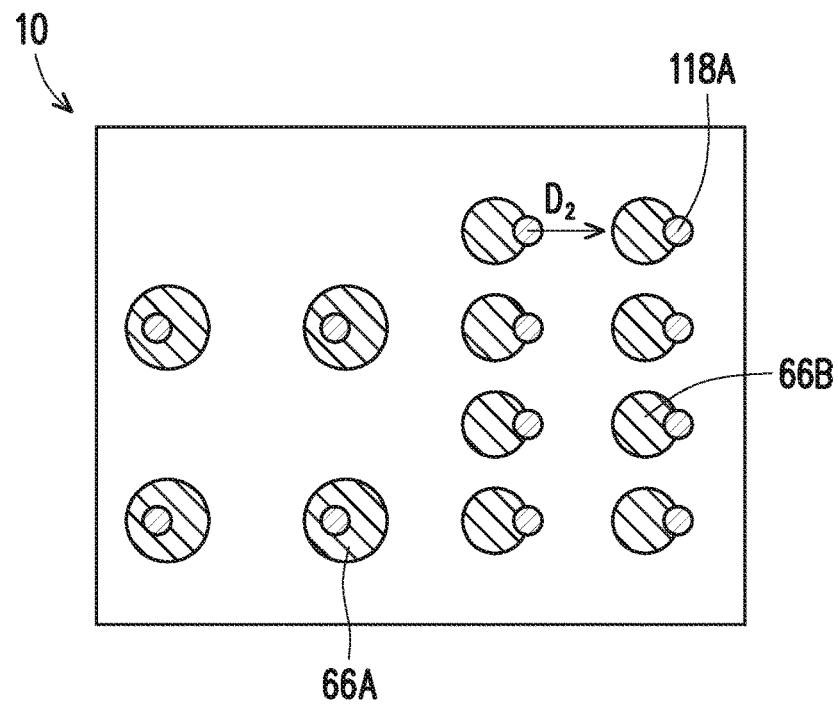
Figure 23:
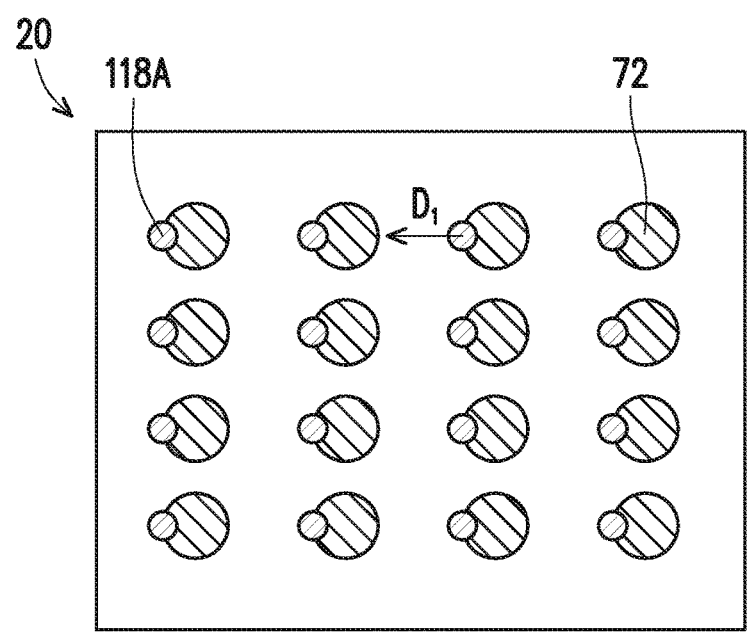

FIGS. 20-23 illustrate top and cross-sectional views of a package component 700 in accordance with some embodiments. FIG. 20 illustrates a cross-sectional view of the package component 700 in accordance with some embodiments. FIG. 21 illustrates a region 704 of the package component 700 showing an interface between the redistribution structure 702 and the integrated circuit dies 10 and 20. FIG. 22 illustrates a planar view of the integrated circuit die 10 of the package component 700 showing the die connectors 66A and 66B with corresponding vias 118A of the redistribution structure 702. FIG. 23 illustrates a planar view of the integrated circuit die 20 of the package component 700 showing the die connectors 72 with corresponding vias 118A of the redistribution structure 702.

In FIG. 20, a package region 700A of the package component 700 is illustrated. In some embodiments, the package component 700 comprises a plurality of package regions (such as the package region 700A). The package component 700 may also be referred to as a wafer-level packaged structure, such as an integrated fan-out (InFO) wafer-level packaged structure. The package component 700 is similar to the package component 100 illustrated in FIG. 9, with similar features being labeled by similar numerical references, and descriptions of the similar features are not repeated herein. In some embodiments, the package component 700 may be formed using process steps similar to the process steps described above with reference to FIGS. 3-9 and the description is not repeated herein. In some embodiments, the redistribution structure 702 includes insulating layers 116, 120, 124, and 128 and metallization patterns 118, 122, and 126, and may be formed in a similar manner as the redistribution structure 114 described above with reference to FIG. 9, and the description is not repeated herein.

In FIGS. 20-23, the vias 118A of the redistribution structure 702 fully land on corresponding die connectors 66A and partially land on corresponding die connectors 66B and 72. In some embodiments, the partial landing of the vias 118A is caused by shifts of the integrated circuit dies 10 and 20 during attaching the integrated circuit dies 10 and 20 to the insulating layer 106. In some embodiments, the partial landing of the vias 118A is further caused due misalignment of the openings in the insulating layer 116 during patterning the insulating layer 116. In some embodiments, the vias 118A are laterally shifted with respect to corresponding die connectors 66B in a direction $D_2$. The direction $D_2$ is parallel to the tops surfaces of the integrated circuit dies 10 and 20, and extends from the integrated circuit die 10 to the integrated circuit die 20. In some embodiments, the vias 118A are laterally shifted with respect to corresponding die connectors 72 in a direction $D_1$. The direction $D_1$ is opposite to the direction $D_2$.

In some embodiments, the vias 118A have sloped sidewalls. The sidewalls of the vias 118A form an angle α with top surfaces of respective ones of the die connectors 66B and 72. In some embodiments, the angle α is between about 70 degrees and about 89 degrees. The vias 118A have a width $W_4$ at top surfaces of respective ones the die connectors 66B and 72. In some embodiments, the width $W_4$ is between about 3 μm and about 15 μm. Portions of the vias 118A extend beyond an edge of corresponding ones of the die connectors 66B, such that sidewalls of the vias 118A are laterally spaced apart from sidewalls of the corresponding ones of the die connectors 66B by a distance $X_5$. In some embodiments, the distance $X_5$ is greater than zero and less than or equal to ⅔ of the width $W_4$. Portions of the vias 118A extend beyond an edge of corresponding ones of the die connectors 72, such that sidewalls of the vias 118A are laterally spaced apart from sidewalls of the corresponding ones of the die connectors 72 by a distance $X_6$. In some embodiments, the distance $X_6$ is greater than zero and less than or equal to ⅔ of the width $W_4$. In some embodiments, the distance $X_5$ and the distance $X_6$ are substantially equal. In other embodiments, the distance $X_5$ is different from the distance $X_6$.

Figure 24:
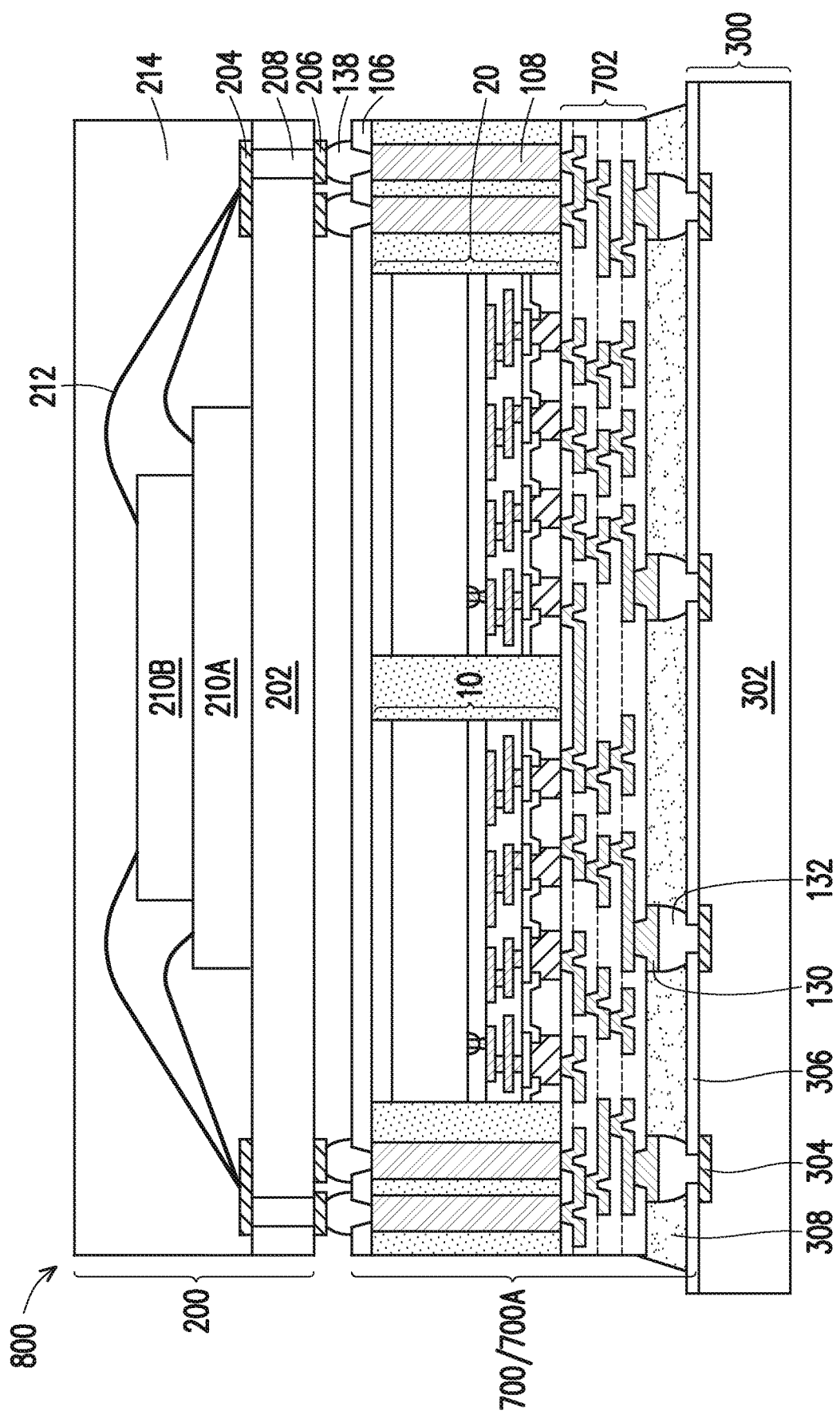
FIG. 24 illustrates a cross-sectional view of a device stack in accordance with some embodiments.

FIG. 24 illustrates a cross-sectional view of a device stack 800 bonded to a substrate 300 in accordance with some embodiments. The device stack 800 is similar to the device stack 400 illustrated in FIG. 14, with similar features being labeled by similar numerical references, and descriptions of the similar features are not repeated herein. In some embodiments, the device stack 800 may be formed by performing process steps described above with reference to FIGS. 13 and 14 on the package component 700 illustrated in FIG. 20. In some embodiments, the device stack 800 is bonded to the substrate 300 as described above with reference to FIG. 14.

Figure 25:
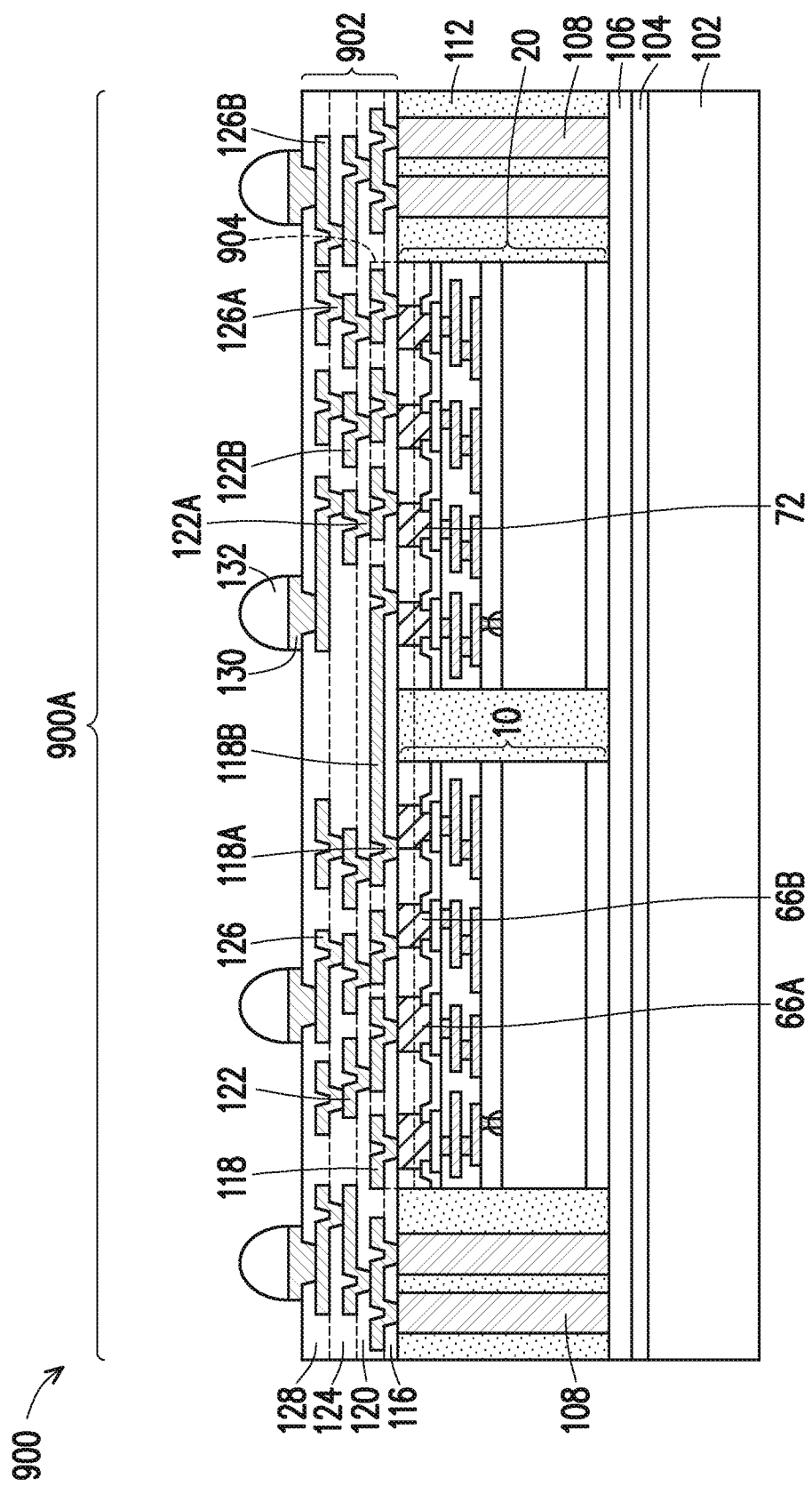
FIGS. 25-28 illustrate top and cross-sectional views of a package component in accordance with some embodiments.
Figure 26:
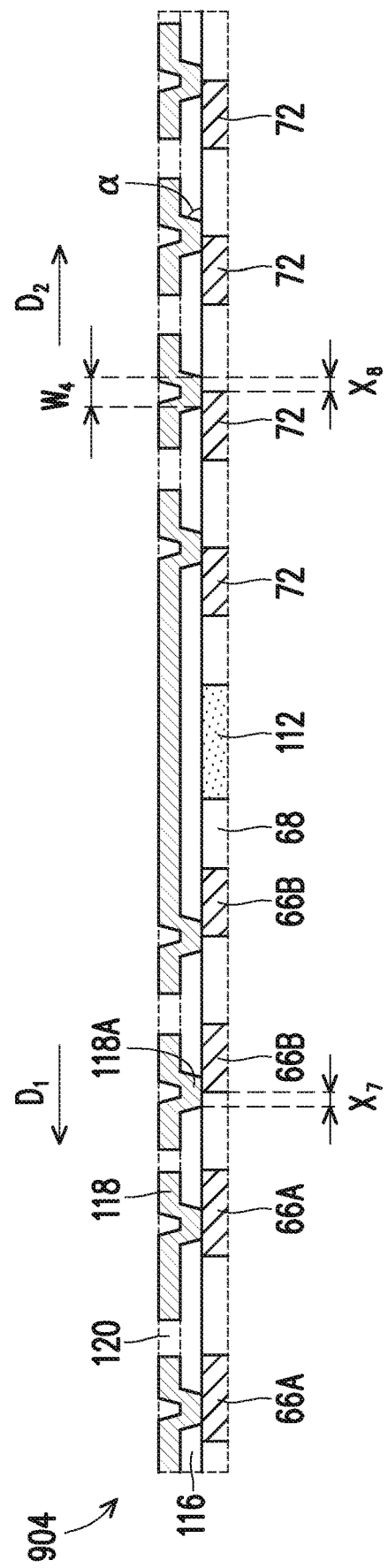
Figure 27:
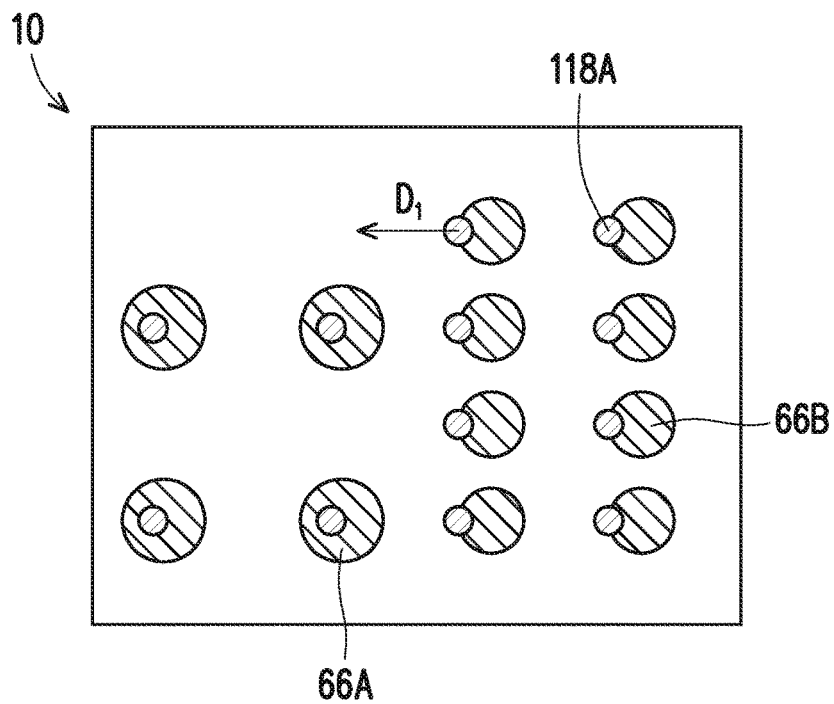
Figure 28:
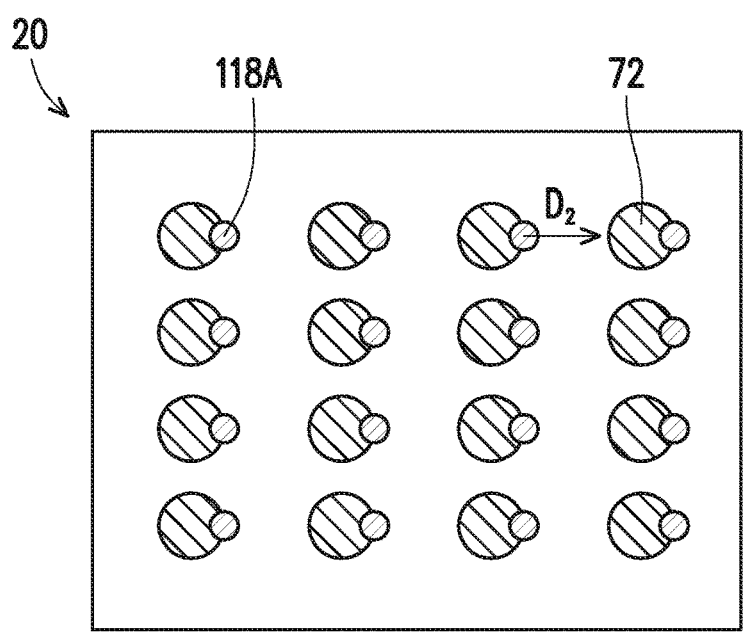

FIGS. 25-28 illustrate cross-sectional views of a package component 900 in accordance with some embodiments. FIG. 25 illustrates a cross-sectional view of the package component 900 in accordance with some embodiments. FIG. 26 illustrates a region 904 of the package component 900 showing an interface between the redistribution structure 902 and the integrated circuit dies 10 and 20. FIG. 27 illustrates a planar view of the integrated circuit die 10 of the package component 900 showing the die connectors 66A and 66B with corresponding vias 118A of the redistribution structure 902. FIG. 28 illustrates a planar view of the integrated circuit die 20 of the package component 900 showing the die connectors 72 with corresponding vias 118A of the redistribution structure 902.

In FIG. 25, a package region 900A of the package component 900 is illustrated. In some embodiments, the package component 900 comprises a plurality of package regions (such as the package region 900A). The package component 900 may also be referred to as a wafer-level packaged structure, such as an integrated fan-out (InFO) wafer-level packaged structure. The package component 900 is similar to the package component 100 illustrated in FIG. 9, with similar features being labeled by similar numerical references, and descriptions of the similar features are not repeated herein. In some embodiments, the package component 900 may be formed using process steps similar to the process steps described above with reference to FIGS. 3-9 and the description is not repeated herein. In some embodiments, the redistribution structure 902 includes insulating layers 116, 120, 124, and 128 and metallization patterns 118, 122, and 126, and may be formed in a similar manner as the redistribution structure 114 described above with reference to FIG. 9, and the description is not repeated herein.

In FIGS. 25-28, the vias 118A of the redistribution structure 902 fully land on corresponding die connectors 66A and partially land on corresponding die connectors 66B and 72. In some embodiments, the partial landing of the vias 118A is caused by shifts of the integrated circuit dies 10 and 20 during attaching the integrated circuit dies 10 and 20 to the insulating layer 106. In some embodiments, the partial landing of the vias 118A is further caused due misalignment of the openings in the insulating layer 116 during patterning the insulating layer 116. In some embodiments, the vias 118A are laterally shifted with respect to corresponding die connectors 66B in a direction $D_1$. The direction $D_1$ is parallel to the tops surfaces of the integrated circuit dies 10 and 20, and extends from the integrated circuit die 20 to the integrated circuit die 10. In some embodiments, the vias 118A are laterally shifted with respect to corresponding die connectors 72 in a direction $D_2$. The direction $D_2$ is opposite to the direction $D_1$.

In some embodiments, the vias 118A have sloped sidewalls. The sidewalls of the vias 118A form an angle α with top surfaces of respective ones of the die connectors 66B and 72. In some embodiments, the angle α is between about 70 degrees and about 89 degrees. The vias 118A have a width $W_4$ at top surfaces of respective ones the die connectors 66B and 72. In some embodiments, the width $W_4$ is between about 3 μm and about 15 μm. Portions of the vias 118A extend beyond an edge of corresponding ones of the die connectors 66B, such that sidewalls of the vias 118A are laterally spaced apart from sidewalls of the corresponding ones of the die connectors 66B by a distance $X_7$. In some embodiments, the distance $X_7$ is greater than zero and less than or equal to ⅔ of the width $W_4$. Portions of the vias 118A extend beyond an edge of corresponding ones of the die connectors 72, such that sidewalls of the vias 118A are laterally spaced apart from sidewalls of the corresponding ones of the die connectors 72 by a distance $X_8$. In some embodiments, the distance $X_8$ is greater than zero and less than or equal to ⅔ of the width $W_4$. In some embodiments, the distance $X_7$ and the distance $X_8$ are substantially equal. In other embodiments, the distance $X_7$ is different from the distance $X_8$.

Figure 29:
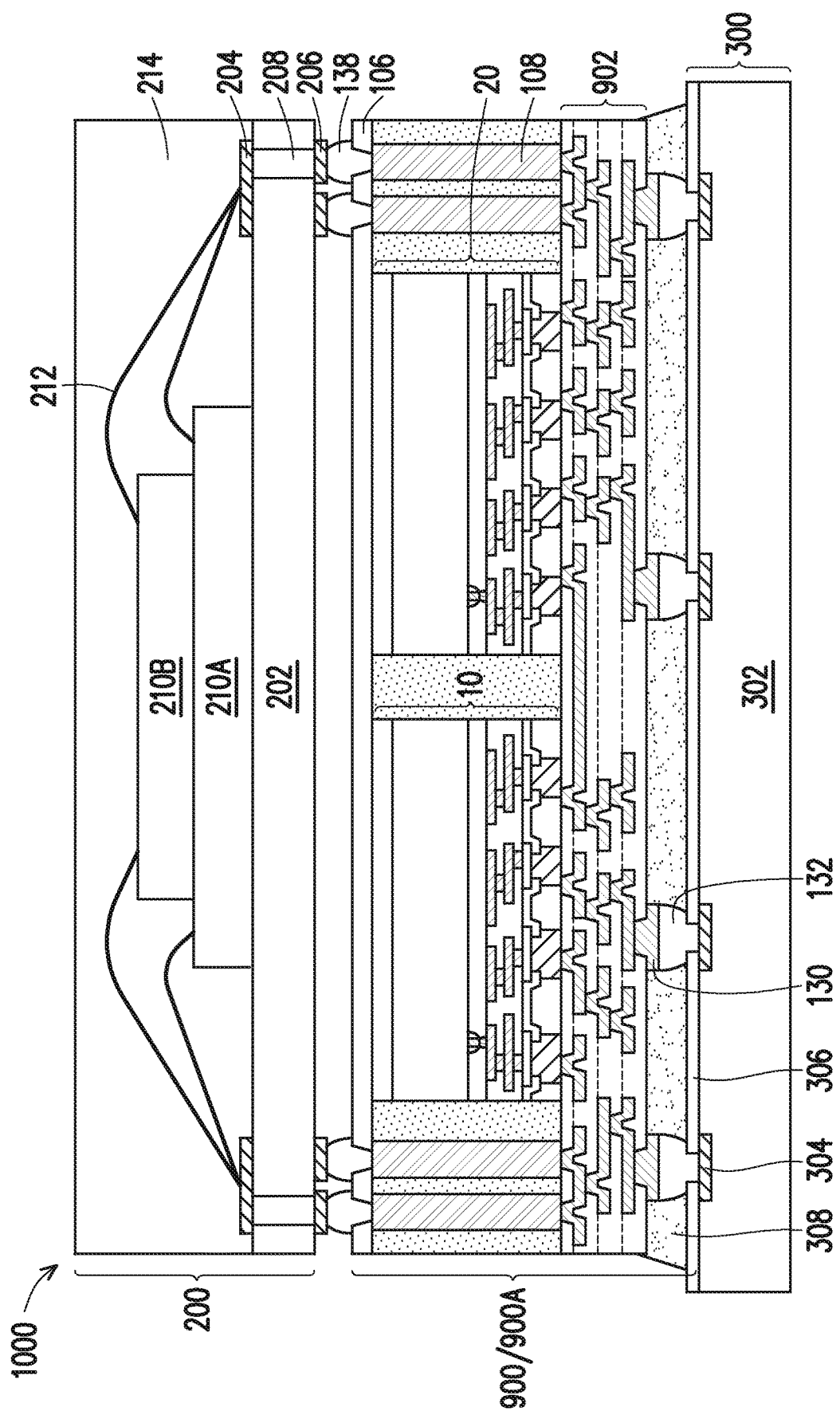
FIG. 29 illustrates a cross-sectional view of a device stack in accordance with some embodiments.

FIG. 29 illustrates a cross-sectional view of a device stack 1000 bonded to a substrate 300 in accordance with some embodiments. The device stack 1000 is similar to the device stack 400 illustrated in FIG. 14, with similar features being labeled by similar numerical references, and descriptions of the similar features are not repeated herein. In some embodiments, the device stack 1000 may be formed by performing process steps described above with reference to FIGS. 13 and 14 on the package component 900 illustrated in FIG. 25. In some embodiments, the device stack 1000 is bonded to the substrate 300 as described above with reference to FIG. 14.

Figure 30:
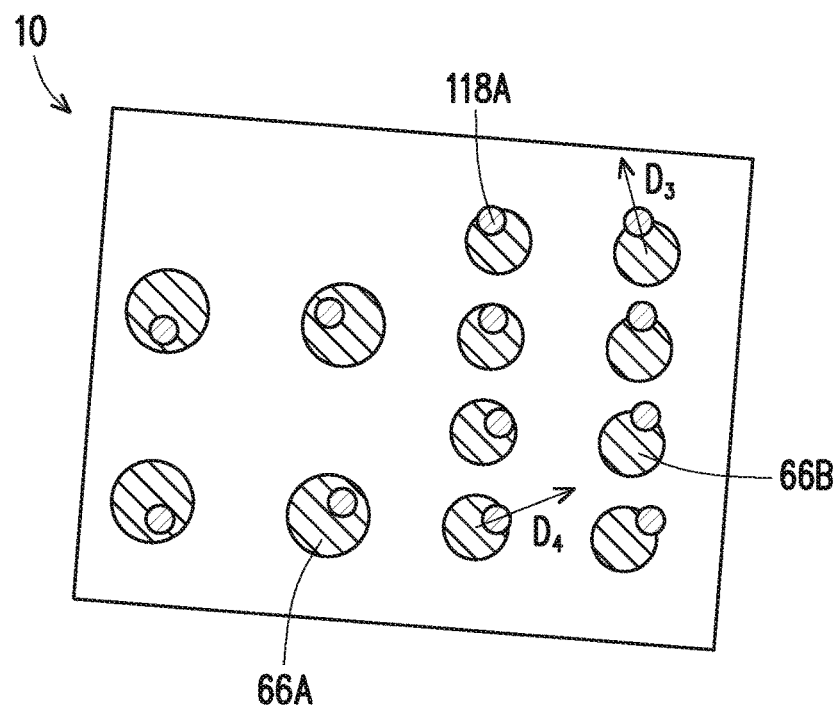
FIG. 30 illustrates a top view of an integrated circuit die in accordance with some embodiments.

In the illustrated embodiments described above with reference to FIGS. 11, 17, 22 and 27, each of the vias 118A is shifted with respect to the corresponding die connector 66B of the integrated circuit die 10 in a same direction. In other embodiments, different ones of the vias 118A may be shifted with respect to the corresponding die connectors 66B of the integrated circuit die 10 in different directions. In some embodiments, non-uniform shifts are caused by the rotation of the integrated circuit die 10 during attaching the integrated circuit die 10 to the insulating layer 106 (see FIG. 6). Such an embodiment is shown in FIG. 30, which illustrates a planar view of the integrated circuit die 10 showing the die connectors 66A and 66B with corresponding vias 118A. In the illustrated embodiment, the first via 118A at a corner of the integrated circuit die 10 is shifted in a direction $D_3$ and the second vias 118A at an edge of the integrated circuit die 10 is shifted in a direction $D_4$, such that the direction $D_3$ is different from the direction $D_4$.

Figure 31:
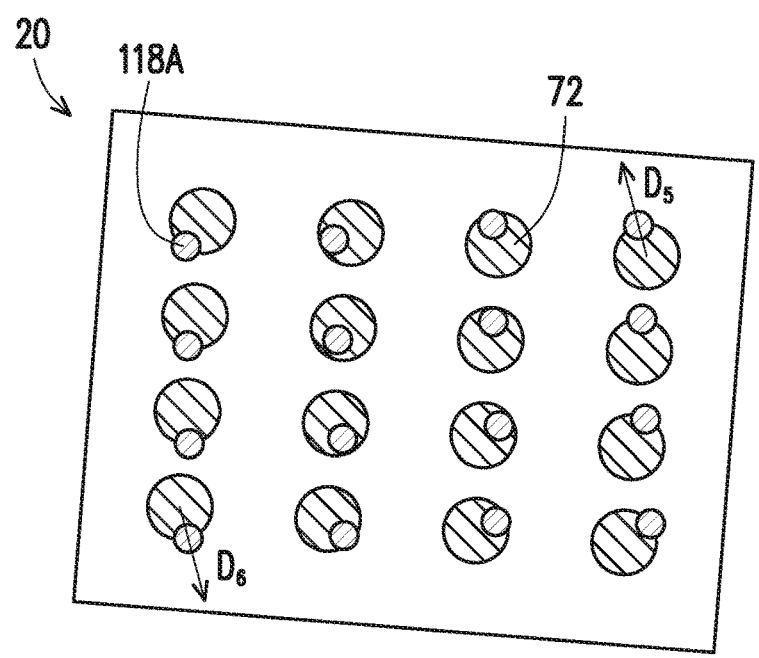
FIG. 31 illustrates a top view of an integrated circuit die in accordance with some embodiments.

Furthermore, in the illustrated embodiments described above with reference to FIGS. 12, 18, 23 and 28, each of the vias 118A is shifted with respect to the corresponding one of the die connectors 72 of the integrated circuit die 20 in a same direction. In other embodiments, different ones of the vias 118A may be shifted with respect to corresponding ones of the die connectors 72 of the integrated circuit die 20 in different directions. In some embodiments, non-uniform shifts are caused by the rotation of the integrated circuit die 20 during attaching the integrated circuit die 20 the insulating layer 106 (see FIG. 6). Such an embodiment is shown in FIG. 31, which illustrates a planar view of the integrated circuit die 20 showing the die connectors 72 with corresponding vias 118A. In the illustrated embodiment, the first via 118A at a first corner of the integrated circuit die 20 is shifted in a direction $D_5$ and the second vias 118A at a second opposite corner of the integrated circuit die 20 is shifted in a direction $D_6$, such that the direction $D_5$ is different from the direction $D_6$.

Figure 32:
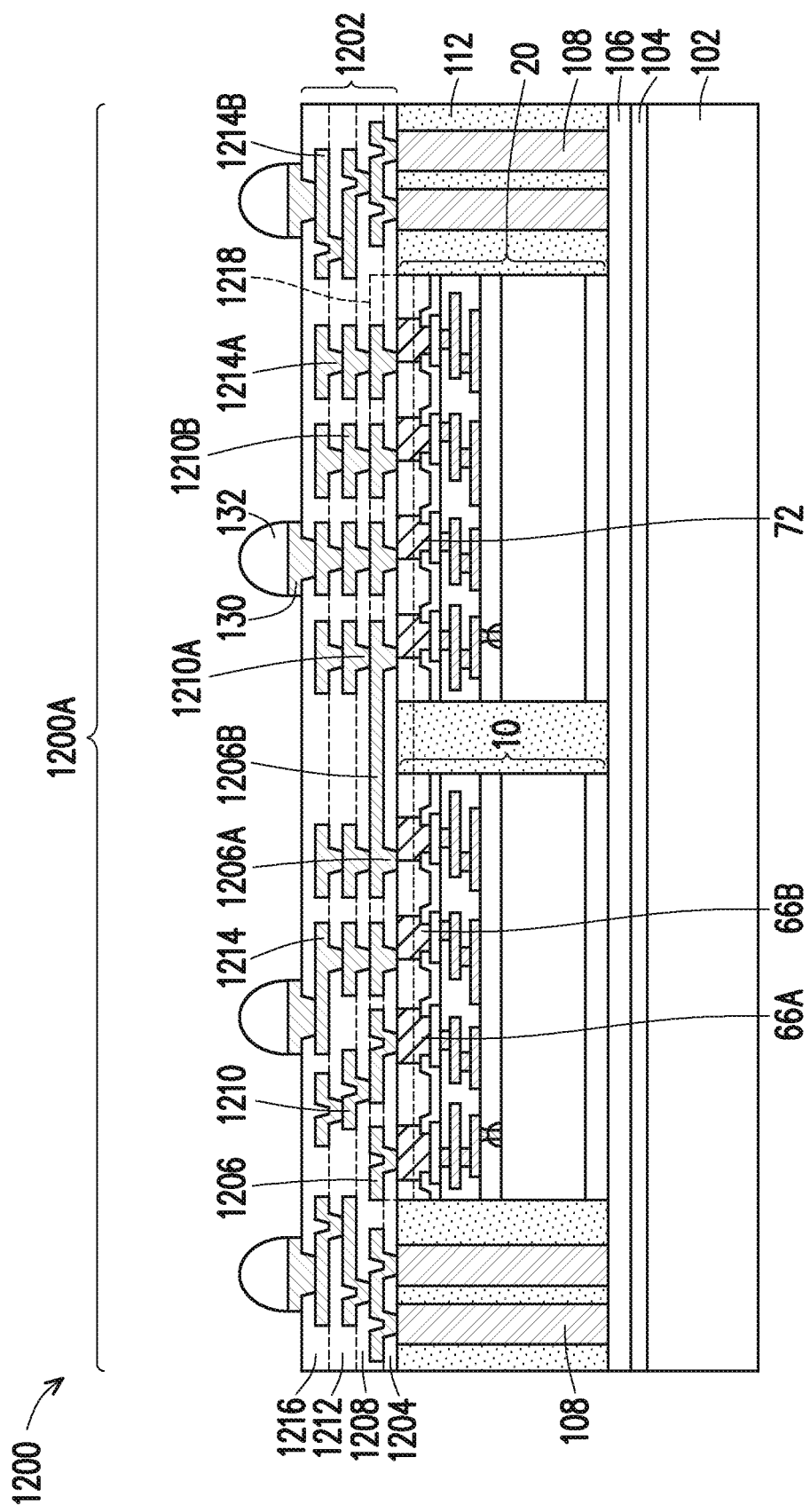
FIGS. 32-35 illustrate top and cross-sectional views of a package component in accordance with some embodiments.

FIG. 32 illustrates a cross-sectional view of the package component 1200 in accordance with some embodiments. In FIG. 32, a package region 1200A of the package component 1200 is illustrated. In some embodiments, the package component 1200 comprises a plurality of package regions (such as the package region 1200A). The package component 1200 may also be referred to as a wafer-level packaged structure, such as an integrated fan-out (InFO) wafer-level packaged structure. The package component 1200 is similar to the package component 100 illustrated in FIG. 9, with similar features being labeled by similar numerical references, and descriptions of the similar features are not repeated herein. In some embodiments, the package component 1200 may be formed using process steps similar to the process steps described above with reference to FIGS. 3-9 and the description is not repeated herein.

In some embodiments, the package component 1200 comprises the redistribution structure 1202. The redistribution structure 1202 includes insulating layers 1204, 1208, 1212, and 1216; and metallization patterns 1206, 1210, and 1214. In some embodiments, the insulating layers 1204, 1208, 1212, and 1216 may be formed using similar materials and methods as the insulating layer 116 described above with reference to FIG. 9 and the description is not repeated herein.

As an example to form the metallization pattern 1206, a seed layer is formed over the insulating layer 1204 and in the openings extending through the insulating layer 1204. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 1206. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. In some embodiments, the conductive material is formed in a non-conformal manner such that the conductive material fully fills the openings through the photoresist that formed over the die connectors 66B and 72. The combination of the conductive material and underlying portions of the seed layer form the metallization pattern 1206. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The metallization patterns 1210 and 1214 are formed using similar materials and methods as the metallization pattern 1206 and the description is not repeated herein.

In some embodiments, the redistribution structure 1202 is formed such that vias of the metallization patterns that are formed over and in electrical contact with the high-density die connectors 66B and 72 are vertically aligned. In the illustrated embodiment, the vias 1206A of the metallization pattern 1206 are vertically aligned with the vias 1210A of the metallization pattern 1210 and the vias 1214A of the metallization pattern 1214.

Figure 33:
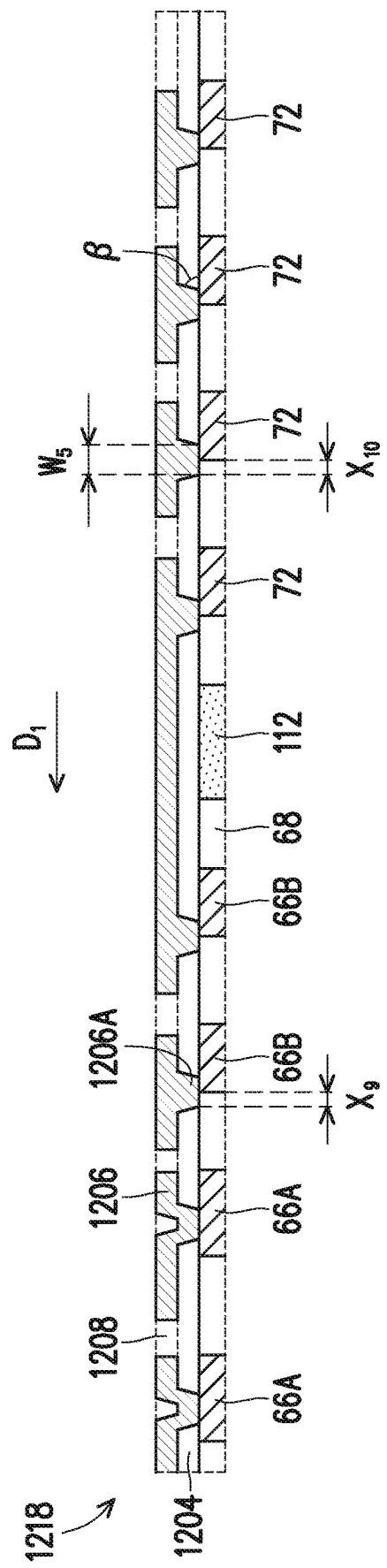
Figure 34:
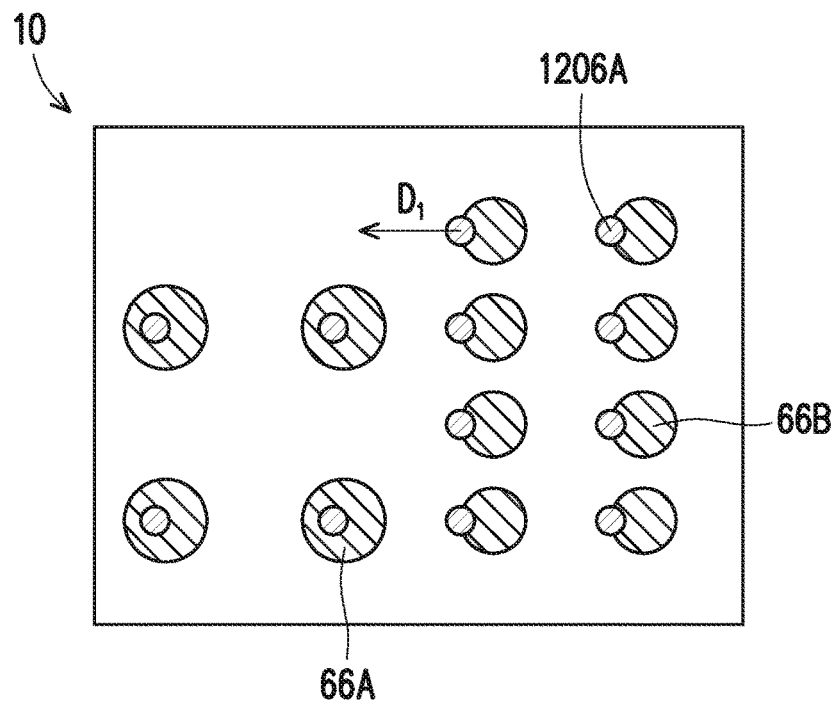
Figure 35:
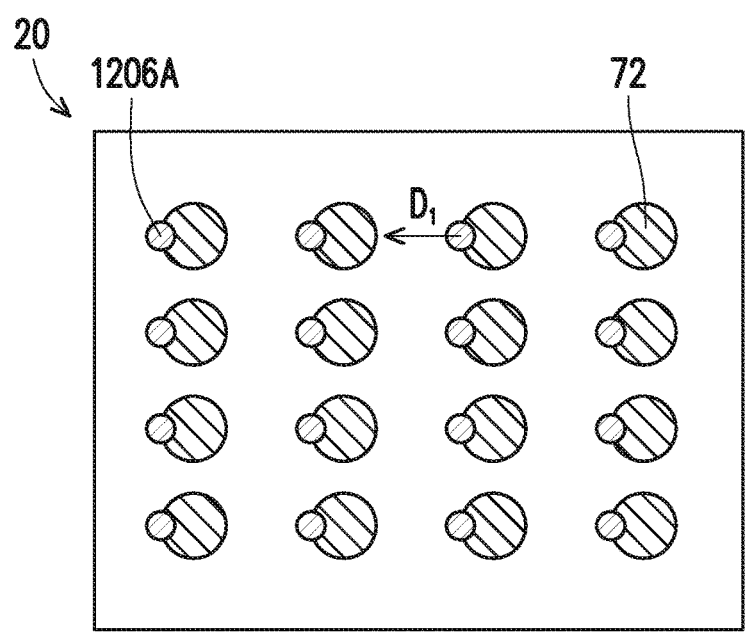

FIG. 33 illustrates a region 1218 of the package component 1200 showing an interface between the redistribution structure 1202 and the integrated circuit dies 10 and 20. FIG. 34 illustrates a planar view of the integrated circuit die 10 of the package component 1200 showing the die connectors 66A and 66B with corresponding vias 1206A of the redistribution structure 1202. FIG. 35 illustrates a planar view of the integrated circuit die 20 of the package component 1200 showing the die connectors 72 with corresponding vias 1206A of the redistribution structure 1202.

Referring to FIGS. 33-35, in some embodiments, the vias 1206A of the metallization pattern 1206 fully land on corresponding die connectors 66A and partially land on corresponding die connectors 66B and 72. In some embodiments, the partial landing of the vias 1206A is caused by shifts of the integrated circuit dies 10 and 20 during attaching the integrated circuit dies 10 and 20 to the insulating layer 106 (see FIG. 32). In some embodiments, the partial landing of the vias 1206A is further caused due misalignment of the openings in the insulating layer 1204 during patterning the insulating layer 1204. In some embodiments, the vias 1206A are laterally shifted with respect to corresponding die connectors 66B and 72 in a direction $D_1$. In the illustrated embodiment, the first direction $D_1$ is parallel to the tops surfaces of the integrated circuit dies 10 and 20, and extends from the integrated circuit die 20 to the integrated circuit die 10.

In some embodiments, the vias 1206A have sloped sidewalls. The sidewalls of the vias 1206A form an angle β with top surfaces of respective ones of the die connectors 66B and 72. In some embodiments, the angle β is between about 70 degrees and about 89 degrees. The vias 1206A have a width $W_5$ at top surfaces of respective ones the die connectors 66B and 72. In some embodiments, the width $W_5$ is between about 3 μm and about 15 μm. Portions of the vias 1206A extend beyond an edge of corresponding ones of the die connectors 66B, such that sidewalls of the vias 1206A are laterally spaced apart from sidewalls of the corresponding ones of the die connectors 66B by a distance $X_9$. In some embodiments, the distance $X_9$ is greater than zero and less than or equal to ⅔ of the width $W_5$. Portions of the vias 1206A extend beyond an edge of corresponding ones of the die connectors 72, such that sidewalls of the vias 1206A are laterally spaced apart from sidewalls of the corresponding ones of the die connectors 72 by a distance $X_{10}$. In some embodiments, the distance $X_{10}$ is greater than zero and less than or equal to ⅔ of the width $W_5$. In some embodiments, the distance $X_9$ and the distance $X_{10}$ are substantially equal. In other embodiments, the distance $X_9$ is different from the distance $X_{10}$.

Figure 36:
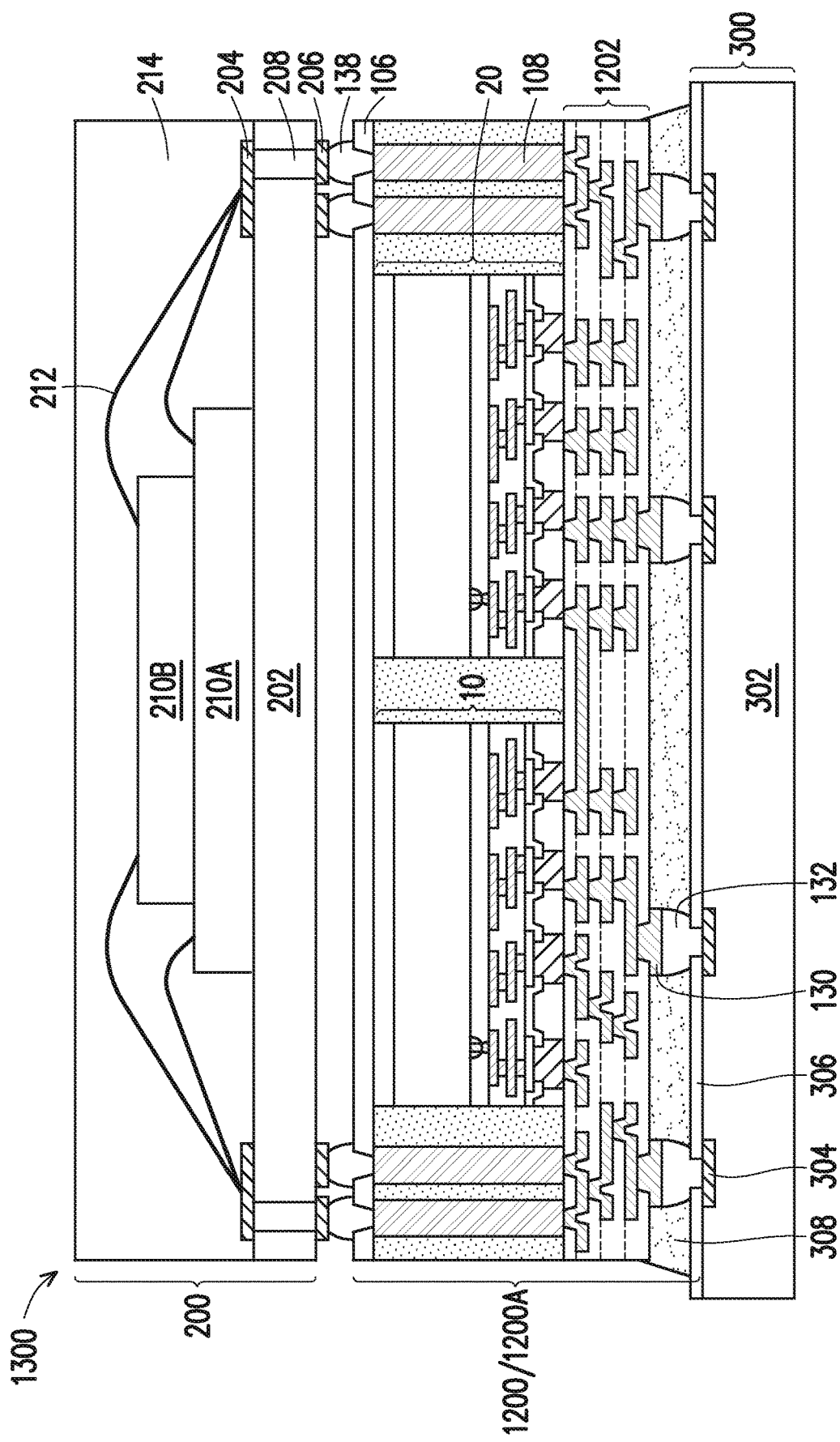
FIG. 36 illustrates a cross-sectional view of a device stack in accordance with some embodiments.

FIG. 36 illustrates a cross-sectional view of a device stack 1300 bonded to a substrate 300 in accordance with some embodiments. The device stack 1300 is similar to the device stack 400 illustrated in FIG. 14, with similar features being labeled by similar numerical references, and descriptions of the similar features are not repeated herein. In some embodiments, the device stack 1300 may be formed by performing process steps described above with reference to FIGS. 13 and 14 on the package component 1200 illustrated in FIG. 32. In some embodiments, the device stack 1300 is bonded to the substrate 300 as described above with reference to FIG. 14.

Figure 37:
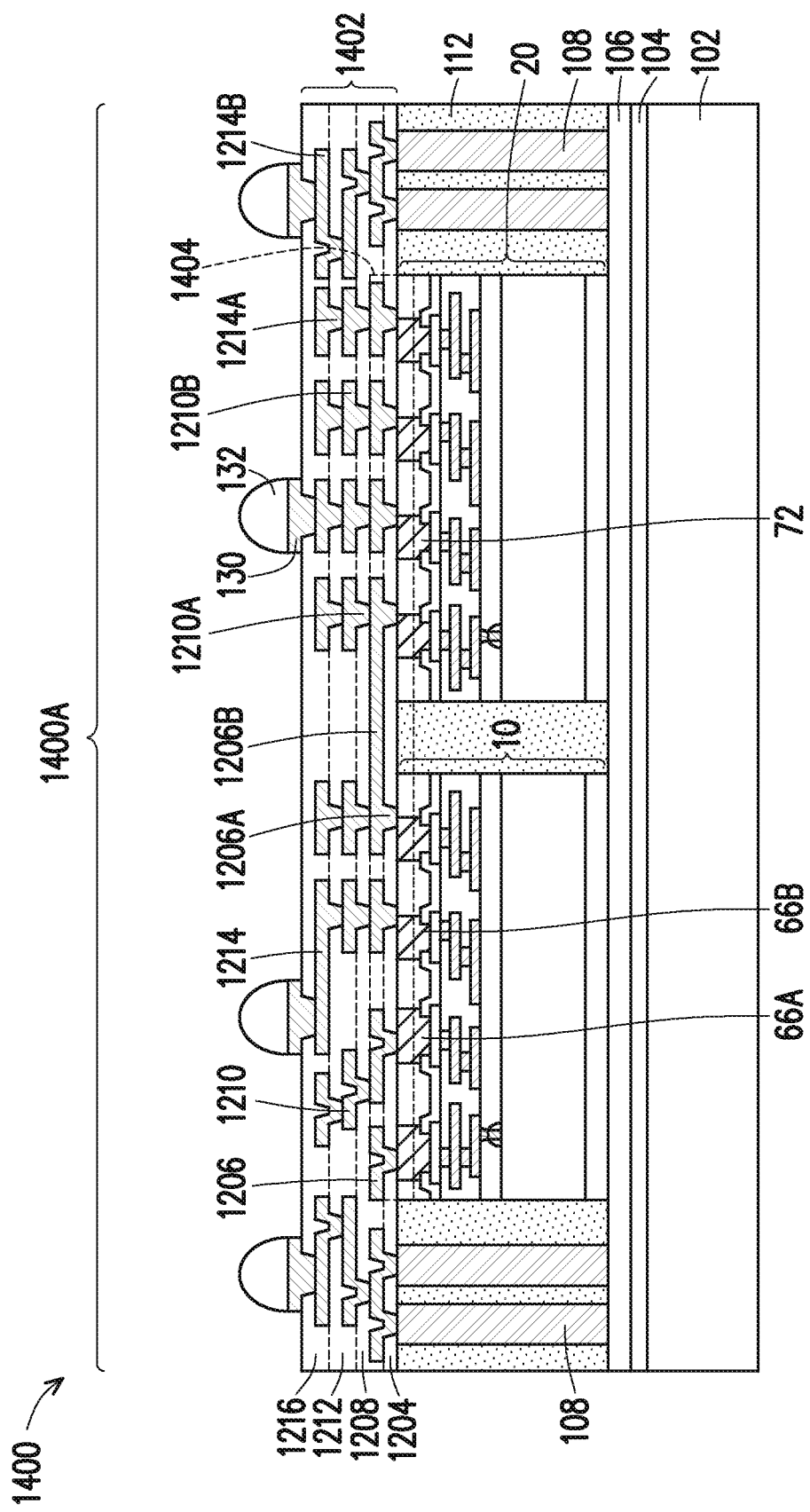
FIGS. 37-40 illustrate top and cross-sectional views of a package component in accordance with some embodiments.
Figure 38:
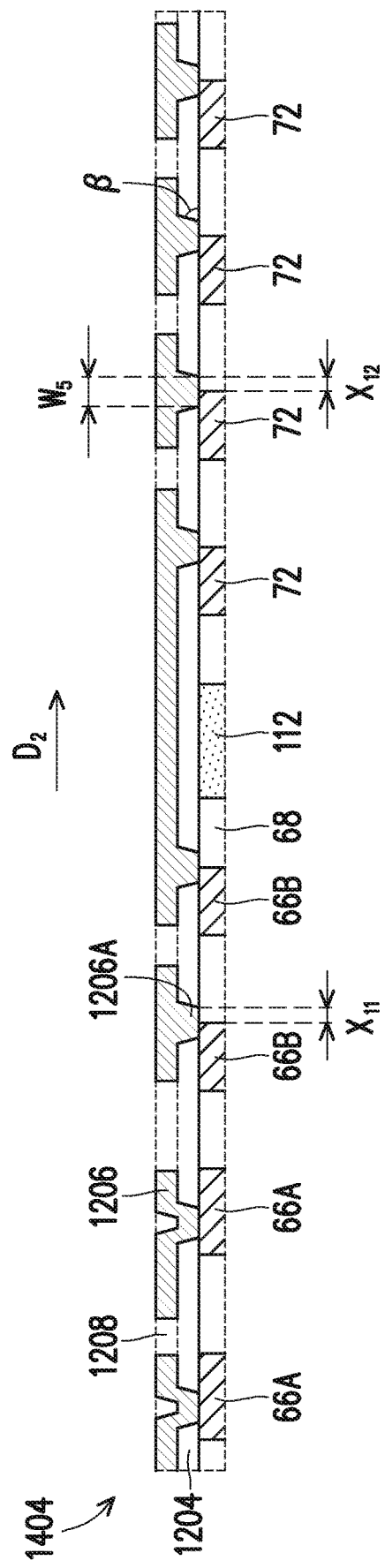
Figure 39:
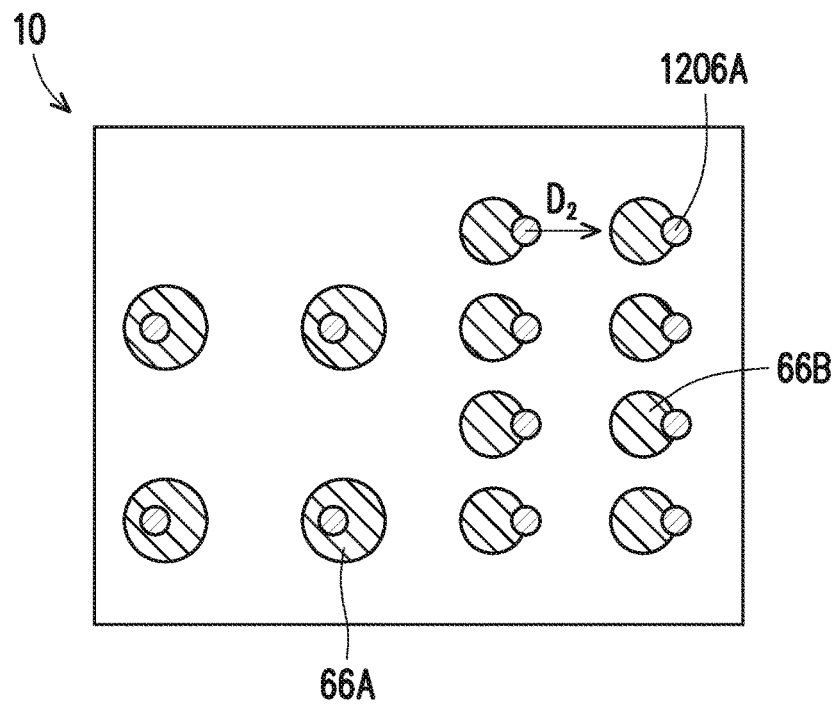
Figure 40:
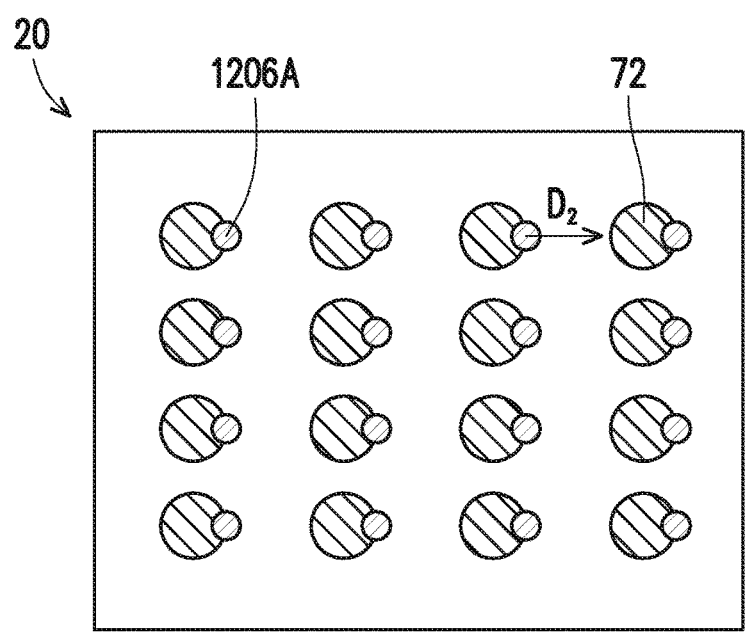

FIGS. 37-40 illustrate top and cross-sectional views of a package component 1400 in accordance with some embodiments. FIG. 37 illustrates a cross-sectional view of the package component 1400 in accordance with some embodiments. FIG. 38 illustrates a region 1404 of the package component 1400 showing an interface between the redistribution structure 1402 and the integrated circuit dies 10 and 20. FIG. 39 illustrates a planar view of the integrated circuit die 10 of the package component 1400 showing the die connectors 66A and 66B with corresponding vias 1206A of the redistribution structure 1402. FIG. 40 illustrates a planar view of the integrated circuit die 20 of the package component 1400 showing the die connectors 72 with corresponding vias 1206A of the redistribution structure 1402.

In FIG. 37, a package region 1400A of the package component 1400 is illustrated. In some embodiments, the package component 1400 comprises a plurality of package regions (such as the package region 1400A). The package component 1400 may also be referred to as a wafer-level packaged structure, such as an integrated fan-out (InFO) wafer-level packaged structure. The package component 1400 is similar to the package component 1200 illustrated in FIG. 32, with similar features being labeled by similar numerical references, and descriptions of the similar features are not repeated herein. In some embodiments, the package component 1400 may be formed using process steps similar to the process steps described above with reference to FIGS. 32-35 and the description is not repeated herein. In some embodiments, the redistribution structure 1402 includes insulating layers 1204, 1208, 1212, and 1216 and metallization patterns 1206, 1210, and 1214, and may be formed in a similar manner as the redistribution structure 1202 described above with reference to FIG. 32.

In FIGS. 37-40, the vias 1206A of the redistribution structure 1402 fully land on corresponding die connectors 66A and partially land on corresponding die connectors 66B and 72. In some embodiments, the partial landing of the vias 1206A is caused by shifts of the integrated circuit dies 10 and 20 during attaching the integrated circuit dies 10 and 20 to the insulating layer 106. In some embodiments, the partial landing of the vias 1206A is further caused due misalignment of the openings in the insulating layer 1204 during patterning the insulating layer 1204. In some embodiments, the vias 1206A are laterally shifted with respect to corresponding die connectors 66B and 72 in a direction $D_2$. In the illustrated embodiment, the direction $D_2$ is parallel to the tops surfaces of the integrated circuit dies 10 and 20, and extends from the integrated circuit die 10 to the integrated circuit die 20.

In some embodiments, the vias 1206A have sloped sidewalls. The sidewalls of the vias 1206A form an angle $\beta$ with top surfaces of respective ones of the die connectors 66B and 72. In some embodiments, the angle $\beta$ is between about 70 degrees and about 89 degrees. The vias 1206A have a width $W_5$ at top surfaces of respective ones the die connectors 66B and 72. In some embodiments, the width $W_5$ is between about 3 µm and about 15 µm. Portions of the vias 1206A extend beyond an edge of corresponding ones of the die connectors 66B, such that sidewalls of the vias 1206A are laterally spaced apart from sidewalls of the corresponding ones of the die connectors 66B by a distance $X_{ii}$. In some embodiments, the distance $X_{ii}$ is greater than zero and less than or equal to ⅔ of the width $W_5$. Portions of the vias 1206A extend beyond an edge of corresponding ones of the die connectors 72, such that sidewalls of the vias 1206A are laterally spaced apart from sidewalls of the corresponding ones of the die connectors 72 by a distance $X_{12}$. In some embodiments, the distance $X_{12}$ is greater than zero and less than or equal to ⅔ of the width $W_5$. In some embodiments, the distance $X_{11}$ and the distance $X_{12}$ are substantially equal. In other embodiments, the distance $X_{11}$ is different from the distance $X_{12}$.

Figure 41:
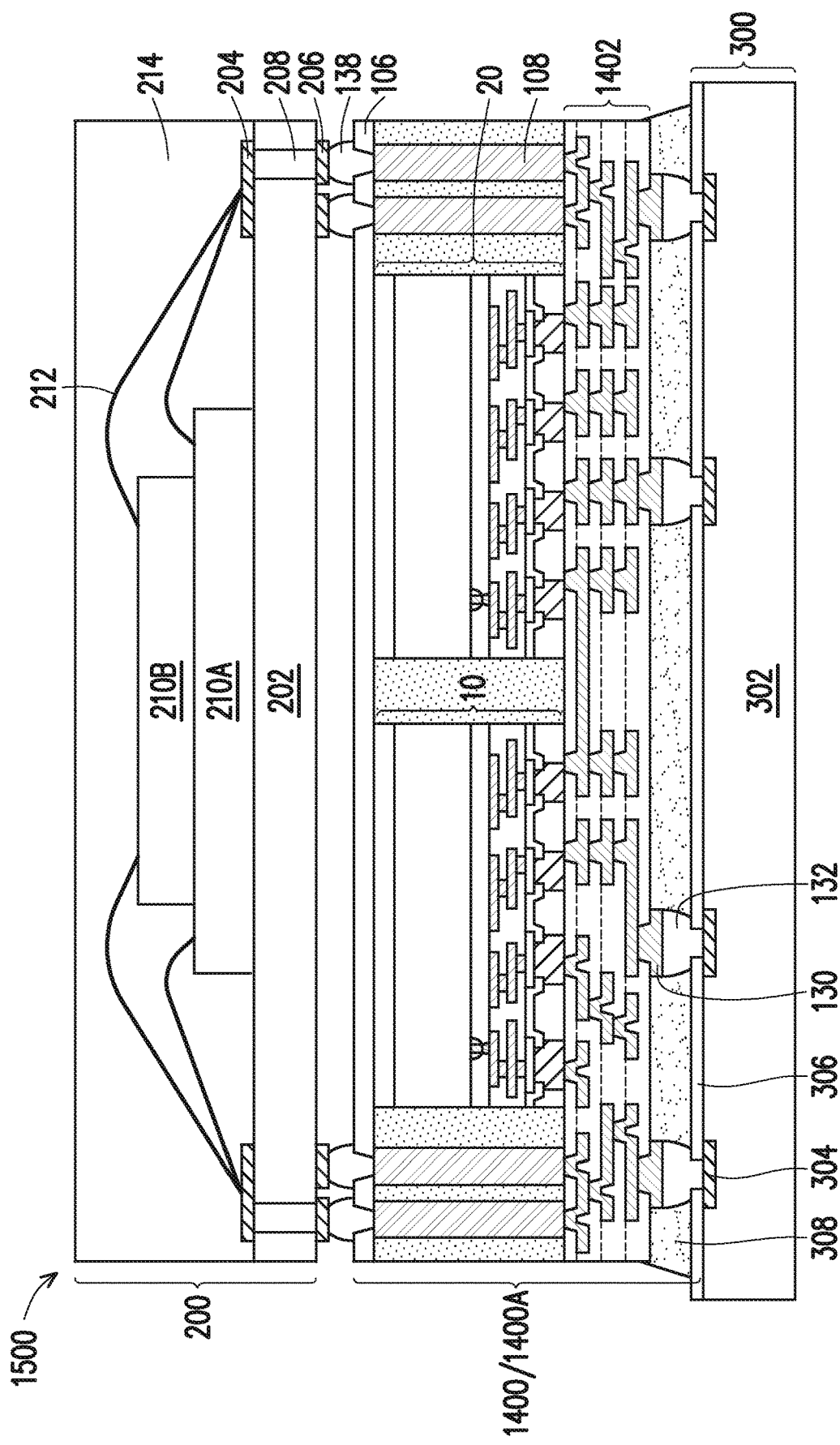
FIG. 41 illustrates a cross-sectional view of a device stack in accordance with some embodiments.

FIG. 41 illustrates a cross-sectional view of a device stack 1500 bonded to a substrate 300 in accordance with some embodiments. The device stack 1500 is similar to the device stack 1300 illustrated in FIG. 36, with similar features being labeled by similar numerical references, and descriptions of the similar features are not repeated herein. In some embodiments, the device stack 1500 may be formed by performing process steps described above with reference to FIGS. 13 and 14 on the package component 1400 illustrated in FIG. 37. In some embodiments, the device stack 1500 is bonded to the substrate 300 as described above with reference to FIG. 14.

Figure 42:
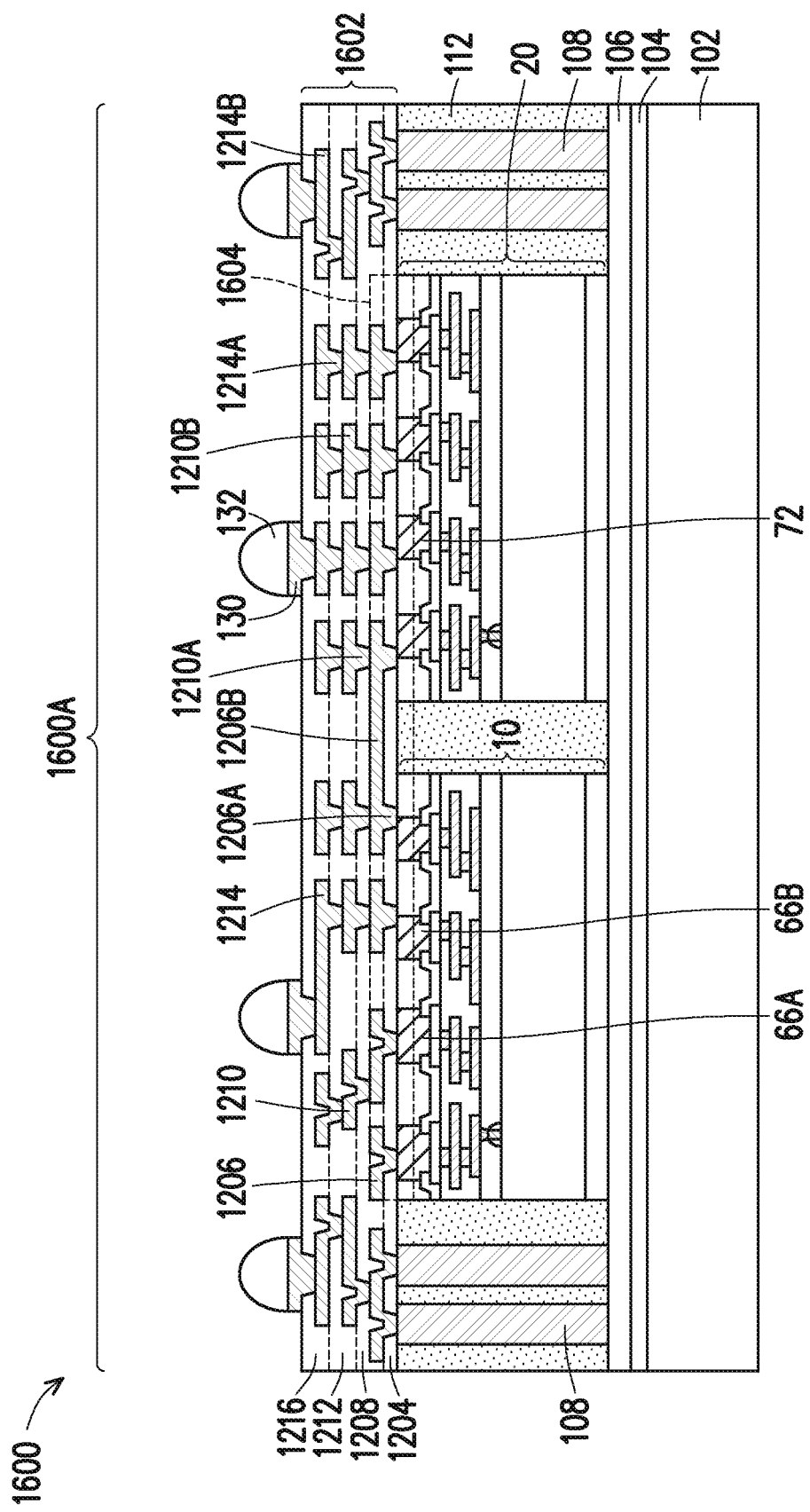
FIGS. 42-45 illustrate top and cross-sectional views of a package component in accordance with some embodiments.
Figure 43:
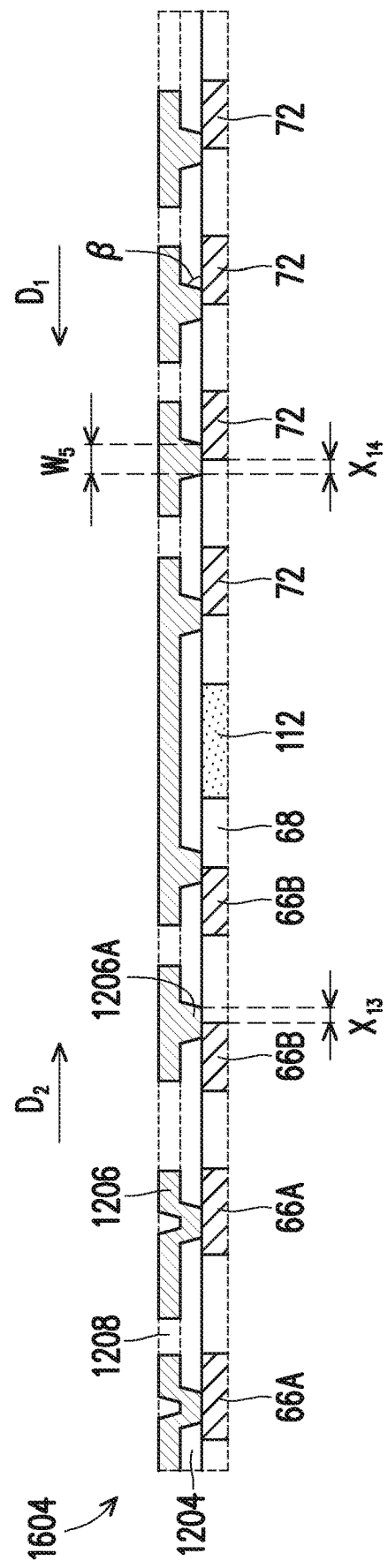
Figure 44:
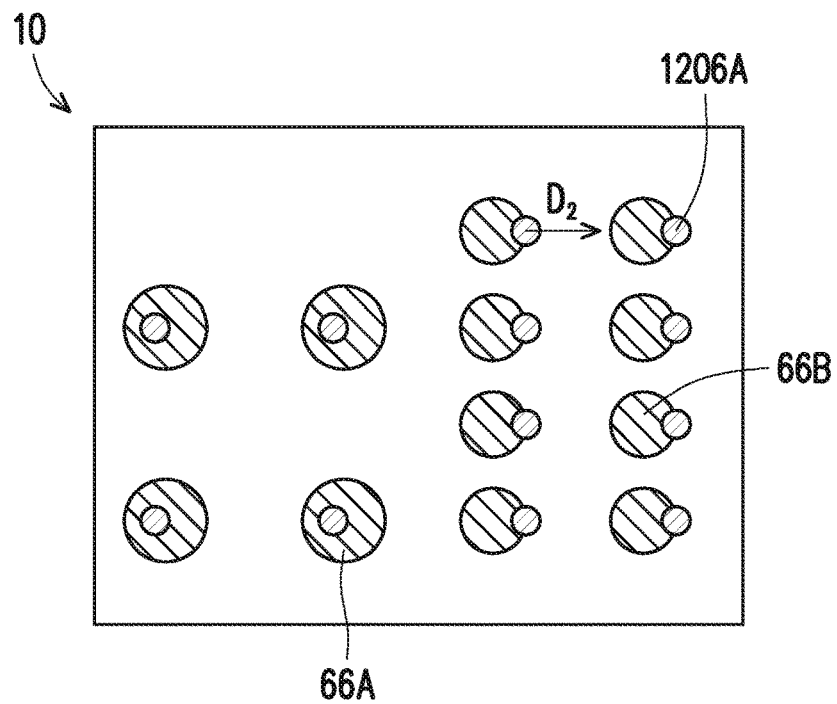
Figure 45:
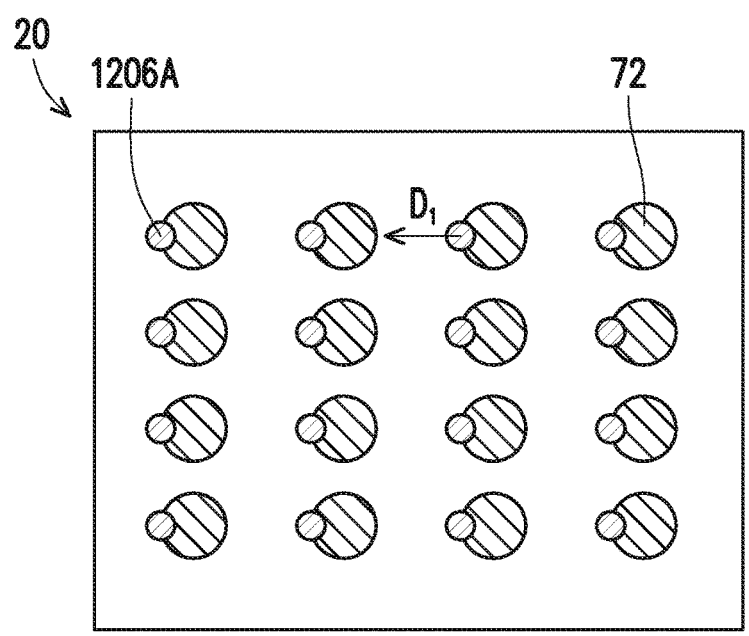

FIGS. 42-45 illustrate top and cross-sectional views of a package component 1600 in accordance with some embodiments. FIG. 42 illustrates a cross-sectional view of the package component 1600 in accordance with some embodiments. FIG. 43 illustrates a region 1604 of the package component 1600 showing an interface between the redistribution structure 1602 and the integrated circuit dies 10 and 20. FIG. 44 illustrates a planar view of the integrated circuit die 10 of the package component 1600 showing the die connectors 66A and 66B with corresponding vias 1206A of the redistribution structure 1602. FIG. 45 illustrates a planar view of the integrated circuit die 20 of the package component 1600 showing the die connectors 72 with corresponding vias 1206A of the redistribution structure 1602.

In FIG. 42, a package region 1600A of the package component 1600 is illustrated. In some embodiments, the package component 1600 comprises a plurality of package regions (such as the package region 1600A). The package component 1600 may also be referred to as a wafer-level packaged structure, such as an integrated fan-out (InFO) wafer-level packaged structure. The package component 1600 is similar to the package component 1200 illustrated in FIG. 32, with similar features being labeled by similar numerical references, and descriptions of the similar features are not repeated herein. In some embodiments, the package component 1600 may be formed using process steps similar to the process steps described above with reference to FIGS. 32-35 and the description is not repeated herein. In some embodiments, the redistribution structure 1602 includes insulating layers 1204, 1208, 1212, and 1216 and metallization patterns 1206, 1210, and 1214, and may be formed in a similar manner as the redistribution structure 1202 described above with reference to FIG. 32.

In FIGS. 42-45, the vias 1206A of the redistribution structure 1602 fully land on corresponding die connectors 66A and partially land on corresponding die connectors 66B and 72. In some embodiments, the partial landing of the vias 1206A is caused by shifts of the integrated circuit dies 10 and 20 during attaching the integrated circuit dies 10 and 20 to the insulating layer 106. In some embodiments, the partial landing of the vias 1206A is further caused due misalignment of the openings in the insulating layer 1204 during patterning the insulating layer 1204. In some embodiments, the vias 1206A are laterally shifted with respect to corresponding die connectors 66B in a direction $D_2$. The direction $D_2$ is parallel to the tops surfaces of the integrated circuit dies 10 and 20, and extends from the integrated circuit die 10 to the integrated circuit die 20. In some embodiments, the vias 1206A are laterally shifted with respect to corresponding die connectors 72 in a direction $D_1$. The direction $D_1$ is opposite to the direction $D_2$.

In some embodiments, the vias 1206A have sloped sidewalls. The sidewalls of the vias 1206A form an angle $\beta$ with top surfaces of respective ones of the die connectors 66B and 72. In some embodiments, the angle $\beta$ is between about 70 degrees and about 89 degrees. The vias 1206A have a width $W_5$ at top surfaces of respective ones the die connectors 66B and 72. In some embodiments, the width $W_5$ is between about 3 µm and about 15 µm. Portions of the vias 1206A extend beyond an edge of corresponding ones of the die connectors 66B, such that sidewalls of the vias 1206A are laterally spaced apart from sidewalls of the corresponding ones of the die connectors 66B by a distance $X_{13}$. In some embodiments, the distance $X_{13}$ is greater than zero and less than or equal to ⅔ of the width $W_5$. Portions of the vias 1206A extend beyond an edge of corresponding ones of the die connectors 72, such that sidewalls of the vias 1206A are laterally spaced apart from sidewalls of the corresponding ones of the die connectors 72 by a distance $X_{14}$. In some embodiments, the distance $X_{14}$ is greater than zero and less than or equal to ⅔ of the width $W_5$. In some embodiments, the distance $X_{13}$ and the distance $X_{14}$ are substantially equal. In other embodiments, the distance $X_{13}$ is different from the distance $X_{14}$.

Figure 46:
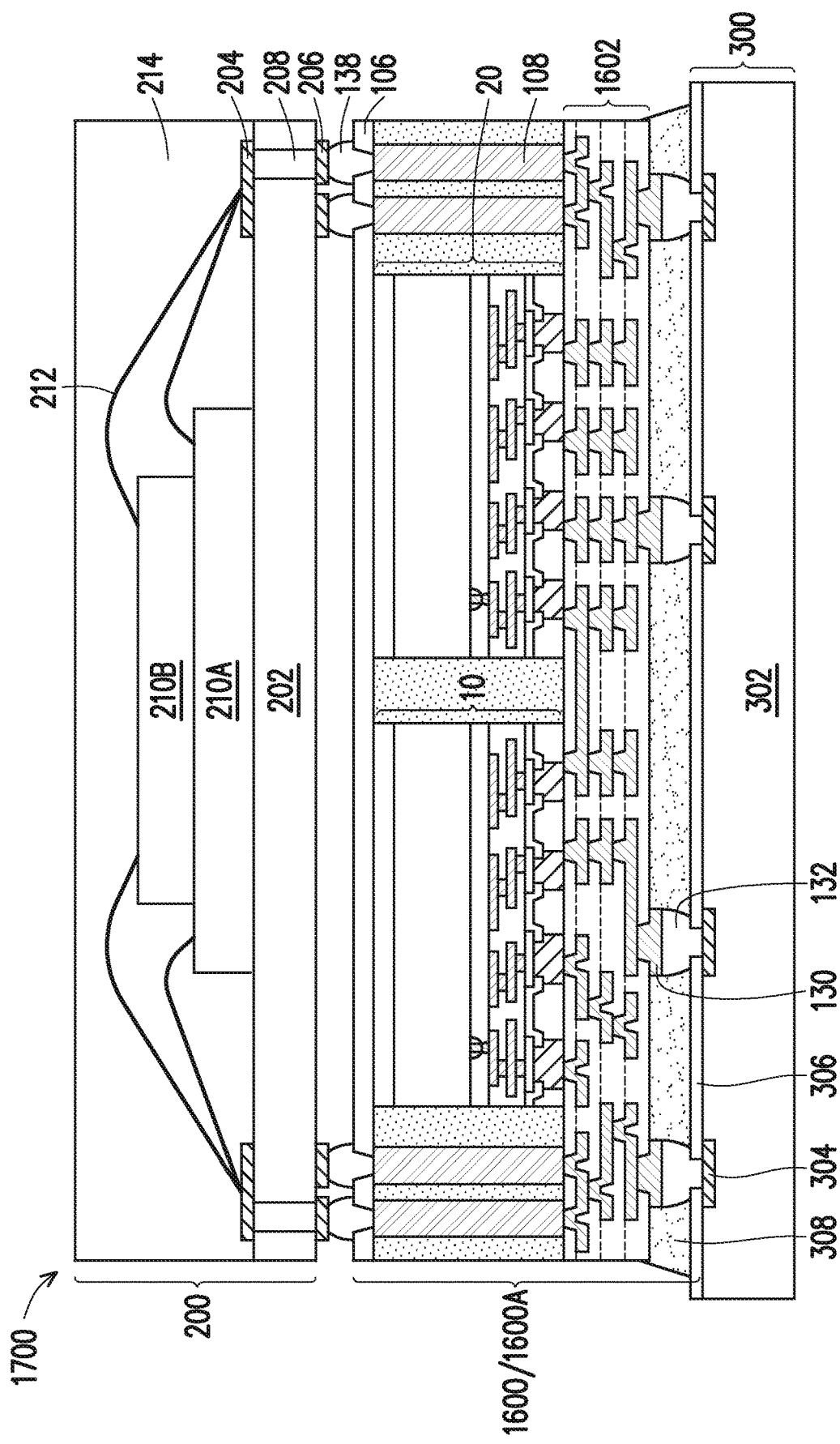
FIG. 46 illustrates a cross-sectional view of a device stack in accordance with some embodiments.

FIG. 46 illustrates a cross-sectional view of a device stack 1700 bonded to a substrate in accordance with some embodiments. The device stack 1700 is similar to the device stack 1300 illustrated in FIG. 36, with similar features being labeled by similar numerical references, and descriptions of the similar features are not repeated herein. In some embodiments, the device stack 1700 may be formed by performing process steps described above with reference to FIGS. 13 and 14 on the package component 1600 illustrated in FIG. 42. In some embodiments, the device stack 1700 is bonded to the substrate 300 as described above with reference to FIG. 14.

Figure 47:
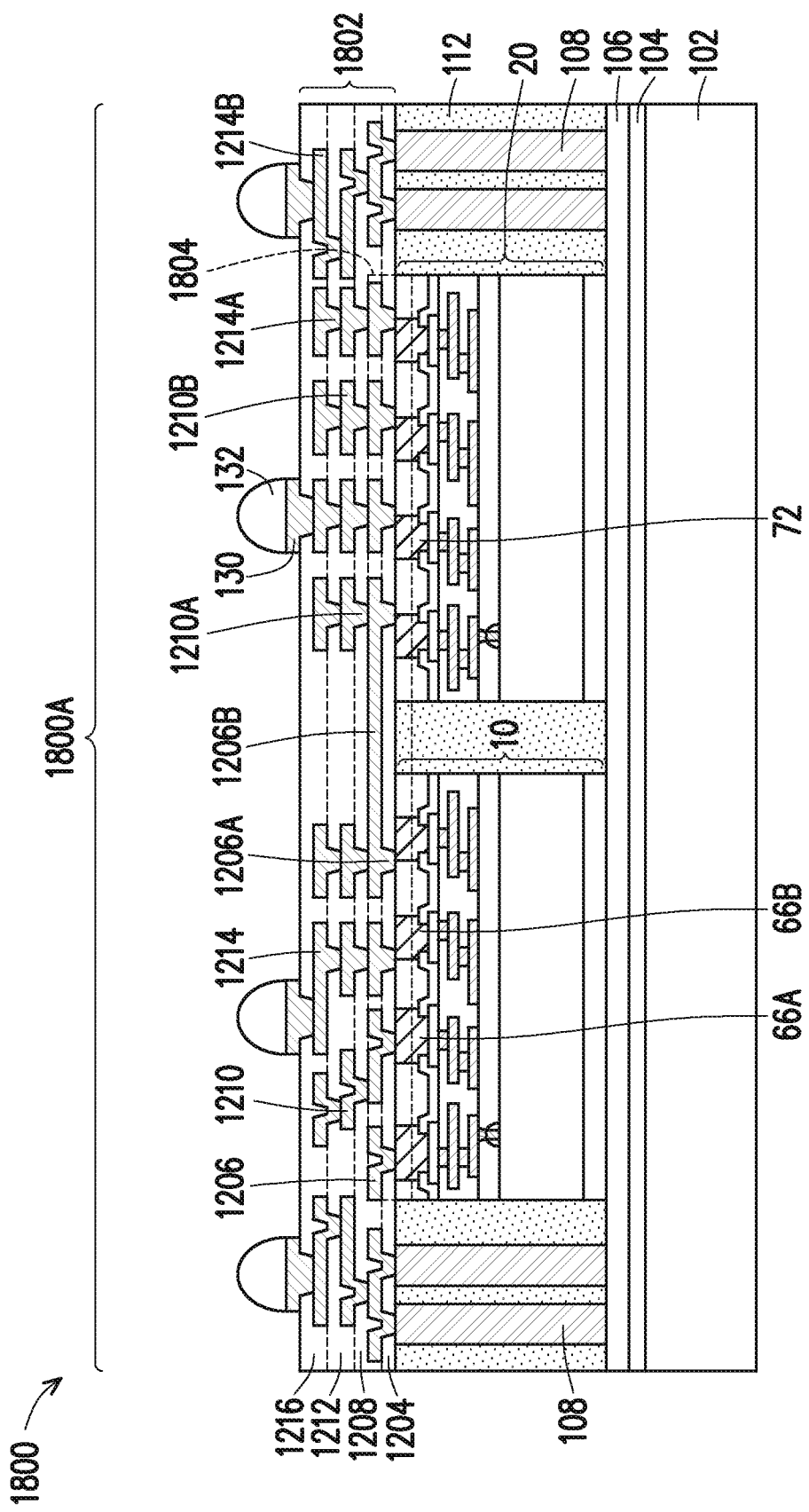
FIGS. 47-50 illustrate top and cross-sectional views of a package component in accordance with some embodiments.
Figure 48:
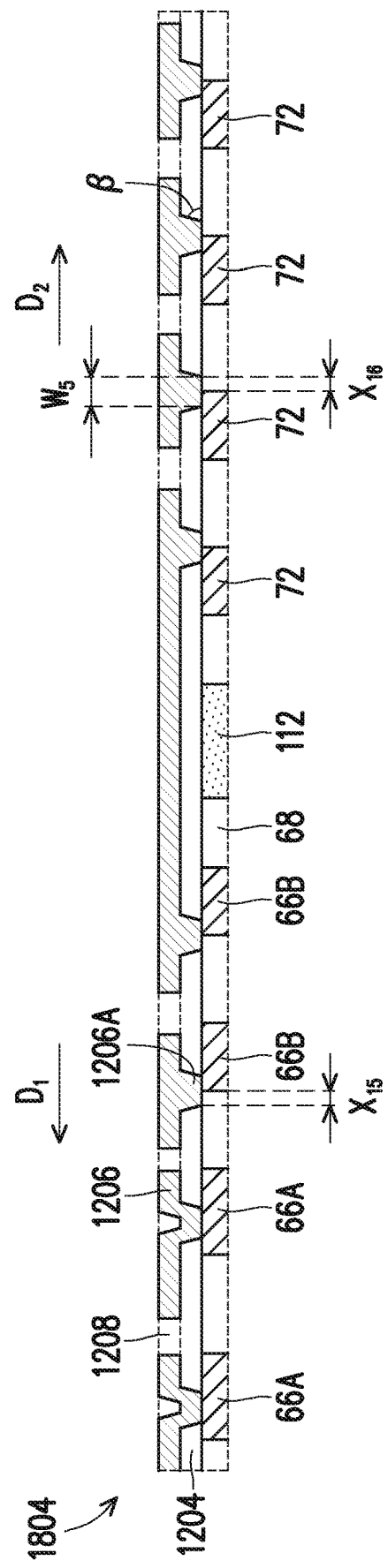
Figure 49:
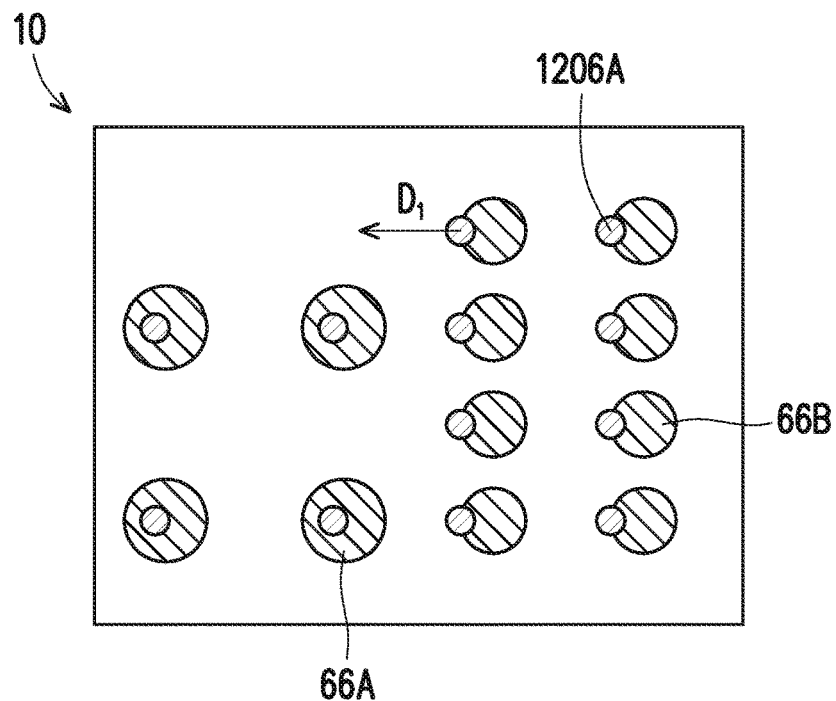
Figure 50:
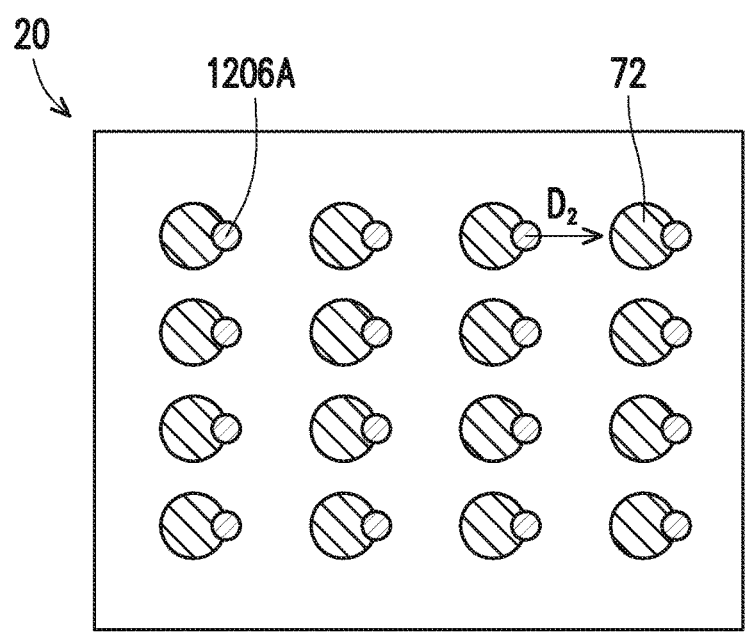

FIGS. 47-50 illustrate top and cross-sectional views of a package component 1800 in accordance with some embodiments. FIG. 47 illustrates a cross-sectional view of the package component 1800 in accordance with some embodiments. FIG. 48 illustrates a region 1804 of the package component 1800 showing an interface between the redistribution structure 1802 and the integrated circuit dies 10 and 20. FIG. 49 illustrates a planar view of the integrated circuit die 10 of the package component 1800 showing the die connectors 66A and 66B with corresponding vias 1206A of the redistribution structure 1802. FIG. 50 illustrates a planar view of the integrated circuit die 20 of the package component 1800 showing the die connectors 72 with corresponding vias 1206A of the redistribution structure 1802.

In FIG. 47, a package region 1800A of the package component 1800 is illustrated. In some embodiments, the package component 1800 comprises a plurality of package regions (such as the package region 1800A). The package component 1800 may also be referred to as a wafer-level packaged structure, such as an integrated fan-out (InFO) wafer-level packaged structure. The package component 1800 is similar to the package component 1200 illustrated in FIG. 32, with similar features being labeled by similar numerical references, and descriptions of the similar features are not repeated herein. In some embodiments, the package component 1800 may be formed using process steps similar to the process steps described above with reference to FIGS. 32-35 and the description is not repeated herein. In some embodiments, the redistribution structure 1802 includes insulating layers 1204, 1208, 1212, and 1216 and metallization patterns 1206, 1210, and 1214, and may be formed in a similar manner as the redistribution structure 1202 described above with reference to FIG. 32.

In FIGS. 47-50, the vias 1206A of the redistribution structure 1802 fully land on corresponding die connectors 66A and partially land on corresponding die connectors 66B and 72. In some embodiments, the partial landing of the vias 1206A is caused by shifts of the integrated circuit dies 10 and 20 during attaching the integrated circuit dies 10 and 20 to the insulating layer 106. In some embodiments, the partial landing of the vias 1206A is further caused due misalignment of the openings in the insulating layer 1204 during patterning the insulating layer 1204. In some embodiments, the vias 1206A are laterally shifted with respect to corresponding die connectors 66B in a direction $D_1$. The direction $D_1$ is parallel to the tops surfaces of the integrated circuit dies 10 and 20, and extends from the integrated circuit die 20 to the integrated circuit die 10. In some embodiments, the vias 1206A are laterally shifted with respect to corresponding die connectors 72 in a direction $D_2$. The direction $D_2$ is opposite to the direction $D_1$.

In some embodiments, the vias 1206A have sloped sidewalls. The sidewalls of the vias 1206A form an angle β with top surfaces of respective ones of the die connectors 66B and 72. In some embodiments, the angle β is between about 70 degrees and about 89 degrees. The vias 1206A have a width $W_5$ at top surfaces of respective ones the die connectors 66B and 72. In some embodiments, the width $W_5$ is between about 3 μm and about 15 μm. Portions of the vias 1206A extend beyond an edge of corresponding ones of the die connectors 66B, such that sidewalls of the vias 1206A are laterally spaced apart from sidewalls of the corresponding ones of the die connectors 66B by a distance $X_{15}$. In some embodiments, the distance $X_{15}$ is greater than zero and less than or equal to ⅔ of the width $W_5$. Portions of the vias 1206A extend beyond an edge of corresponding ones of the die connectors 72, such that sidewalls of the vias 1206A are laterally spaced apart from sidewalls of the corresponding ones of the die connectors 72 by a distance $X_{16}$. In some embodiments, the distance $X_{16}$ is greater than zero and less than or equal to ⅔ of the width $W_5$. In some embodiments, the distance $X_{15}$ and the distance $X_{16}$ are substantially equal. In other embodiments, the distance $X_{15}$ is different from the distance $X_{16}$.

Figure 51:
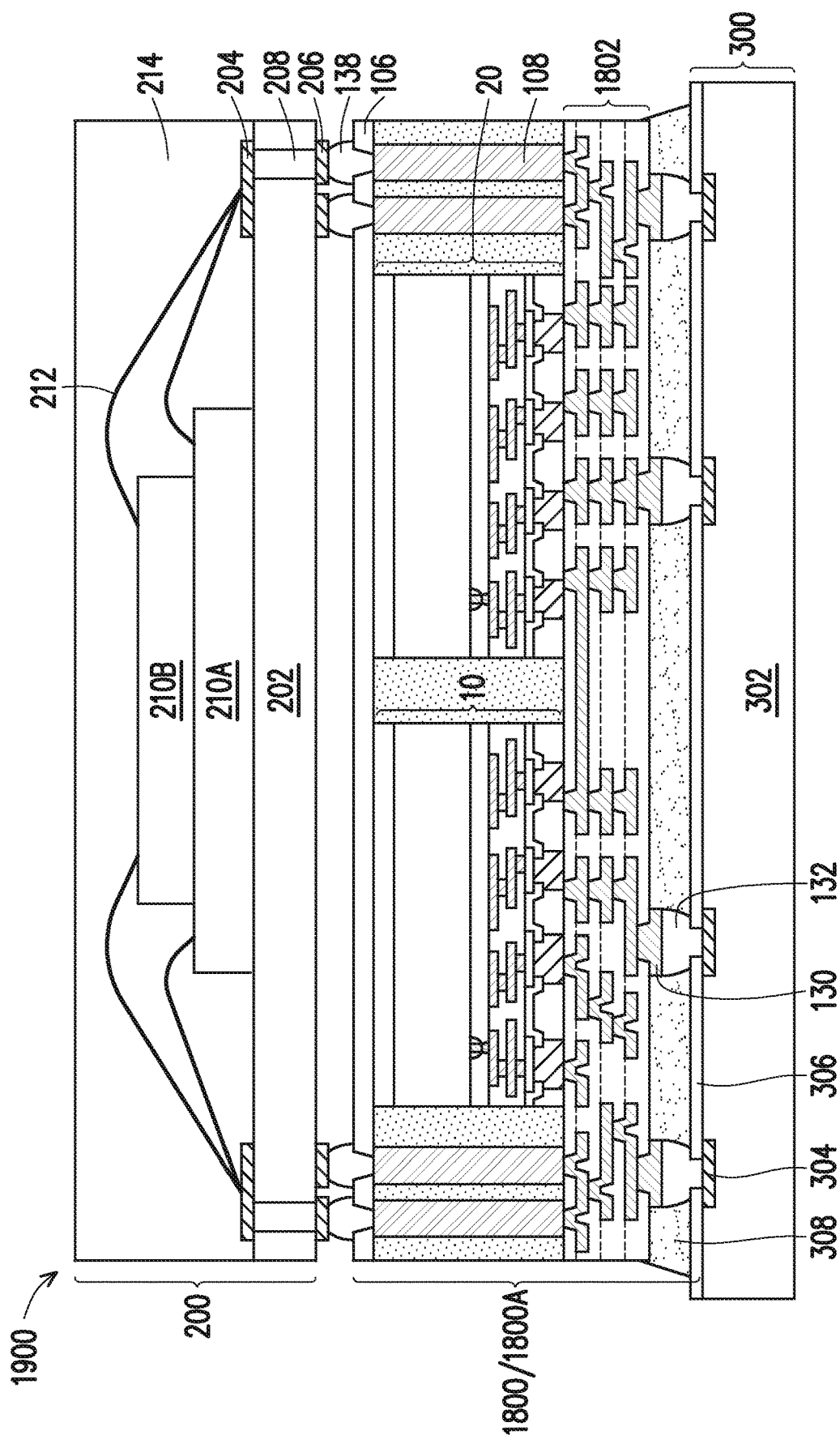
FIG. 51 illustrates a cross-sectional view of a device stack in accordance with some embodiments.

FIG. 51 illustrates a cross-sectional view of a device stack 1900 bonded to a substrate 300 in accordance with some embodiments. The device stack 1900 is similar to the device stack 1300 illustrated in FIG. 36, with similar features being labeled by similar numerical references, and descriptions of the similar features are not repeated herein. In some embodiments, the device stack 1900 may be formed by performing process steps described above with reference to FIGS. 13 and 14 on the package component 1800 illustrated in FIG. 47. In some embodiments, the device stack 1900 is bonded to the substrate 300 as described above with reference to FIG. 14.

Figure 52:
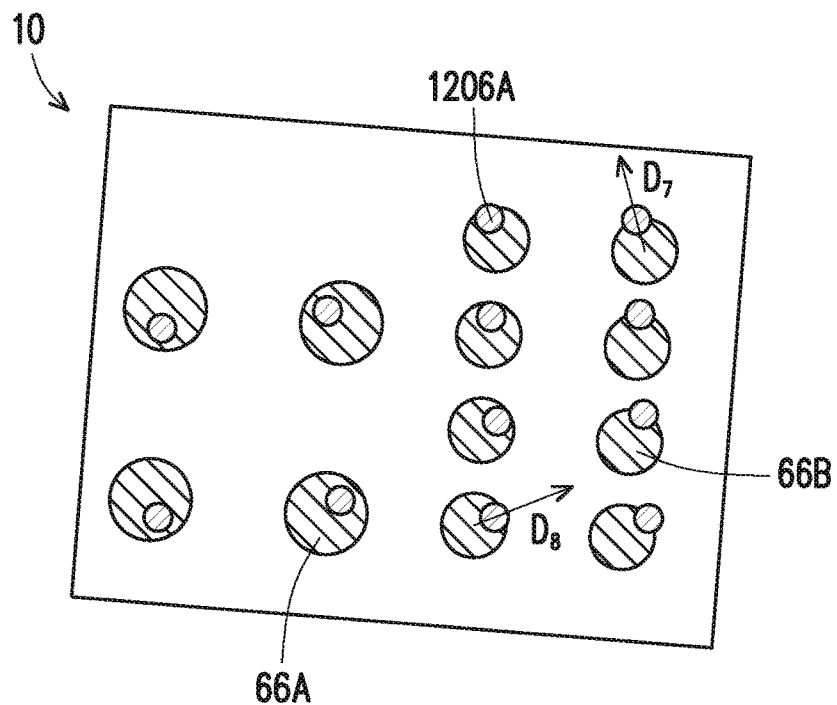
FIG. 52 illustrates a top view of an integrated circuit die in accordance with some embodiments.

In the illustrated embodiments described above with reference to FIGS. 34, 39, 44 and 49, each of the vias 1206A is shifted with respect to the corresponding die connector 66B of the integrated circuit die 10 in a same direction. In other embodiments, different ones of the vias 1206A may be shifted with respect to corresponding one of the die connectors 66B of the integrated circuit die 10 in different directions. In some embodiments, non-uniform shifts are caused by the rotation of the integrated circuit die 10 during attaching the integrated circuit die 10 the insulating layer 106 (see FIG. 6). Such an embodiment is shown in FIG. 52, which illustrates a planar view of the integrated circuit die 10 showing the die connectors 66A and 66B with corresponding vias 1206A. In the illustrated embodiment, the first via 1206A at a corner of the integrated circuit die 10 is shifted in a direction $D_7$ and the second via 1206A at an edge of the integrated circuit die 10 is shifted in a direction $D_8$, such that the direction $D_8$ is different from the direction $D_7$.

Furthermore, in the illustrated embodiments described above with reference to FIGS. 35, 40, 45 and 50, each of the vias 1206A is shifted with respect to the corresponding one of the die connectors 72 of the integrated circuit die 20 in a same direction. In other embodiments, different ones of the 1206A of the redistribution structure 1202 may be shifted with respect to corresponding ones of the die connectors 72 of the integrated circuit die 20 in different directions. In some embodiments, non-uniform shifts are caused by the rotation of the integrated circuit die 20 during attaching the integrated circuit die 20 the insulating layer 106 (see FIG. 6).

Figure 53:
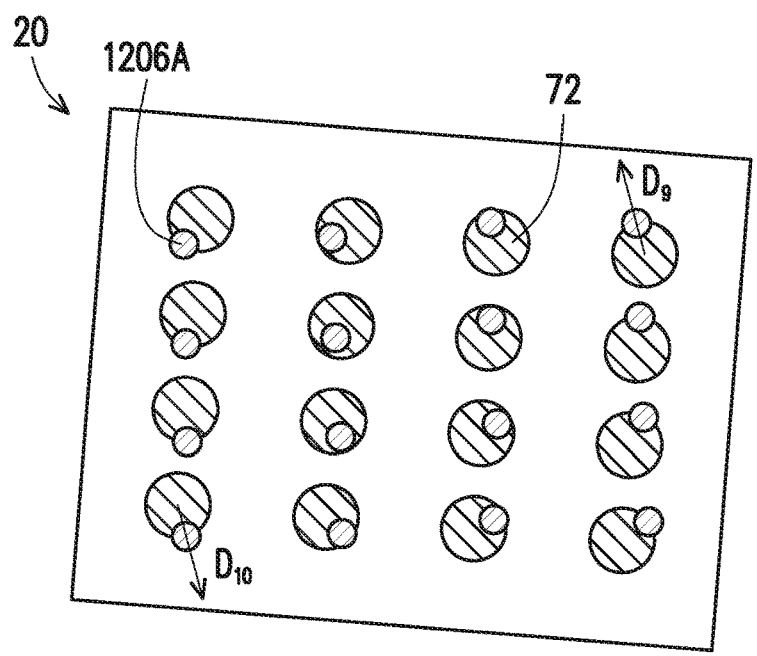
FIG. 53 illustrates a top view of an integrated circuit die in accordance with some embodiments.

Such an embodiment is shown in FIG. 53, which illustrates a planar view of the integrated circuit die 20 showing the die connectors 72 with corresponding vias 1206A. In the illustrated embodiment, the first via 1206A at a first corner of the integrated circuit die 20 is shifted in a direction $D_9$ and the second vias 1206A at a second opposite corner of the integrated circuit die 20 is shifted in a direction $D_{10}$, such that the direction $D_{10}$ is different from the direction $D_9$.

Figure 54:
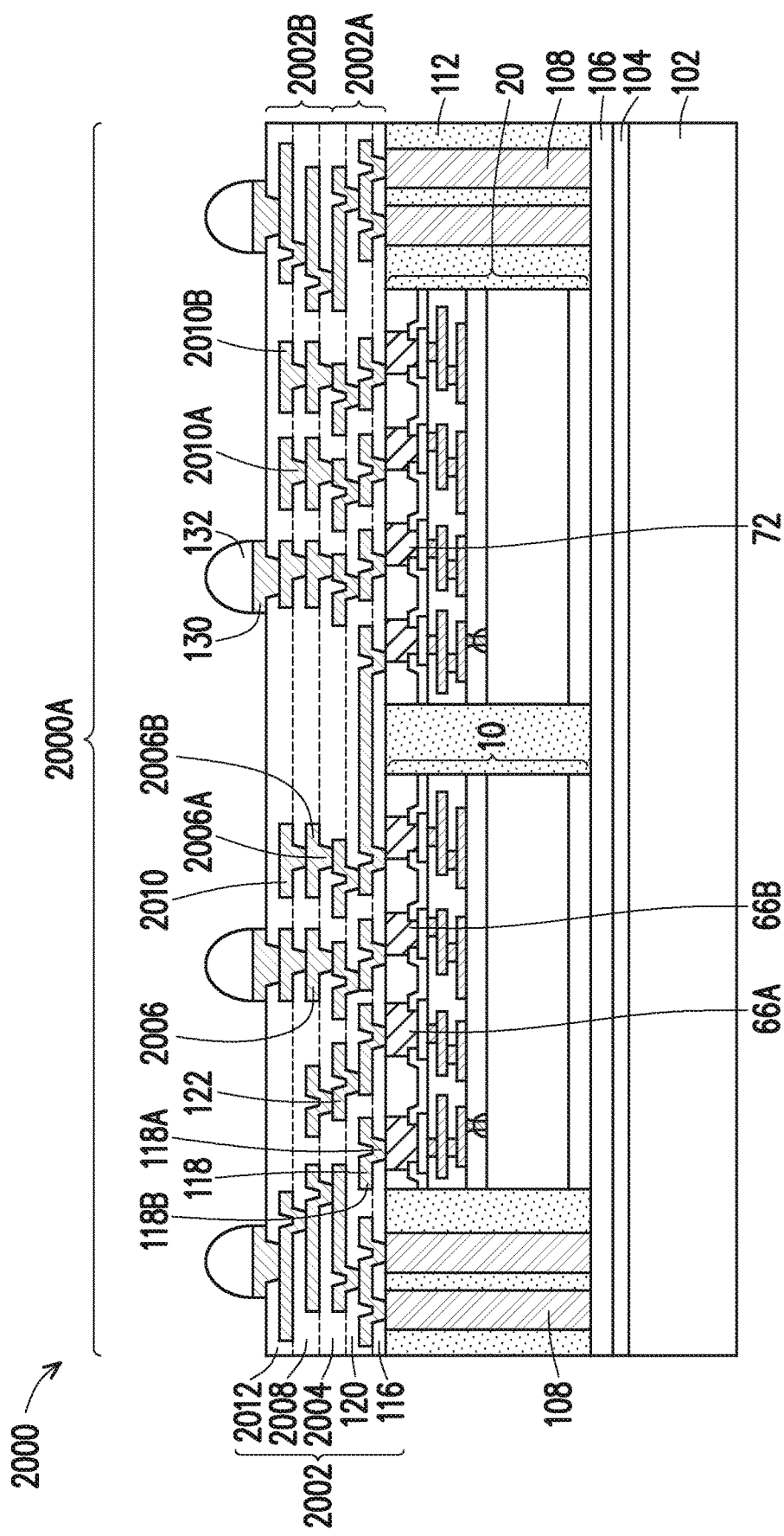
FIG. 54 illustrates a cross-sectional view of a package component in accordance with some embodiments.

FIG. 54 illustrates a cross-sectional view of a package component 2000 in accordance with some embodiments. In FIG. 54, a package region 2000A of the package component 2000 is illustrated. In some embodiments, the package component 2000 comprises a plurality of package regions (such as the package region 2000A). The package component 2000 may also be referred to as a wafer-level packaged structure, such as an integrated fan-out (InFO) wafer-level packaged structure. The package component 2000 is similar to the package component 100 illustrated in FIG. 9, with similar features being labeled by similar numerical references, and descriptions of the similar features are not repeated herein. In some embodiments, the package component 2000 may be formed using process steps similar to the process steps described above with reference to FIGS. 3-9 and the description is not repeated herein.

In some embodiments, the package component 2000 comprises a redistribution structure 2002. The redistribution structure 2002 includes a first substructure 2002A and a second substructure 2002B over the first substructure 2002A. The first substructure 2002A of the redistribution structure 2002 comprises a portion of the redistribution structure 114 including the insulating layers 116 and 120, and the metallization patterns 118 (comprising the conductive lines 118B and the conductive vias 118A) and 122 (comprising conductive lines 122B and conductive vias 122A), and may be formed using process steps described above with reference to FIG. 9. The second substructure 2002B of the redistribution structure 2002 comprises insulating layers 2004, 2008 and 2012, and the metallization patterns 2006 (comprising conductive lines 2006B and conductive vias 2006A) and 2010 (comprising conductive lines 2010B and conductive vias 2010A), and may be formed using process steps described above with reference to FIG. 32. In some embodiments, the insulating layers 2004, 2008 and 2012 may be formed using similar materials and methods as the insulating layer 116 described above with reference to FIG. 9. In some embodiments, the metallization patterns 2006 and 2010 may be formed using similar materials and methods as the metallization pattern 1206 described above with reference to FIG. 32.

Figure 55:
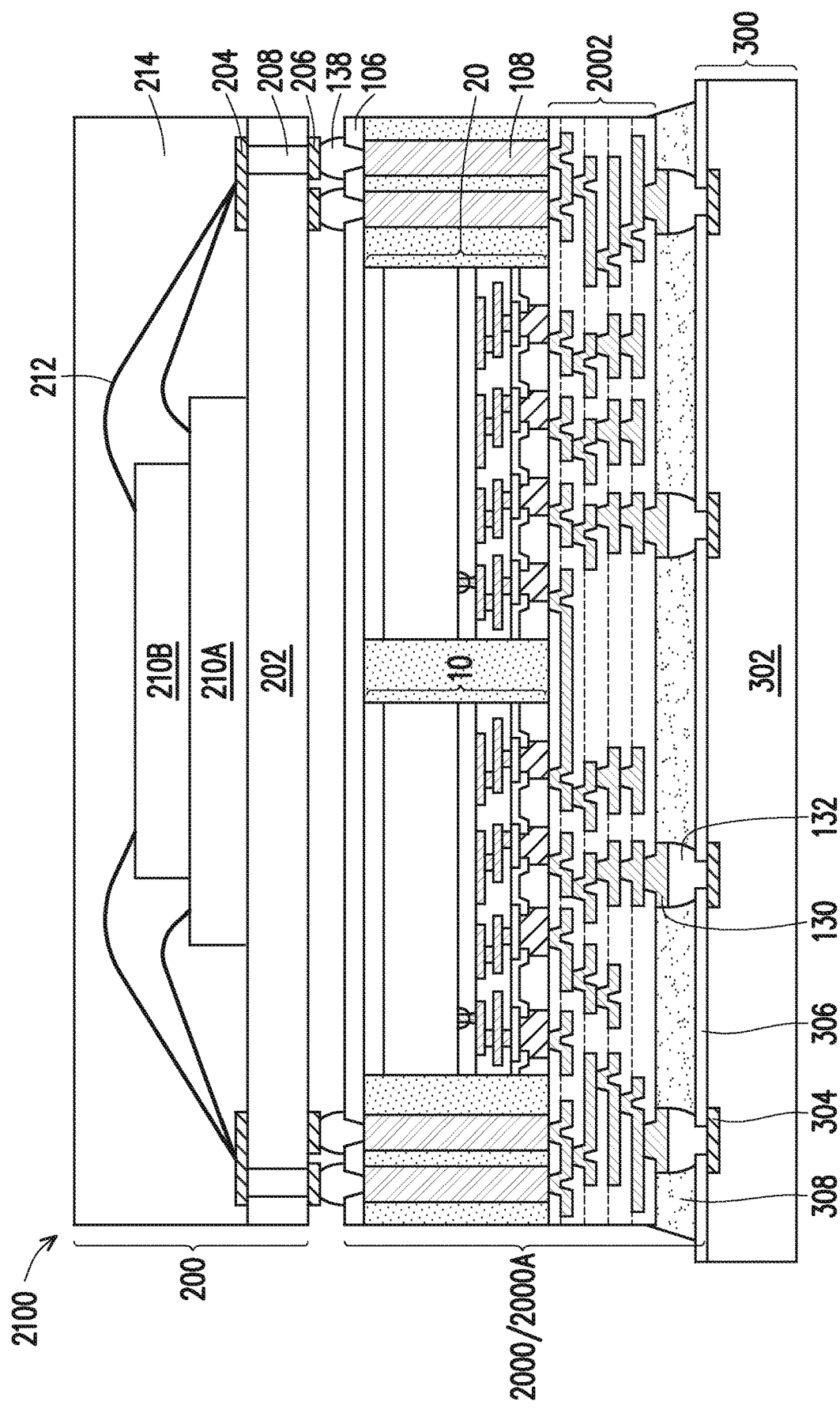
FIG. 55 illustrates a cross-sectional view of a device stack in accordance with some embodiments.

FIG. 55 illustrates a cross-sectional view of a device stack 2100 bonded to a substrate 300 in accordance with some embodiments. The device stack 2100 is similar to the device stack 400 illustrated in FIG. 14, with similar features being labeled by similar numerical references, and descriptions of the similar features are not repeated herein. In some embodiments, the device stack 2100 may be formed by performing process steps described above with reference to FIGS. 13 and 14 on the package component 2000 illustrated in FIG. 54. In some embodiments, the device stack 2100 is bonded to the substrate 300 as described above with reference to FIG. 14.

Figure 56:
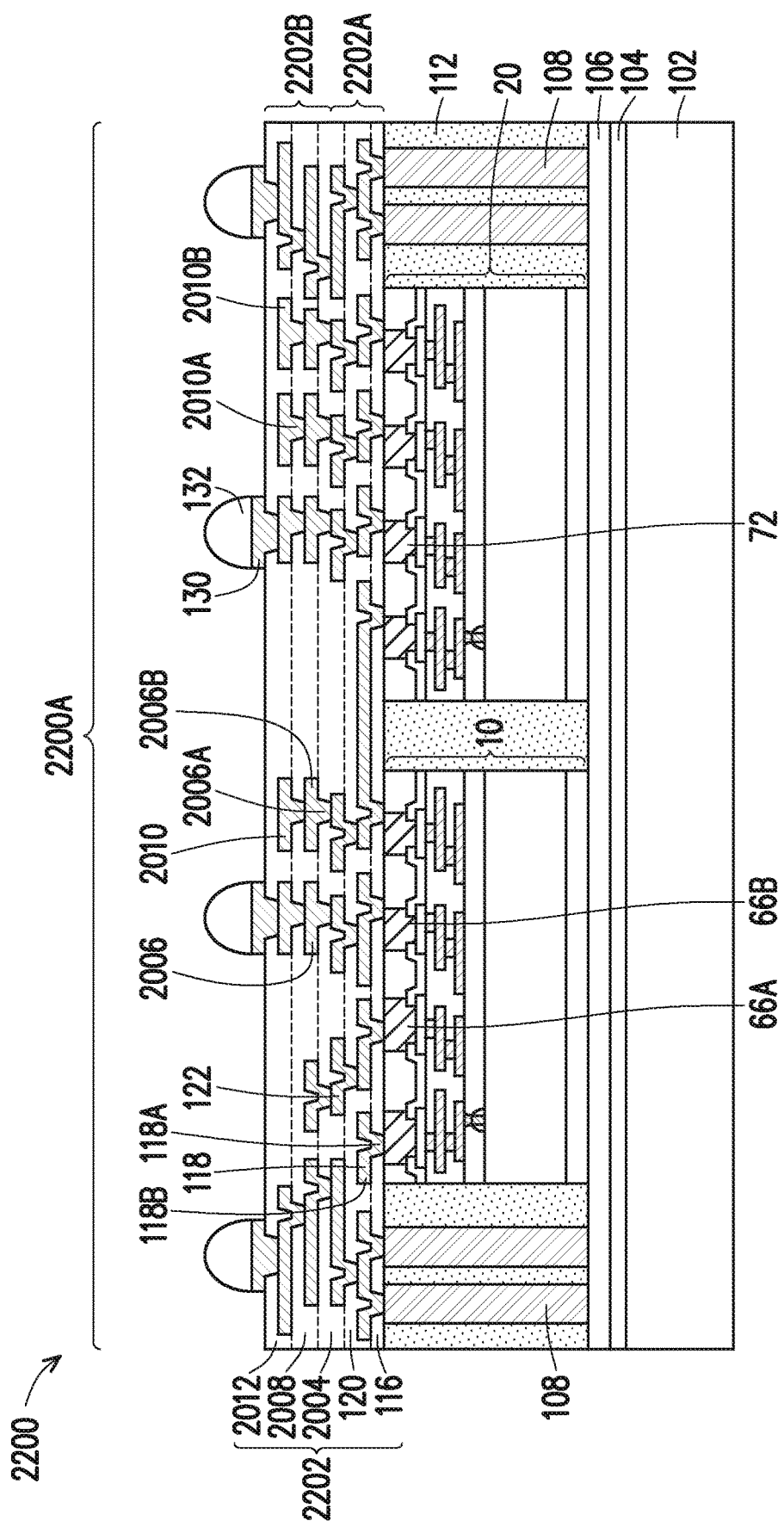
FIG. 56 illustrates a cross-sectional view of a package component in accordance with some embodiments.

FIG. 56 illustrates a cross-sectional view of a package component 2200 in accordance with some embodiments. In FIG. 56, a package region 2200A of the package component 2200 is illustrated. In some embodiments, the package component 2200 comprises a plurality of package regions (such as the package region 2200A). The package component 2200 may also be referred to as a wafer-level packaged structure, such as an integrated fan-out (InFO) wafer-level packaged structure. The package component 2200 is similar to the package component 500 illustrated in FIG. 15, with similar features being labeled by similar numerical references, and descriptions of the similar features are not repeated herein. In some embodiments, the package component 2200 may be formed using process steps similar to the process steps described above with reference to FIGS. 3-9 and the description is not repeated herein.

In some embodiments, the package component 2200 comprises the redistribution structure 2202. The redistribution structure 2202 includes a first substructure 2202A and a second substructure 2202B over the first substructure 2202A. The first substructure 2202A of the redistribution structure 2002 comprises a portion of the redistribution structure 502 (see FIG. 15) including the insulating layers 116 and 120, and the metallization patterns 118 (comprising the conductive lines 118B and the conductive vias 118A) and 122 (comprising conductive lines 122B and conductive vias 122A), and may be formed using process steps described above with reference to FIG. 15. The second substructure 2202B of the redistribution structure 2202 comprises insulating layers 2004, 2008 and 2012, and metallization patterns 2006 (comprising conductive lines 2006B and conductive vias 2006A) and 2010 (comprising conductive lines 2010B and conductive vias 2010A). In some embodiments, the insulating layers 2004, 2008 and 2012 may be formed using similar materials and methods as the insulating layer 116 described above with reference to FIG. 9. In some embodiments, the metallization patterns 2006 and 2010 may be formed using similar materials and methods as the metallization pattern 1206 described above with reference to FIG. 32.

Figure 57:
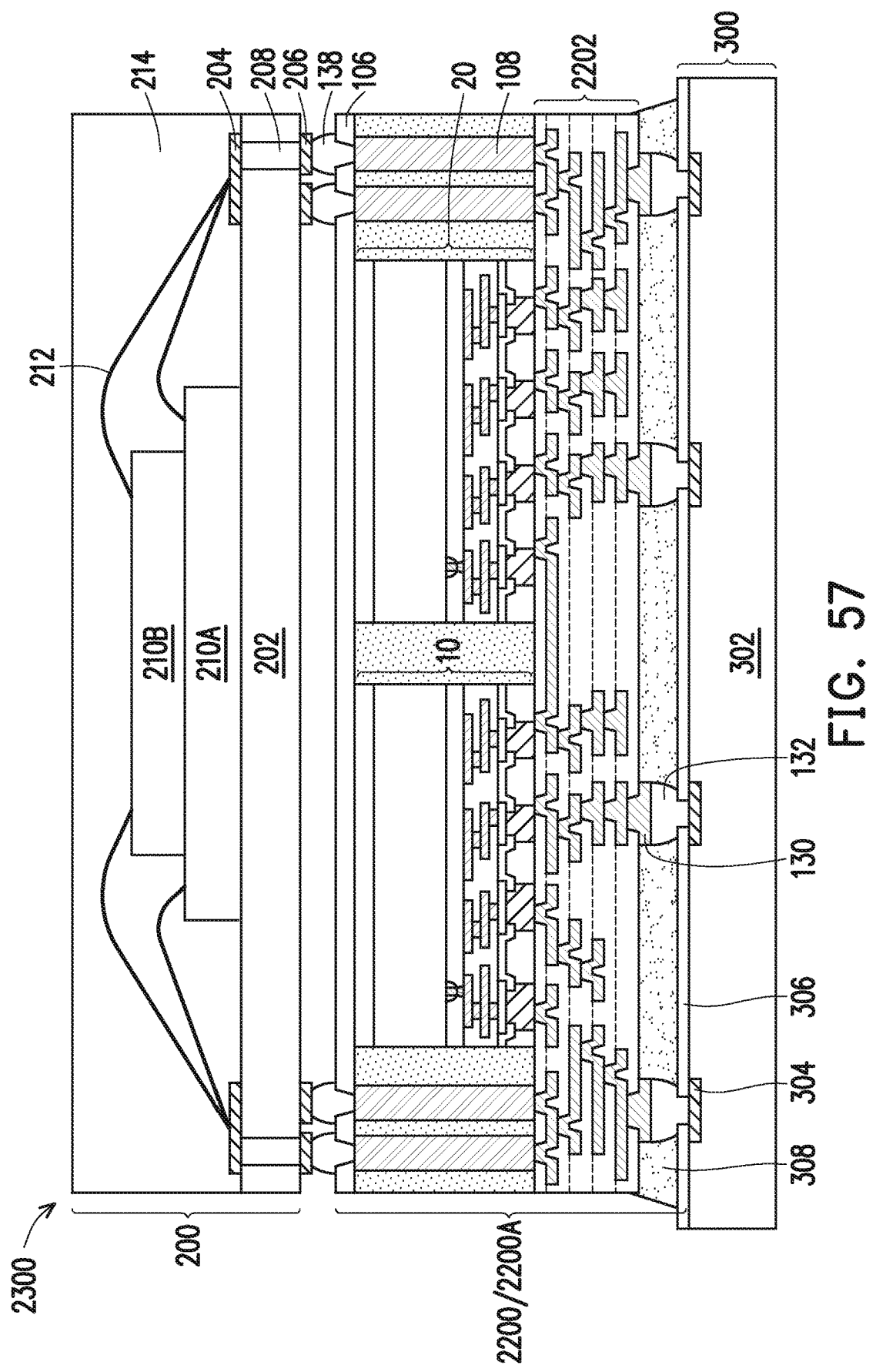
FIG. 57 illustrates a cross-sectional view of a device stack in accordance with some embodiments.

FIG. 57 illustrates a cross-sectional view of a device stack 2300 bonded to a substrate 300 in accordance with some embodiments. The device stack 2300 is similar to the device stack 600 illustrated in FIG. 19, with similar features being labeled by similar numerical references, and descriptions of the similar features are not repeated herein. In some embodiments, the device stack 2300 may be formed by performing process steps described above with reference to FIGS. 13 and 14 on the package component 2200 illustrated in FIG. 56. In some embodiments, the device stack 2300 is bonded to the substrate 300 as described above with reference to FIG. 14.

Figure 58:
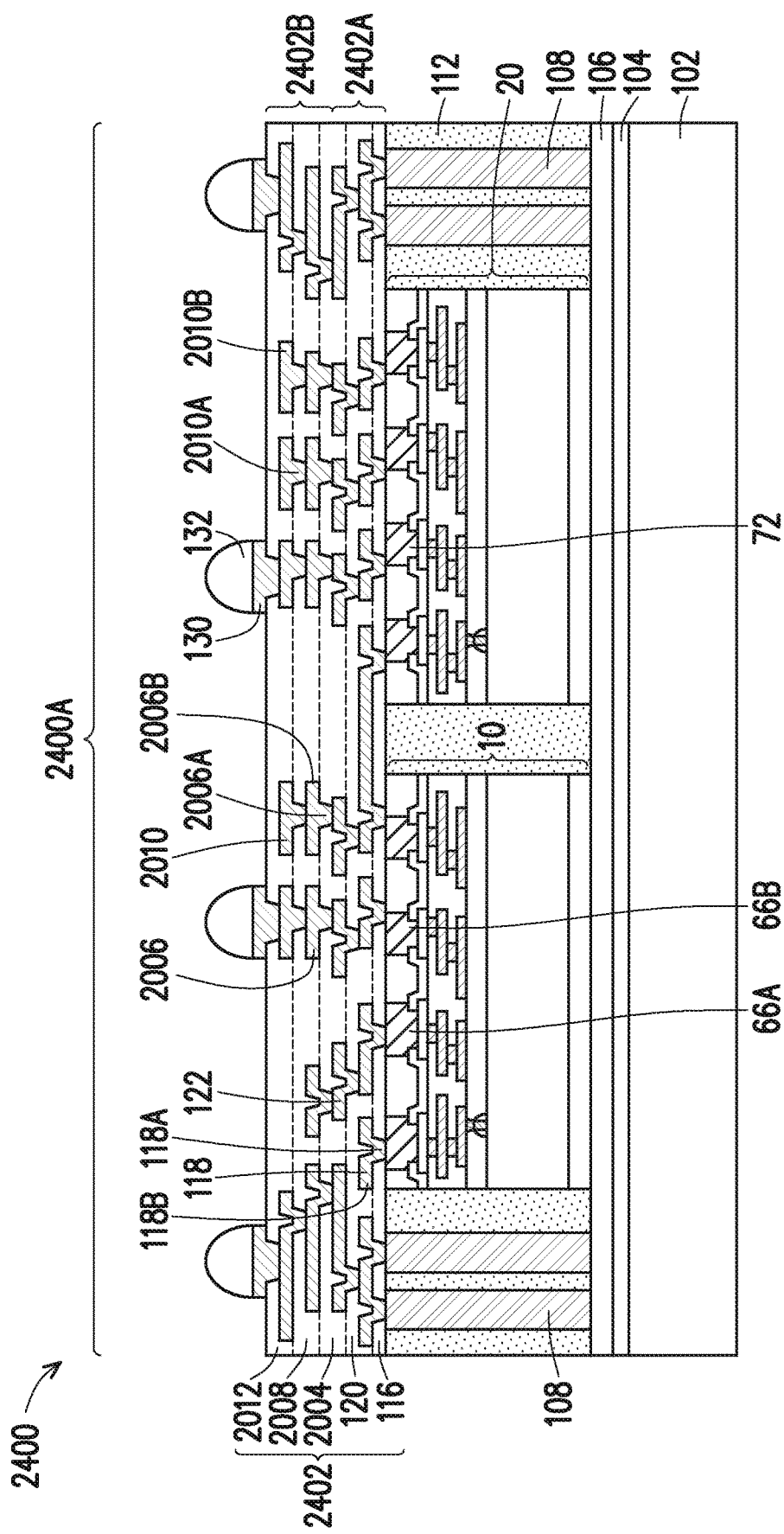
FIG. 58 illustrates a cross-sectional view of a package component in accordance with some embodiments.

FIG. 58 illustrates a cross-sectional view of a package component 2400 in accordance with some embodiments. In FIG. 58, a package region 2400A of the package component 2400 is illustrated. In some embodiments, the package component 2400 comprises a plurality of package regions (such as the package region 2400A). The package component 2400 may also be referred to as a wafer-level packaged structure, such as an integrated fan-out (InFO) wafer-level packaged structure. The package component 2400 is similar to the package component 700 illustrated in FIG. 20, with similar features being labeled by similar numerical references, and descriptions of the similar features are not repeated herein. In some embodiments, the package component 2400 may be formed using process steps similar to the process steps described above with reference to FIGS. 3-9 and the description is not repeated herein.

In some embodiments, the package component 2400 comprises the redistribution structure 2402. The redistribution structure 2402 includes a first substructure 2402A and a second substructure 2402B over the first substructure 2402A. The first substructure 2402A of the redistribution structure 2402 comprises a portion of the redistribution structure 702 (see FIG. 20) including the insulating layers 116 and 120, and the metallization patterns 118 (comprising the conductive lines 118B and the conductive vias 118A) and 122 (comprising conductive lines 122B and conductive vias 122A), and may be formed using process steps described above with reference to FIG. 20. The second substructure 2402B of the redistribution structure 2402 comprises insulating layers 2004, 2008 and 2012, and the metallization patterns 2006 (comprising conductive lines 2006B and conductive vias 2006A) and 2010 (comprising conductive lines 2010B and conductive vias 2010A). In some embodiments, the insulating layers 2004, 2008 and 2012 may be formed using similar materials and methods as the insulating layer 116 described above with reference to FIG. 9. In some embodiments, the metallization patterns 2006 and 2010 may be formed using similar materials and methods as the metallization pattern 1206 described above with reference to FIG. 32.

Figure 59:
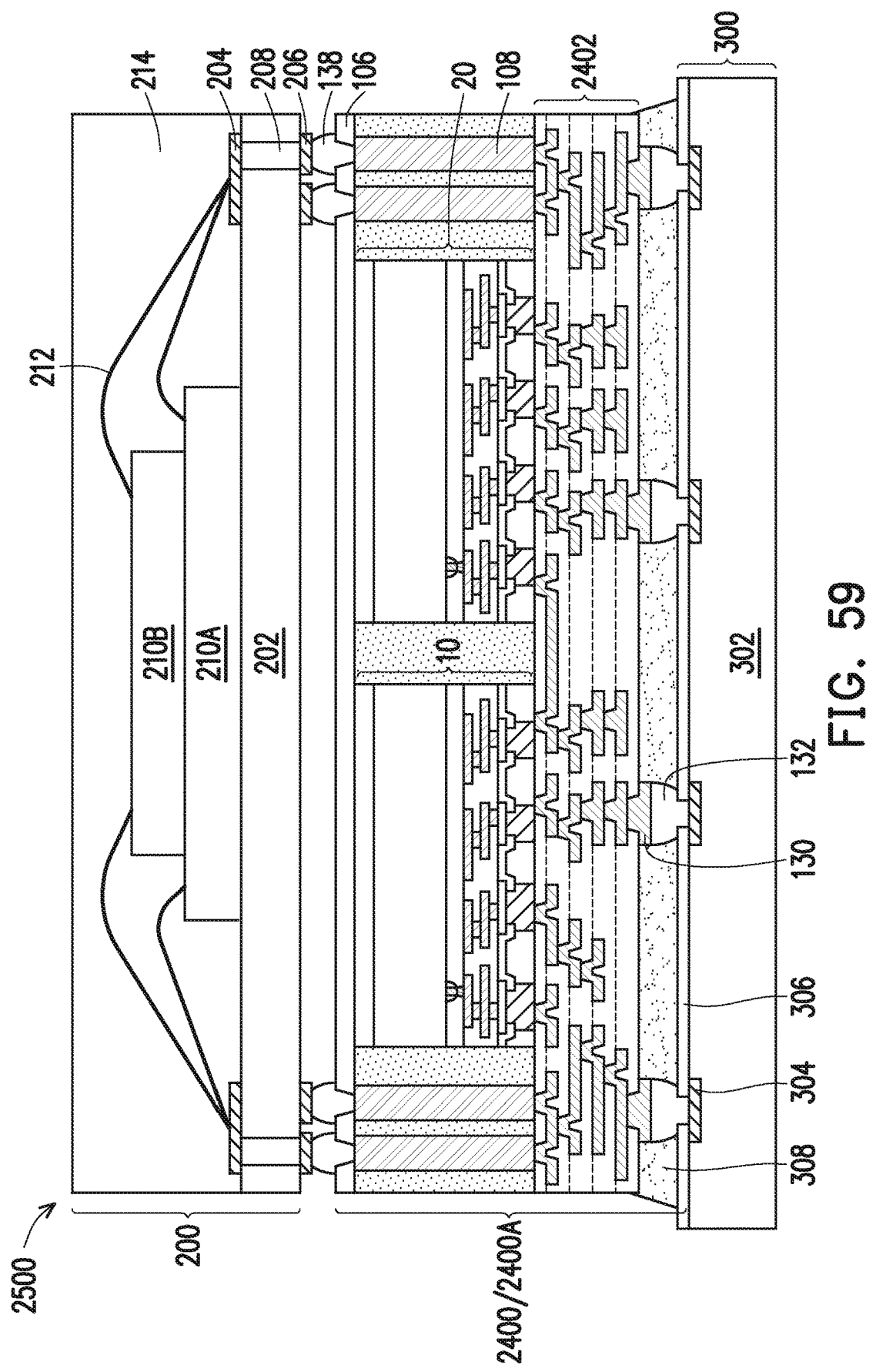
FIG. 59 illustrates a cross-sectional view of a device stack in accordance with some embodiments.

FIG. 59 illustrates a cross-sectional view of a device stack 2500 bonded to a substrate 300 in accordance with some embodiments. The device stack 2500 is similar to the device stack 800 illustrated in FIG. 24, with similar features being labeled by similar numerical references, and descriptions of the similar features are not repeated herein. In some embodiments, the device stack 2500 may be formed by performing process steps described above with reference to FIGS. 13 and 14 on the package component 2400 illustrated in FIG. 58. In some embodiments, the device stack 2500 is bonded to the substrate 300 as described above with reference to FIG. 14.

Figure 60:
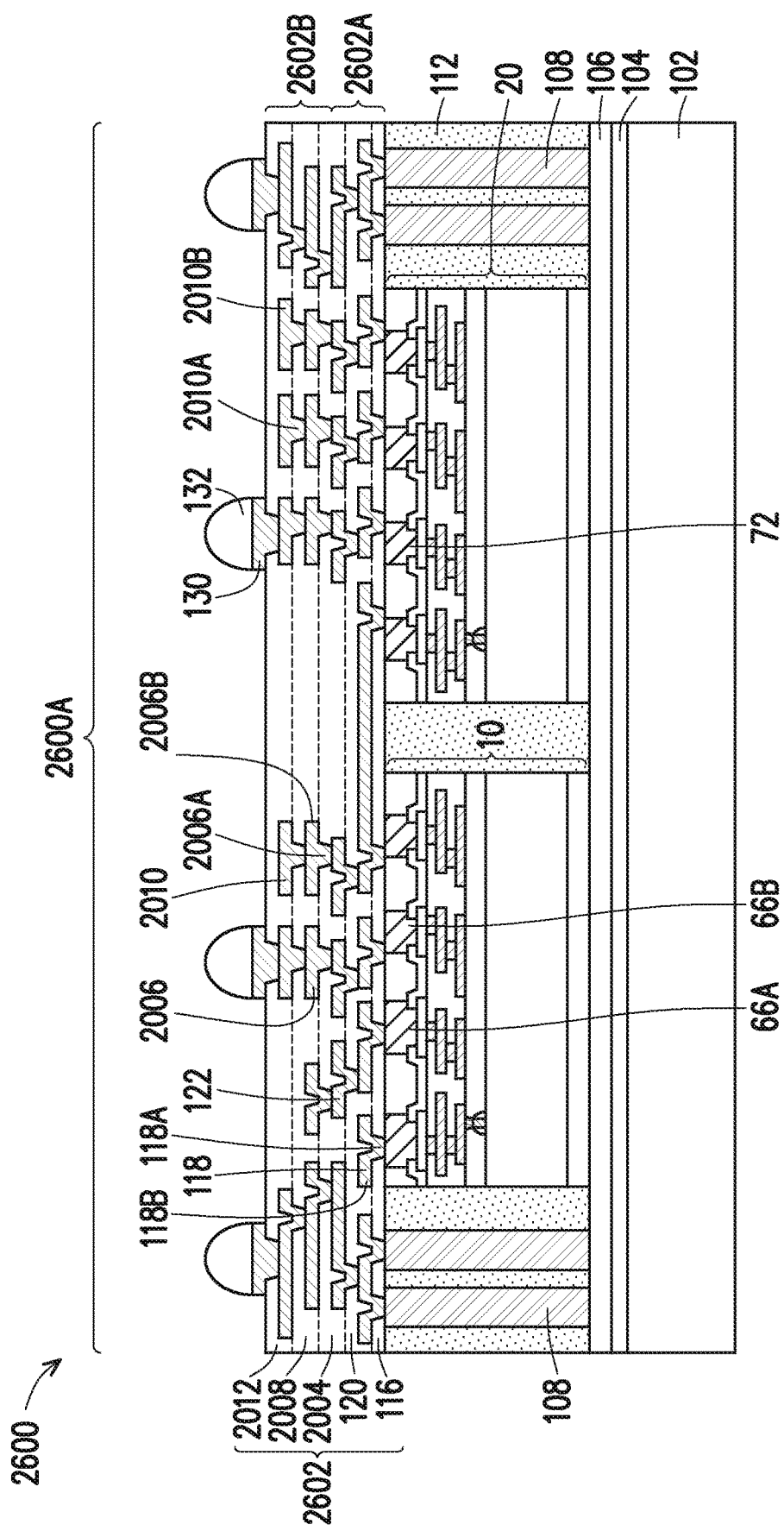
FIG. 60 illustrates a cross-sectional view of a package component in accordance with some embodiments.

FIG. 60 illustrates a cross-sectional view of a package component 2600 in accordance with some embodiments. In FIG. 60, a package region 2600A of the package component 2600 is illustrated. In some embodiments, the package component 2600 comprises a plurality of package regions (such as the package region 2600A). The package component 2600 may also be referred to as a wafer-level packaged structure, such as an integrated fan-out (InFO) wafer-level packaged structure. The package component 2600 is similar to the package component 900 illustrated in FIG. 25, with similar features being labeled by similar numerical references, and descriptions of the similar features are not repeated herein. In some embodiments, the package component 2600 may be formed using process steps similar to the process steps described above with reference to FIGS. 3-9 and the description is not repeated herein.

In some embodiments, the package component 2600 comprises the redistribution structure 2602. The redistribution structure 2602 includes a first substructure 2602A and a second substructure 2602B over the first substructure 2602A. The first substructure 2602A of the redistribution structure 2602 comprises a portion of the redistribution structure 902 including the insulating layers 116 and 120, and the metallization patterns 118 (comprising the conductive lines 118B and the conductive vias 118A) and 122 (comprising conductive lines 122B and conductive vias 122A), and may be formed using process steps described above with reference to FIG. 25. The second substructure 2602B of the redistribution structure 2602 comprises insulating layers 2004, 2008 and 2012, and the metallization patterns 2006 (comprising conductive lines 2006B and conductive vias 2006A) and 2010 (comprising conductive lines 2010B and conductive vias 2010A). In some embodiments, the insulating layers 2004, 2008 and 2012 may be formed using similar materials and methods as the insulating layer 116 described above with reference to FIG. 9 and the description is not repeated herein. In some embodiments, the metallization patterns 2006 and 2010 may be formed using similar materials and methods as the metallization pattern 1206 described above with reference to FIG. 32 and the description is not repeated herein.

Figure 61:
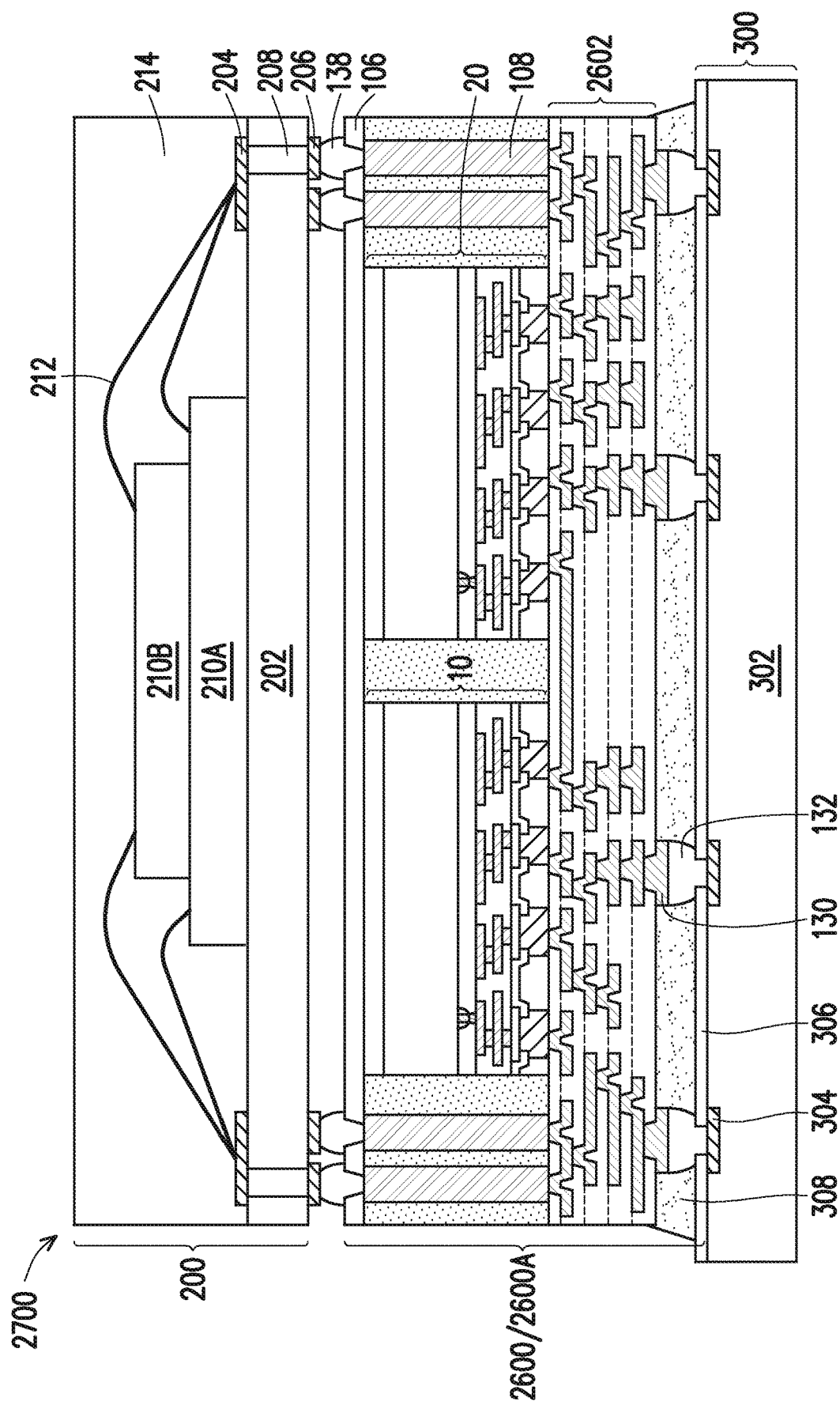
FIG. 61 illustrates a cross-sectional view of a device stack in accordance with some embodiments.

FIG. 61 illustrates a cross-sectional view of a device stack 2700 bonded to a substrate 300 in accordance with some embodiments. The device stack 2700 is similar to the device stack 1000 illustrated in FIG. 29, with similar features being labeled by similar numerical references, and descriptions of the similar features are not repeated herein. In some embodiments, the device stack 2700 may be formed by performing process steps described above with reference to FIGS. 13 and 14 on the package component 2600 illustrated in FIG. 60. In some embodiments, the device stack 2700 is bonded to the substrate 300 as described above with reference to FIG. 14.

Figure 62:
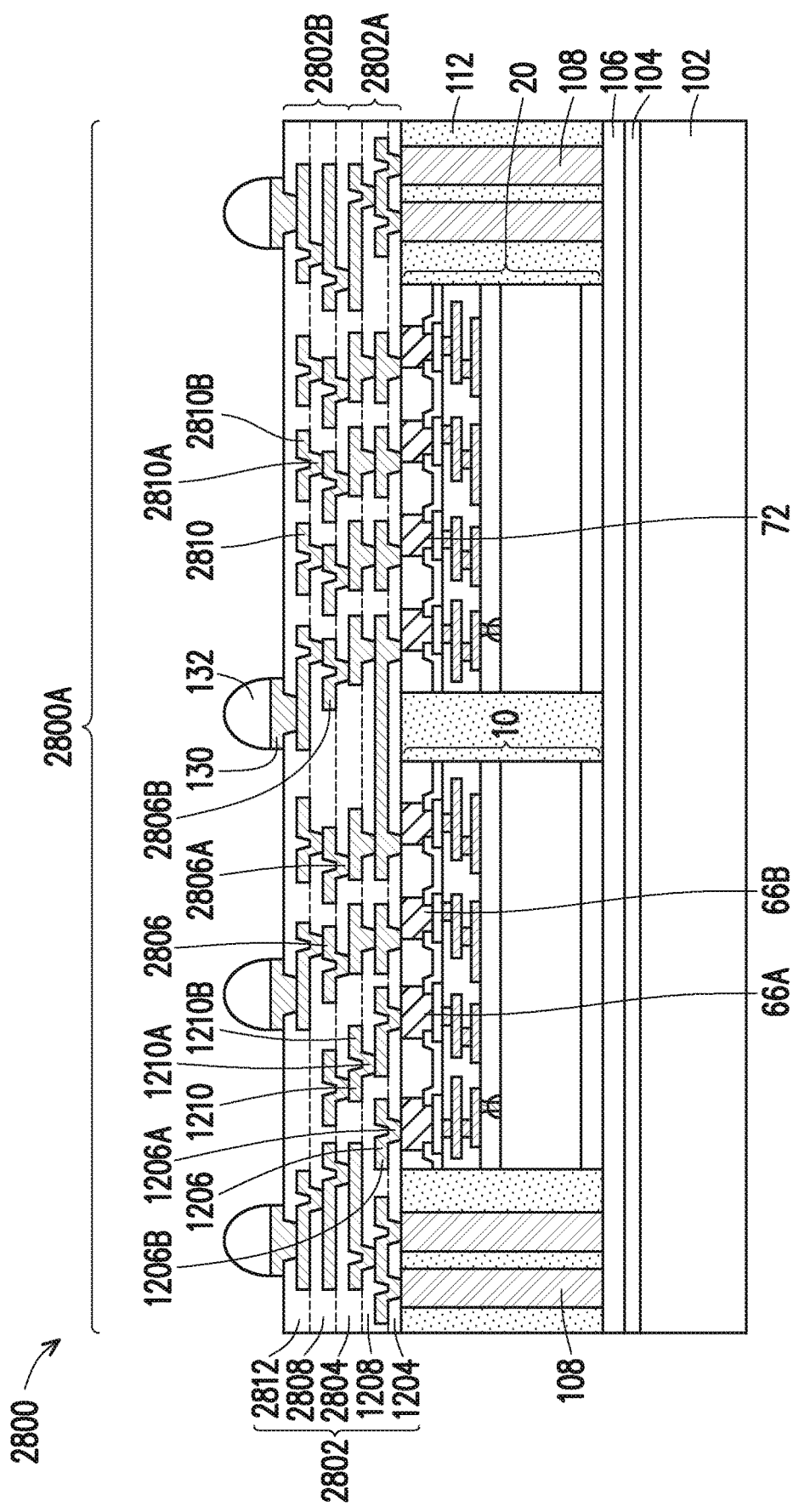
FIG. 62 illustrates a cross-sectional view of a package component in accordance with some embodiments.

FIG. 62 illustrates a cross-sectional view of a package component 2800 in accordance with some embodiments. In FIG. 62, a package region 2800A of the package component 2800 is illustrated. In some embodiments, the package component 2800 comprises a plurality of package regions (such as the package region 2800A). The package component 2800 may also be referred to as a wafer-level packaged structure, such as an integrated fan-out (InFO) wafer-level packaged structure. The package component 2800 is similar to the package component 1200 illustrated in FIG. 32, with similar features being labeled by similar numerical references, and descriptions of the similar features are not repeated herein. In some embodiments, the package component 2800 may be formed using process steps similar to the process steps described above with reference to FIG. 32 and the description is not repeated herein.

In some embodiments, the package component 2800 comprises the redistribution structure 2802. The redistribution structure 2802 includes a first substructure 2802A and a second substructure 2802B over the first substructure 2802A. The first substructure 2802A of the redistribution structure 2802 comprises a portion of the redistribution structure 1202 (see FIG. 32) including the insulating layers 1204 and 1208, and the metallization patterns 1206 (comprising the conductive lines 1206B and the conductive vias 1206A) and 1210 (comprising conductive lines 1210B and conductive vias 1210A), and may be formed using process steps described above with reference to FIG. 32. The second substructure 2802B of the redistribution structure 2802 comprises insulating layers 2804, 2808 and 2812, and metallization patterns 2806 (comprising conductive lines 2806B and conductive vias 2806A) and 2810 (comprising conductive lines 2810B and conductive vias 2810A). In some embodiments, the insulating layers 2804, 2808 and 2812 may be formed using similar materials and methods as the insulating layer 116 described above with reference to FIG. 9. In some embodiments, the metallization patterns 2806 and 2810 may be formed using similar materials and methods as the metallization pattern 118 described above with reference to FIG. 9.

Figure 63:
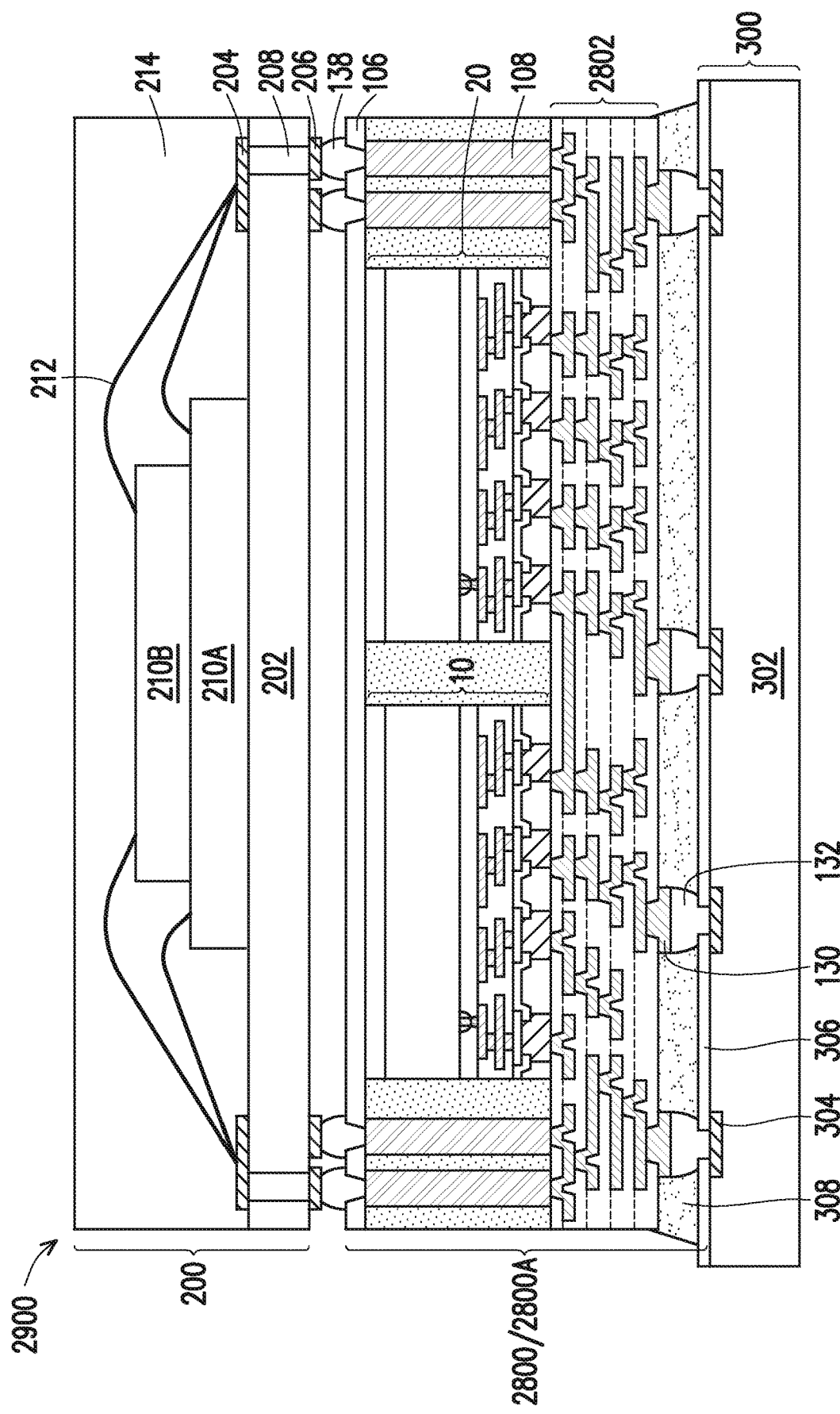
FIG. 63 illustrates a cross-sectional view of a device stack in accordance with some embodiments.

FIG. 63 illustrates a cross-sectional view of a device stack 2900 bonded to a substrate 300 in accordance with some embodiments. The device stack 2900 is similar to the device stack 1300 illustrated in FIG. 36, with similar features being labeled by similar numerical references, and descriptions of the similar features are not repeated herein. In some embodiments, the device stack 2900 may be formed by performing process steps described above with reference to FIGS. 13 and 14 on the package component 2800 illustrated in FIG.

62. In some embodiments, the device stack 2900 is bonded to the substrate 300 as described above with reference to FIG. 14.

Figure 64:
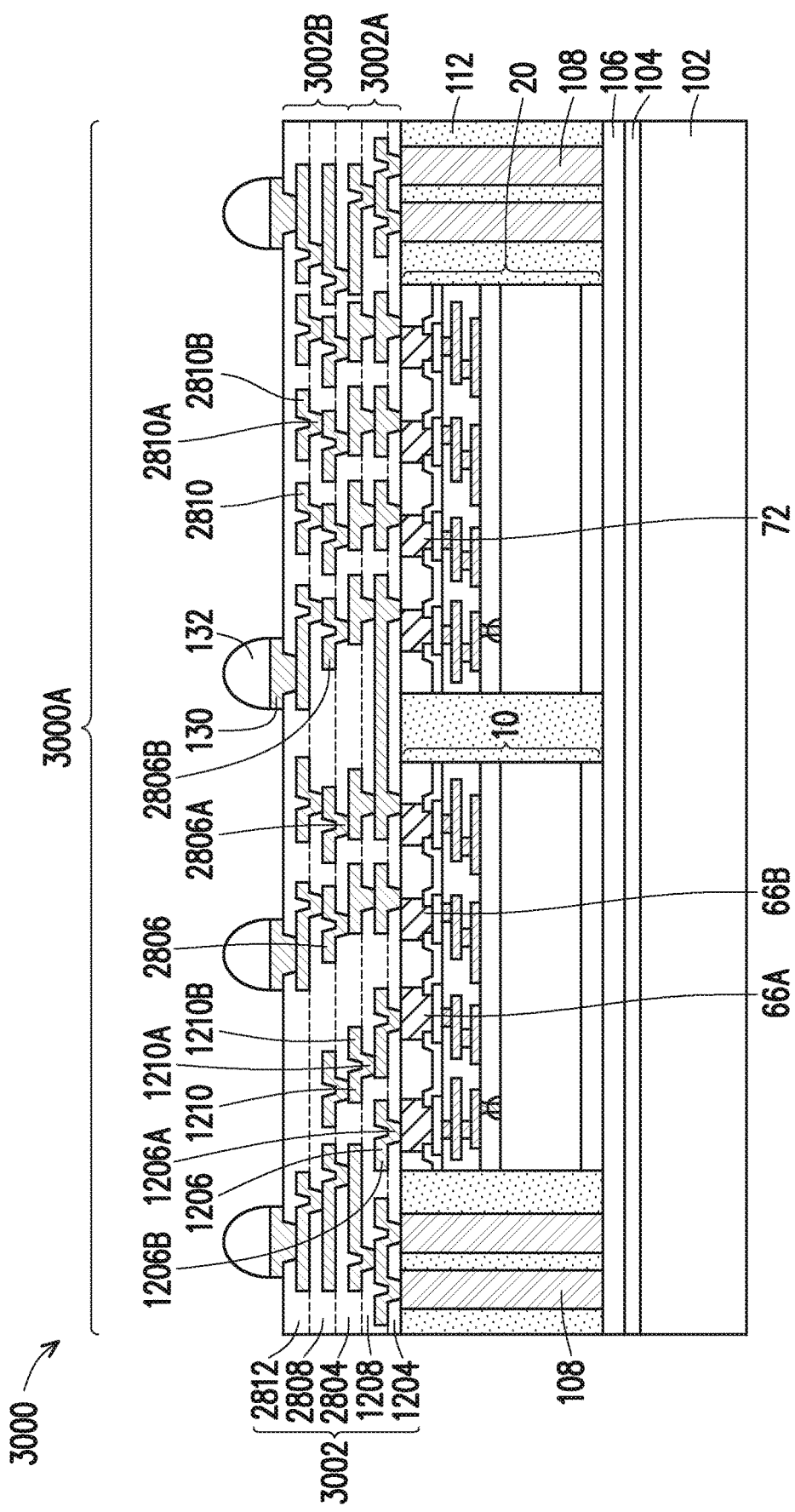
FIG. 64 illustrates a cross-sectional view of a package component in accordance with some embodiments.

FIG. 64 illustrates a cross-sectional view of a package component 3000 in accordance with some embodiments. In FIG. 64, a package region 3000A of the package component 3000 is illustrated. In some embodiments, the package component 3000 comprises a plurality of package regions (such as the package region 3000A). The package component 3000 may also be referred to as a wafer-level packaged structure, such as an integrated fan-out (InFO) wafer-level packaged structure. The package component 3000 is similar to the package component 1400 illustrated in FIG. 37, with similar features being labeled by similar numerical references, and descriptions of the similar features are not repeated herein. In some embodiments, the package component 3000 may be formed using process steps similar to the process steps described above with reference to FIG. 37 and the description is not repeated herein.

In some embodiments, the package component 3000 comprises the redistribution structure 3002. The redistribution structure 3002 includes a first substructure 3002A and a second substructure 3002B over the first substructure 3002A. The first substructure 3002A of the redistribution structure 3002 comprises a portion of the redistribution structure 1402 (see FIG. 37) including the insulating layers 1204 and 1208, and the metallization patterns 1206 (comprising the conductive lines 1206B and the conductive vias 1206A) and 1210 (comprising conductive lines 1210B and conductive vias 1210A), and may be formed using process steps described above with reference to FIG. 37. The second substructure 3002B of the redistribution structure 3002 comprises insulating layers 2804, 2808 and 2812, and metallization patterns 2806 (comprising conductive lines 2806B and conductive vias 2806A) and 2810 (comprising conductive lines 2810B and conductive vias 2810A). In some embodiments, the insulating layers 2804, 2808 and 2812 may be formed using similar materials and methods as the insulating layer 116 described above with reference to FIG. 9. In some embodiments, the metallization patterns 2806 and 2810 may be formed using similar materials and methods as the metallization pattern 118 described above with reference to FIG. 9.

Figure 65:
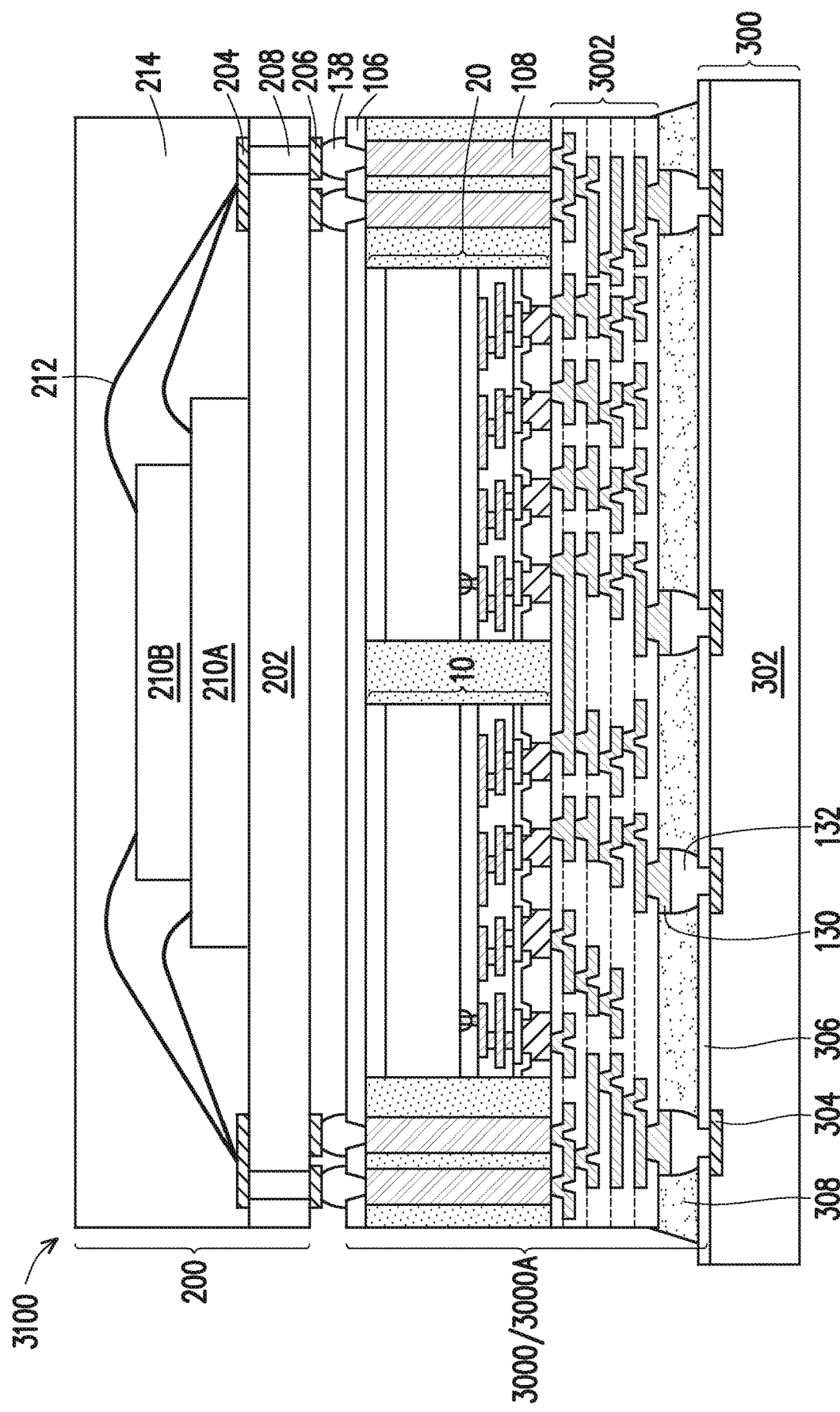
FIG. 65 illustrates a cross-sectional view of a device stack in accordance with some embodiments.

FIG. 65 illustrates a cross-sectional view of a device stack 3100 bonded to a substrate 300 in accordance with some embodiments. The device stack 3100 is similar to the device stack 1500 illustrated in FIG. 41, with similar features being labeled by similar numerical references, and descriptions of the similar features are not repeated herein. In some embodiments, the device stack 3100 may be formed by performing process steps described above with reference to FIGS. 13 and 14 on the package component 3000 illustrated in FIG. 64. In some embodiments, the device stack 3100 is bonded to the substrate 300 as described above with reference to FIG. 14.

Figure 66:
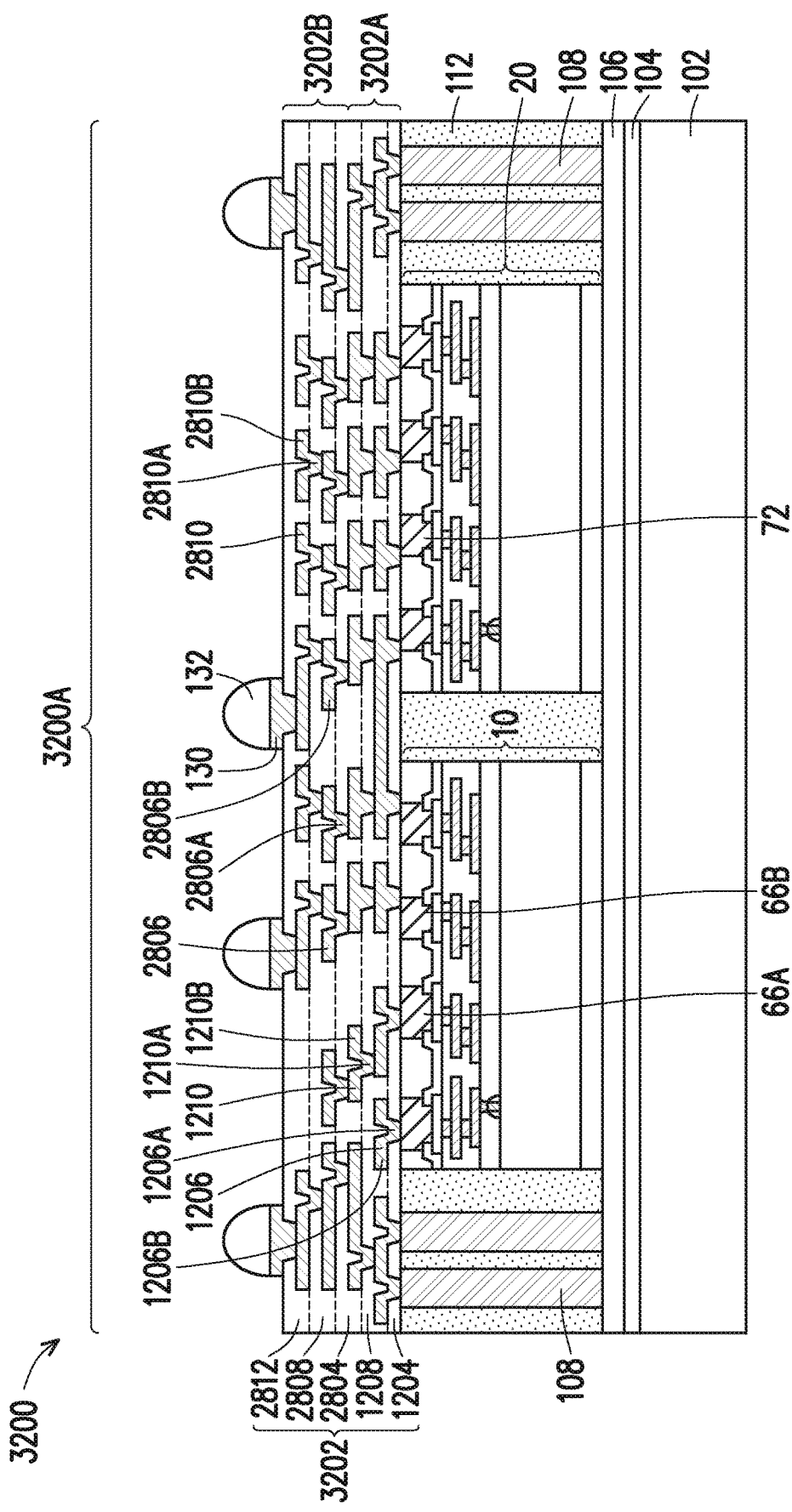
FIG. 66 illustrates a cross-sectional view of a package component in accordance with some embodiments.

FIG. 66 illustrates a cross-sectional view of a package component 3200 in accordance with some embodiments. In FIG. 66, a package region 3200A of the package component 3200 is illustrated. In some embodiments, the package component 3200 comprises a plurality of package regions (such as the package region 3200A). The package component 3200 may also be referred to as a wafer-level packaged structure, such as an integrated fan-out (InFO) wafer-level packaged structure. The package component 3200 is similar to the package component 1600 illustrated in FIG. 42, with similar features being labeled by similar numerical references, and descriptions of the similar features are not repeated herein. In some embodiments, the package component 3200 may be formed using process steps similar to the process steps described above with reference to FIG. 42 and the description is not repeated herein.

In some embodiments, the package component 3200 comprises the redistribution structure 3202. The redistribution structure 3202 includes a first substructure 3202A and a second substructure 3202B over the first substructure 3202A. The first substructure 3202A of the redistribution structure 3202 comprises a portion of the redistribution structure 1602 (see FIG. 42) including the insulating layers 1204 and 1208, and the metallization patterns 1206 (comprising the conductive lines 1206B and the conductive vias 1206A) and 1210 (comprising conductive lines 1210B and conductive vias 1210A), and may be formed using process steps described above with reference to FIG. 42. The second substructure 3202B of the redistribution structure 3202 comprises insulating layers 2804, 2808 and 2812, and metallization patterns 2806 (comprising conductive lines 2806B and conductive vias 2806A) and 2810 (comprising conductive lines 2810B and conductive vias 2810A). In some embodiments, the insulating layers 2804, 2808 and 2812 may be formed using similar materials and methods as the insulating layer 116 described above with reference to FIG. 9. In some embodiments, the metallization patterns 2806 and 2810 may be formed using similar materials and methods as the metallization pattern 118 described above with reference to FIG. 9.

Figure 67:
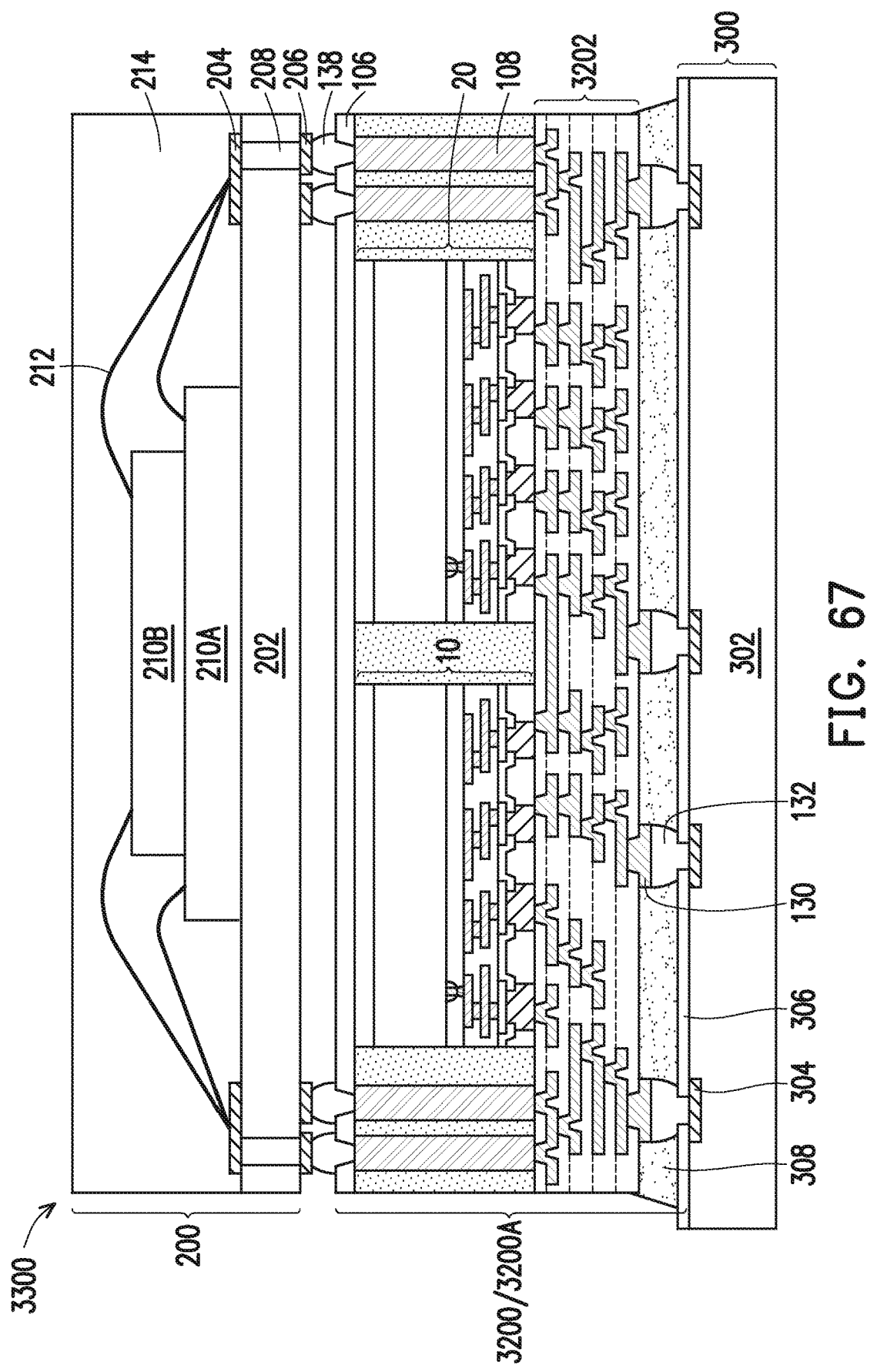
FIG. 67 illustrates a cross-sectional view of a device stack in accordance with some embodiments.

FIG. 67 illustrates a cross-sectional view of a device stack 3300 bonded to a substrate 300 in accordance with some embodiments. The device stack 3300 is similar to the device stack 1700 illustrated in FIG. 46, with similar features being labeled by similar numerical references, and descriptions of the similar features are not repeated herein. In some embodiments, the device stack 3300 may be formed by performing process steps described above with reference to FIGS. 13 and 14 on the package component 3200 illustrated in FIG. 66. In some embodiments, the device stack 3300 is bonded to the substrate 300 as described above with reference to FIG. 14.

Figure 68:
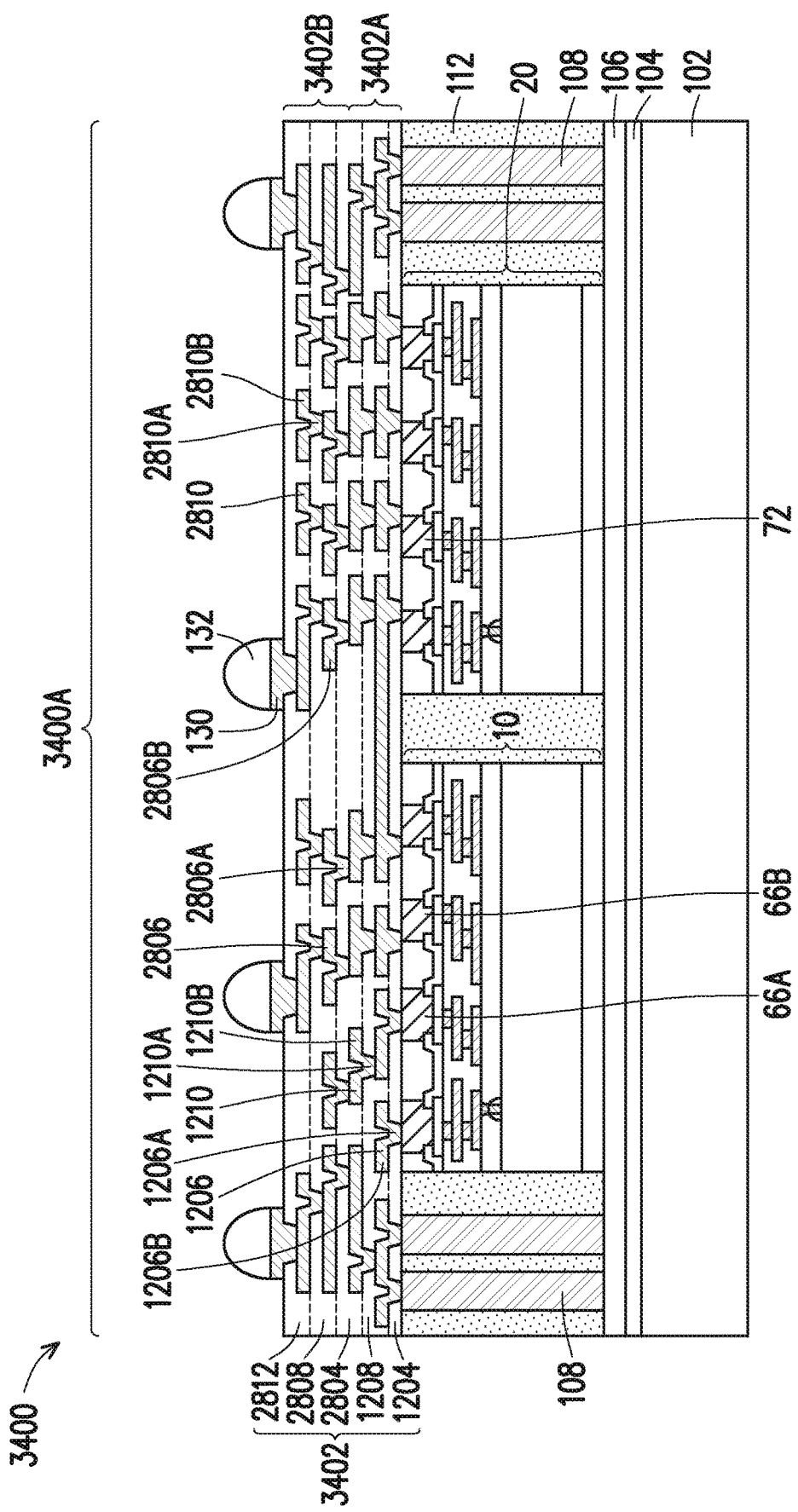
FIG. 68 illustrates a cross-sectional view of a package component in accordance with some embodiments.

FIG. 68 illustrates a cross-sectional view of a package component 3400 in accordance with some embodiments. In FIG. 68, a package region 3400A of the package component 3400 is illustrated. In some embodiments, the package component 3400 comprises a plurality of package regions (such as the package region 3400A). The package component 3400 may also be referred to as a wafer-level packaged structure, such as an integrated fan-out (InFO) wafer-level packaged structure. The package component 3400 is similar to the package component 1800 illustrated in FIG. 47, with similar features being labeled by similar numerical references, and descriptions of the similar features are not repeated herein. In some embodiments, the package component 3400 may be formed using process steps similar to the process steps described above with reference to FIG. 47 and the description is not repeated herein.

In some embodiments, the package component 3400 comprises the redistribution structure 3402. The redistribution structure 3402 includes a first substructure 3402A and a second substructure 3402B over the first substructure 3402A. The first substructure 3402A of the redistribution structure 3202 comprises a portion of the redistribution structure 1802 (see FIG. 47) including the insulating layers 1204 and 1208, and the metallization patterns 1206 (comprising the conductive lines 1206B and the conductive vias 1206A) and 1210 (comprising conductive lines 1210B and conductive vias 1210A), and may be formed using process steps described above with reference to FIG. 47. The second substructure 3402B of the redistribution structure 3402 comprises insulating layers 2804, 2808 and 2812, and the metallization patterns 2806 (comprising conductive lines 2806B and conductive vias 2806A) and 2810 (comprising conductive lines 2810B and conductive vias 2810A). In some embodiments, the insulating layers 2804, 2808 and 2812 may be formed using similar materials and methods as the insulating layer 116 described above with reference to FIG. 9. In some embodiments, the metallization patterns 2806 and 2810 may be formed using similar materials and methods as the metallization pattern 118 described above with reference to FIG. 9.

Figure 69:
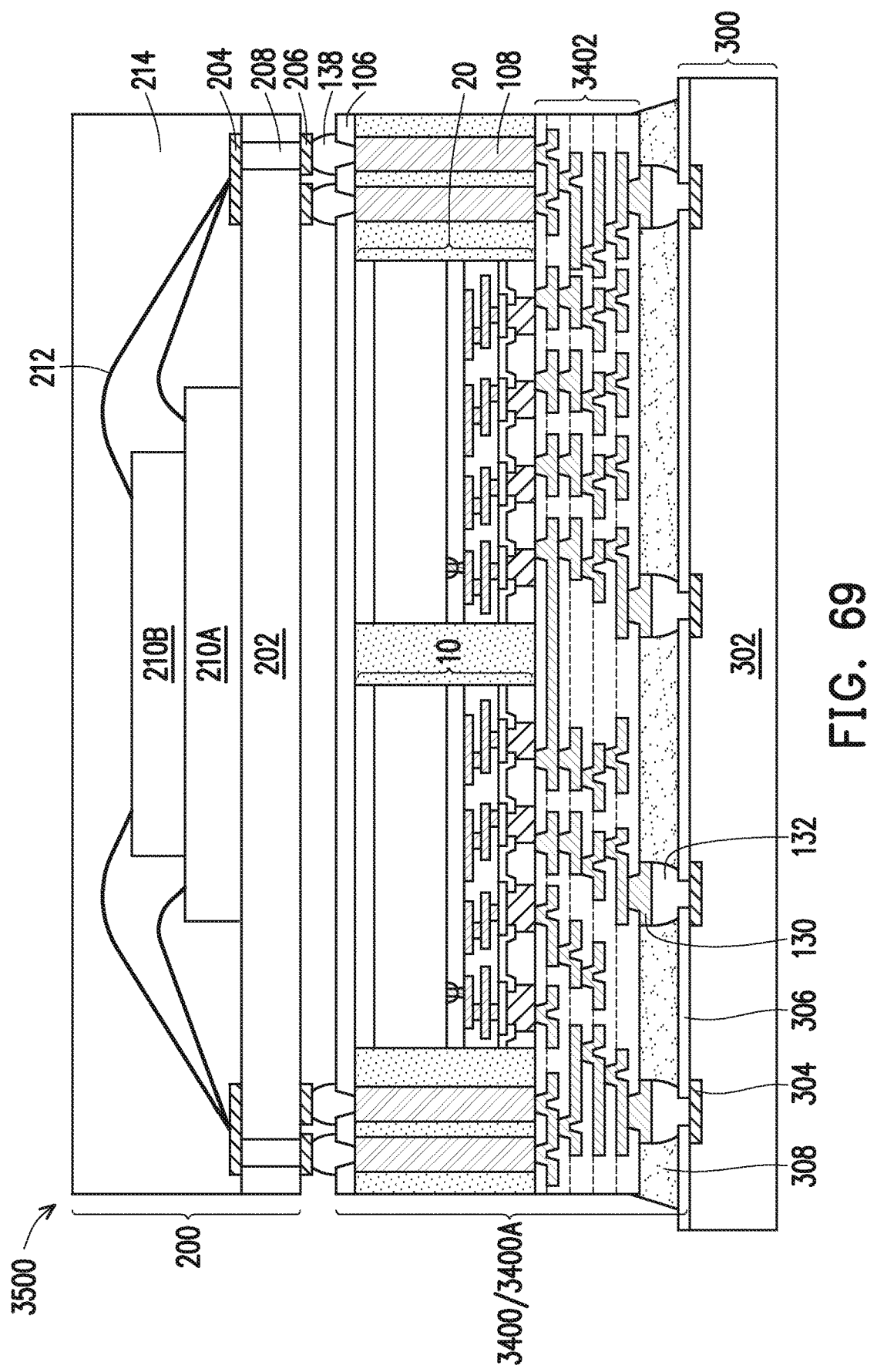
FIG. 69 illustrates a cross-sectional view of a device stack in accordance with some embodiments.

FIG. 69 illustrates a cross-sectional view of a device stack 3500 bonded to a substrate 300 in accordance with some embodiments. The device stack 3500 is similar to the device stack 1900 illustrated in FIG. 51, with similar features being labeled by similar numerical references, and descriptions of the similar features are not repeated herein. In some embodiments, the device stack 3500 may be formed by performing process steps described above with reference to FIGS. 13 and 14 on the package component 3400 illustrated in FIG. 68. In some embodiments, the device stack 3500 is bonded to the substrate 300 as described above with reference to FIG. 14.

Figure 70:
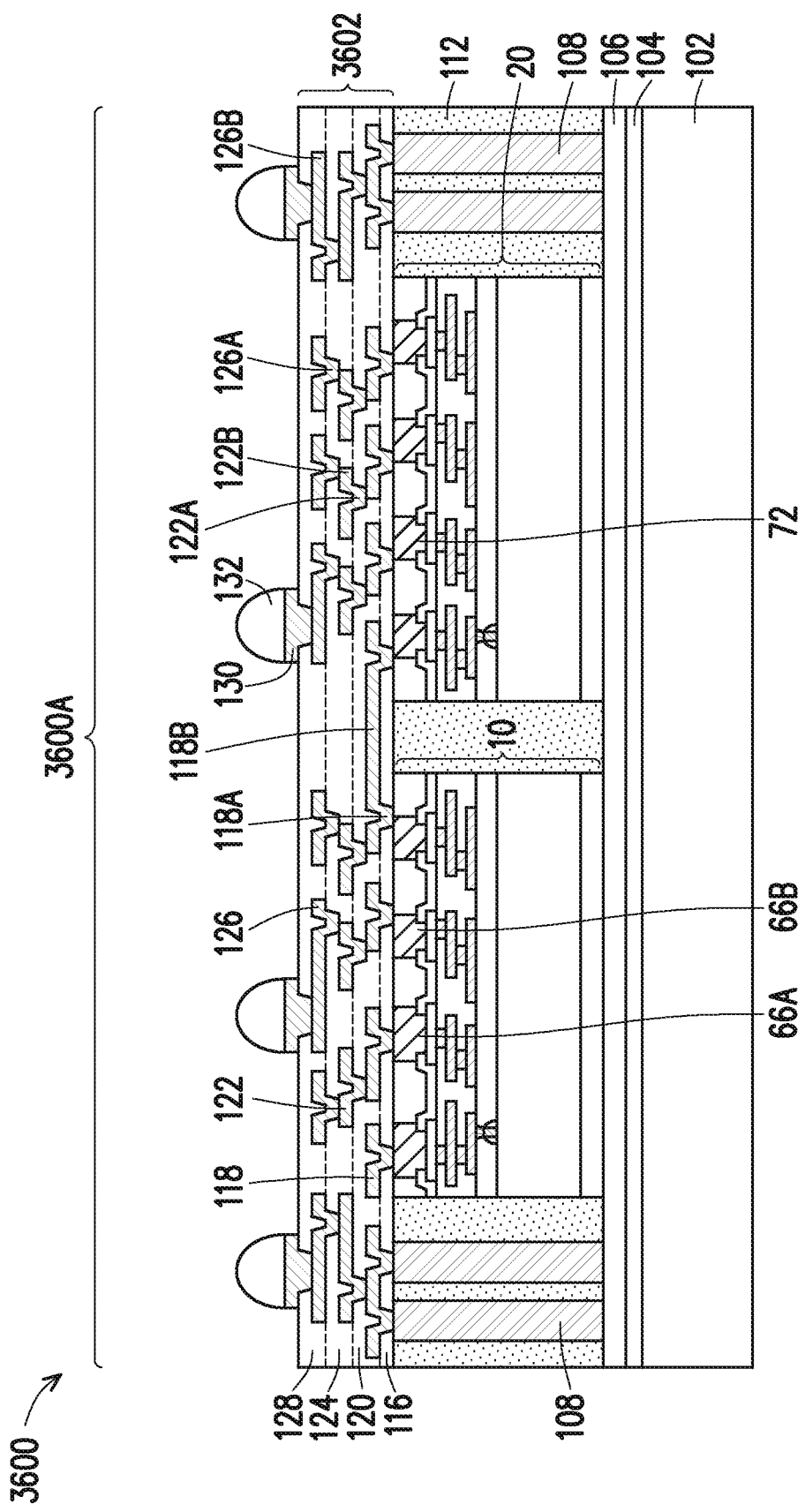
FIG. 70 illustrates a cross-sectional view of a package component in accordance with some embodiments.

FIG. 70 illustrates a cross-sectional view of a package component 3600 in accordance with some embodiments. In FIG. 70, a package region 3600A of the package component 3600 is illustrated. In some embodiments, the package component 3600 comprises a plurality of package regions (such as the package region 3600A). The package component 3600 may also be referred to as a wafer-level packaged structure, such as an integrated fan-out (InFO) wafer-level packaged structure. The package component 3600 is similar to the package component 100 illustrated in FIG. 9, with similar features being labeled by similar numerical references, and descriptions of the similar features are not repeated herein. In some embodiments, the package component 3600 may be formed using process steps similar to the process steps described above with reference to FIGS. 3-9 and the description is not repeated herein.

In some embodiments, the package component 3600 comprises a redistribution structure 3602. The redistribution structure 3602 includes insulating layers 116, 120, 124, and 128, and metallization patterns 118, 122, and 126, and may be formed using process steps described above with reference to FIG. 9 and the description is not repeated herein. In the illustrated embodiment, the vias 118A of the metallization pattern 118 partially land on corresponding die connectors 66B and 72 of integrated circuit dies 10 and 20 respectively. Furthermore, the vias 122A of the metallization pattern 122 partially land on corresponding conductive lines 118B of the metallization pattern 118, and the vias 126A of the metallization pattern 126 partially land on corresponding conductive lines 122B of the metallization pattern 122.

Figure 71:
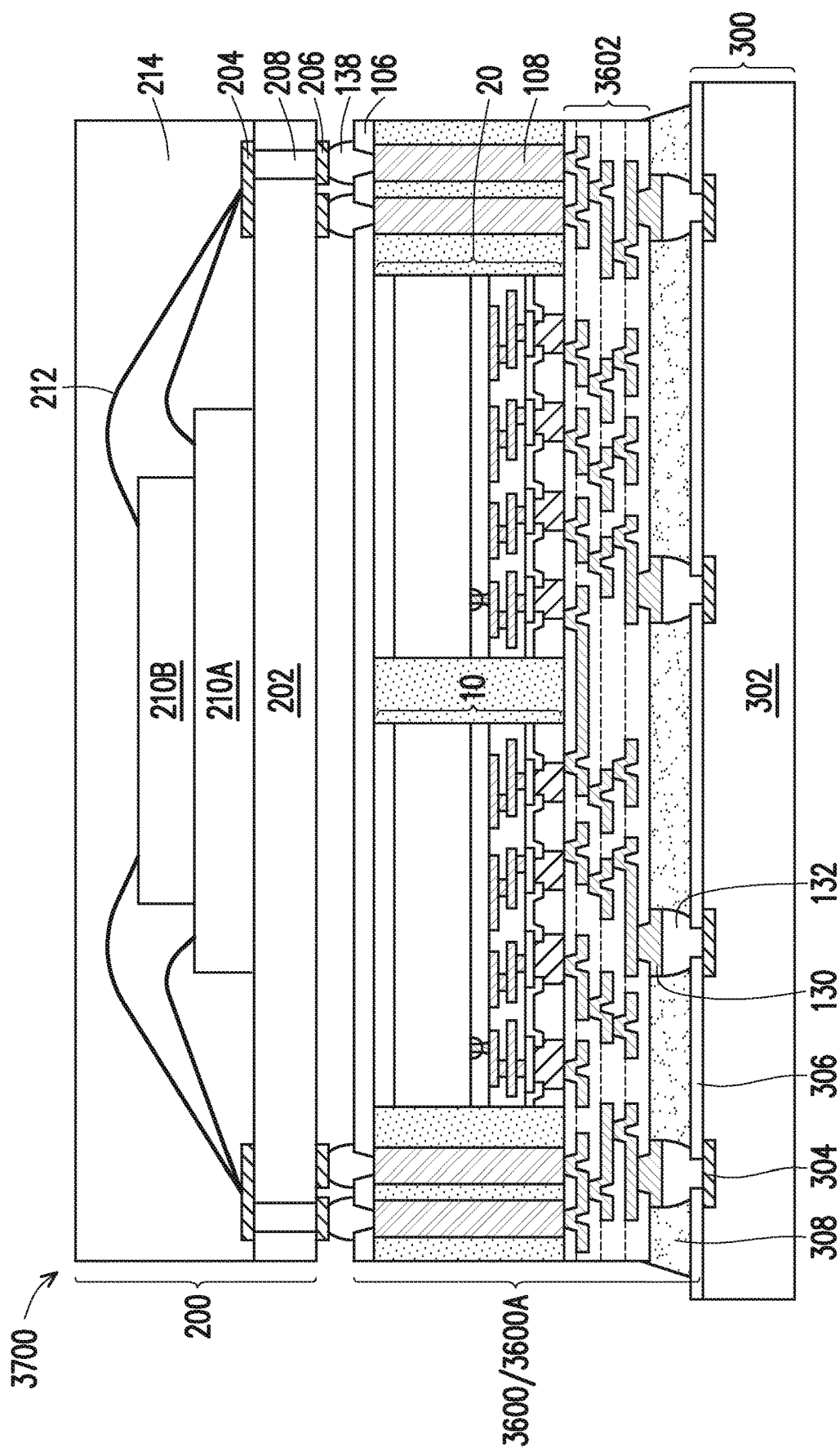
FIG. 71 illustrates a cross-sectional view of a device stack in accordance with some embodiments.

FIG. 71 illustrates a cross-sectional view of a device stack 3700 bonded to a substrate 300 in accordance with some embodiments. The device stack 3700 is similar to the device stack 400 illustrated in FIG. 14, with similar features being labeled by similar numerical references, and descriptions of the similar features are not repeated herein. In some embodiments, the device stack 3700 may be formed by performing process steps described above with reference to FIGS. 13 and 14 on the package component 3600 illustrated in FIG. 70. In some embodiments, the device stack 3700 is bonded to the substrate 300 as described above with reference to FIG. 14.

Figure 72:
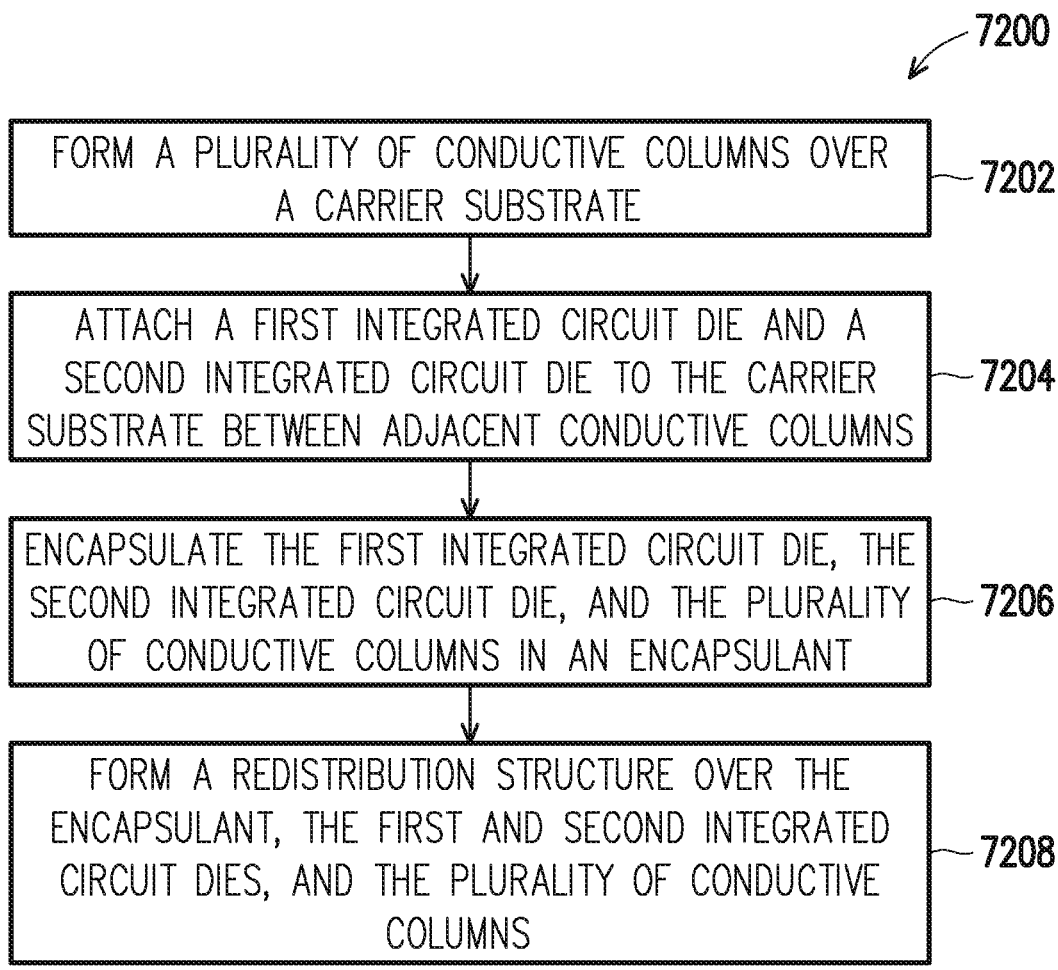
FIG. 72 is a flow diagram illustrating a method of forming a package in accordance with some embodiments.

FIG. 72 is a flow diagram illustrating a method 7200 of forming a package in accordance with some embodiments. The method 7200 starts with step 7202, where a plurality of conductive columns are formed over a carrier substrate as described above with reference to FIGS. 3-5. In step 7204, a first integrated circuit die and a second integrated circuit die are attached to the carrier substrate between adjacent conductive columns as described above with reference to FIG. 6. In step 7206, the first integrated circuit die, the second integrated circuit die, and the plurality of conductive columns are encapsulated in an encapsulant as described above with reference to FIGS. 7 and 8. In step 7208, a redistribution structure is formed over the encapsulant, the first integrated circuit die, the second integrated circuit die, and the plurality of conductive columns as described above with reference to FIG. 9, 15, 20, 25, 32, 37, 42, 47, 54, 56, 58, 60, 62, 64, 66, 68, or 70.

Figure 73:
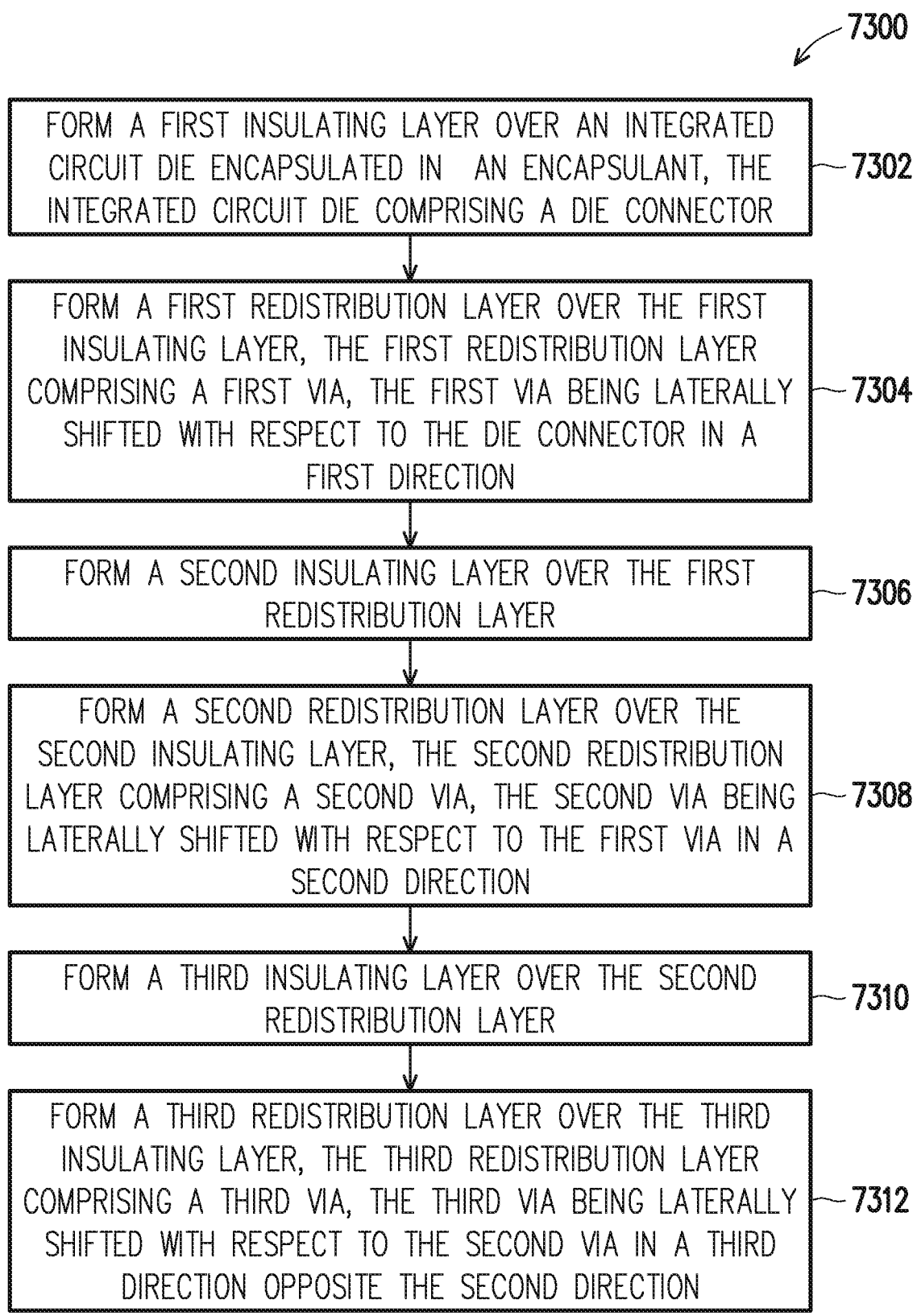
FIG. 73 is a flow diagram illustrating a method of forming a redistribution structure in accordance with some embodiments.

FIG. 73 is a flow diagram illustrating a method 7300 of forming a redistribution structure in accordance with some embodiments. The method 7300 starts with step 7302, where a first insulating layer is formed over an integrated circuit die encapsulated in an encapsulant, where the integrated circuit die comprises a die connector as described above with reference to, for example, FIG. 9. In step 7304, a first redistribution layer is formed over the first insulating layer, the first redistribution layer comprising a first via, the first via being laterally shifted with respect to the die connector in a first direction as described above with reference to, for example, FIG. 9. In step 7306, a second insulating layer is formed over the first redistribution layer as described above with reference to, for example, FIG. 9. In step 7308, a second redistribution layer is formed over the second insulating layer, the second redistribution layer comprising a second via, the second via being laterally shifted with respect to the first via in a second direction as described above with reference to, for example, FIG. 9. In some embodiments, the first direction is same as the second direction. In other embodiments, the first direction is opposite to the second direction. In step 7310, a third insulating layer is formed over the second redistribution layer as described above with reference to, for example, FIG. 9. In step 7312, a third redistribution layer is formed over the third insulating layer, the third redistribution layer comprising a third via, the third via being laterally shifted with respect to the second via in a third direction opposite the second direction as described above with reference to, for example, FIG. 9.

Figure 74:
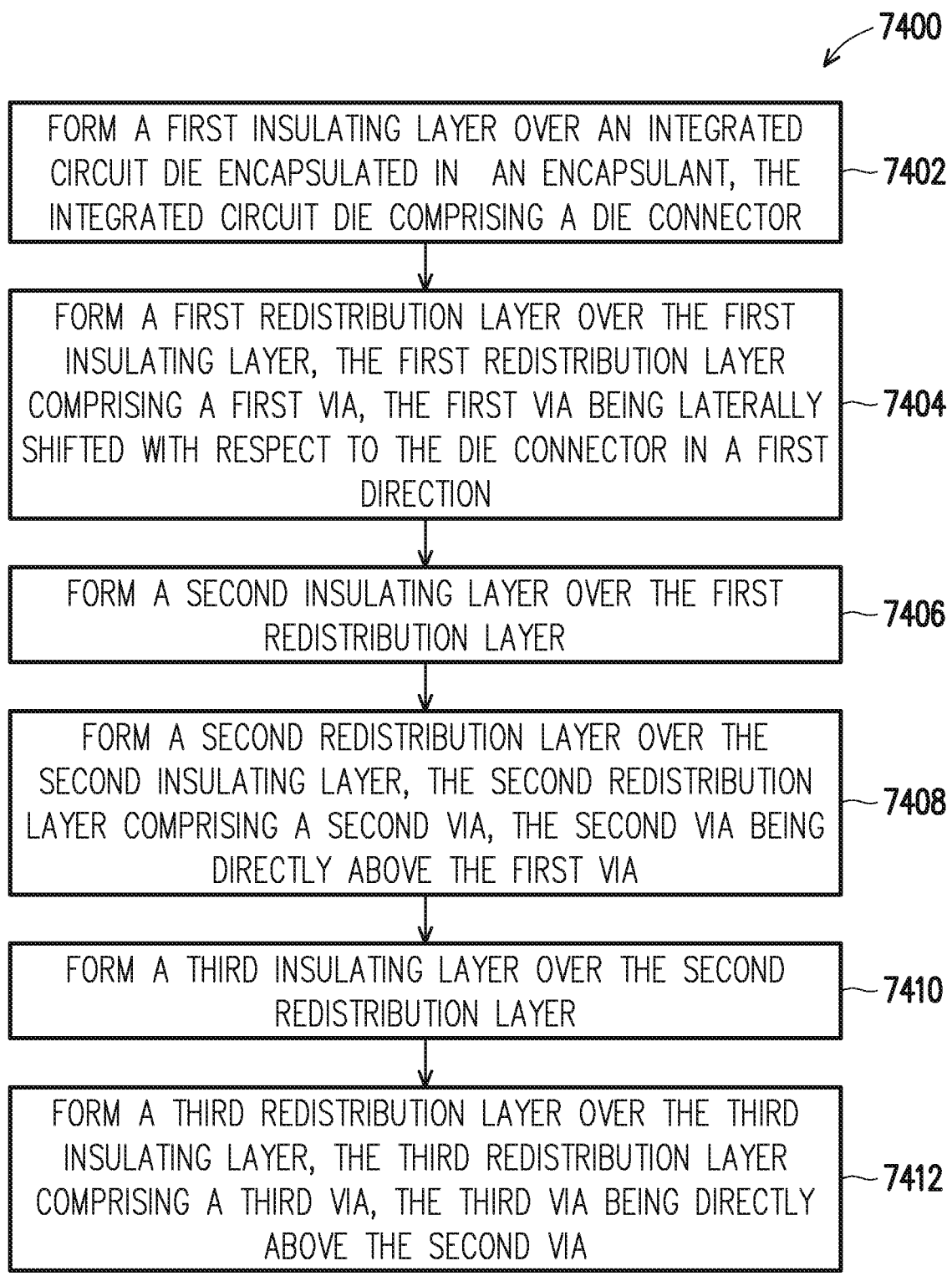
FIG. 74 is a flow diagram illustrating a method of forming a redistribution structure in accordance with some embodiments.

FIG. 74 is a flow diagram illustrating a method 7400 of forming a redistribution structure in accordance with some embodiments. The method 7400 starts with step 7402, where a first insulating layer is formed over an integrated circuit die encapsulated in an encapsulant, where the integrated circuit die comprises a die connector as described above with reference to, for example, FIG. 32. In step 7404, a first redistribution layer is formed over the first insulating layer, the first redistribution layer comprising a first via, the first via being laterally shifted with respect to the die connector in a first direction as described above with reference to, for example, FIG. 32. In step 7406, a second insulating layer is formed over the first redistribution layer as described above with reference to, for example, FIG. 32. In step 7408, a second redistribution layer is formed over the second insulating layer, the second redistribution layer comprising a second via, the second via being directly above the first via as described above with reference to, for example, FIG. 32. In step 7410, a third insulating layer is formed over the second redistribution layer as described above with reference to, for example, FIG. 32. In step 7412, a third redistribution layer is formed over the third insulating layer, the third redistribution layer comprising a third via, the third via being directly above the second via as described above with reference to, for example, FIG. 32.

Figure 75:
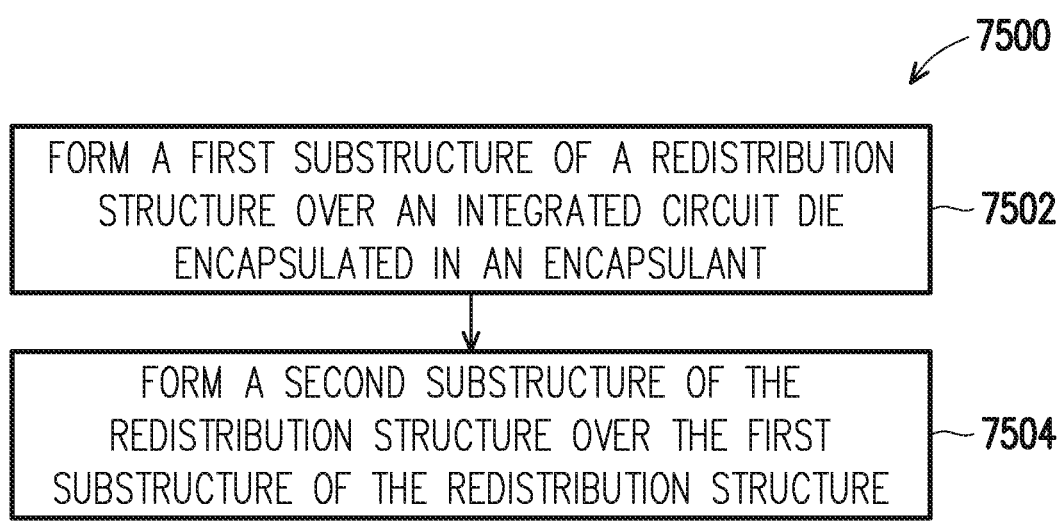
FIG. 75 is a flow diagram illustrating a method of forming a redistribution structure in accordance with some embodiments.

FIG. 75 is a flow diagram illustrating a method 7500 of forming a redistribution structure in accordance with some embodiments. The method 7500 starts with step 7502, where a first substructure of the redistribution structure is formed over an integrated circuit die encapsulated in an encapsulant. In step 7504, a second substructure of the redistribution structure is formed over the first substructure of the redistribution structure. In some embodiments, the step 7502 comprises performing the method 7300 (see FIG. 73) and the step 7504 comprises performing the method 7400 (see FIG. 74) as described above with reference to, for example, FIG. 54. In other embodiments, the step 7502 comprises performing the method 7400 (see FIG. 74) and the step 7504 comprises performing the method 7300 (see FIG. 73) as described above with reference to, for example, FIG. 62.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment, a semiconductor device includes: a die encapsulated by an encapsulant, the die including a pad; a connector electrically connected to the pad; and a first via in physical contact with the connector, the first via being laterally offset from the connector by a first non-zero distance in a first direction, the first via having a tapered sidewall. In an embodiment, the semiconductor device further includes a second via over and in physical contact with the first via, the second via being laterally offset from the first via by a second non-zero distance in a second direction. In an embodiment, the second direction is same as the first direction. In an embodiment, the second direction is opposite to the first direction. In an embodiment, the semiconductor device further includes a third via over and in physical contact with the second via, the third via being laterally offset from the second via by a third non-zero distance in a third direction opposite to the second direction. In an embodiment, the semiconductor device further includes a second via directly over and in physical contact with the first via. In an embodiment, the semiconductor device further includes a third via directly over and in physical contact with the second via.

In accordance with another embodiment, a semiconductor device includes: a die embedded in an encapsulant, the die including a first pad, a second pad and a third pad; a first connector physically connected to the first pad; a second connector physically connected to the second pad; a third connector physically connected to the third pad; and a redistribution structure physically coupled to the first connector, the second connector and the third connector, wherein a first via of the redistribution structure is physically connected to a top surface of the first connector, the first via laterally extending beyond an edge of the first connector in a first direction, the first via having a tapered sidewall. In an embodiment, a second via of the redistribution structure is over and physically connected to the first via, a vertical axis of the second via being laterally spaced apart from a vertical axis of the first via in a second direction, the vertical axis of the first via and the vertical axis of the second via being perpendicular to the top surface of the first connector. In an embodiment, a third via of the redistribution structure is over and physically connected to the second via, a vertical axis of the third via being laterally spaced apart from the vertical axis of the second via in a third direction opposite to the second direction, the vertical axis of the third via being perpendicular to the top surface of the first connector. In an embodiment, a fourth via of the redistribution structure is directly over and physically connected to the third via. In an embodiment, a second via of the redistribution structure is physically connected to a top surface of the second connector, the second via laterally extending beyond an edge of the second connector in a second direction. In an embodiment, the second direction is different from the first direction. In an embodiment, a second via of the redistribution structure is physically connected to a top surface of the third connector, the second via fully landing on the top surface of the third connector.

In accordance with yet another embodiment, a method includes: attaching a die to a carrier substrate, the die including a connector; forming an encapsulant over the carrier substrate and along sidewalls of the die; and forming a redistribution structure over the die and the encapsulant, wherein forming the redistribution structure includes: forming a first redistribution layer, a first via of the first redistribution layer being in physical contact with the connector, the first via being laterally offset from the connector by a first non-zero distance in a first direction, the first via having a tapered sidewall. In an embodiment, forming the redistribution structure further includes forming a second redistribution layer over the first redistribution layer, a second via of the second redistribution layer being over and in physical contact with the first via, the second via being laterally offset from the first via by a second non-zero distance in a second direction. In an embodiment, forming the redistribution structure further includes forming a third redistribution layer over the second redistribution layer, a third via of the third redistribution layer being over and in physical contact with the second via, the third via being laterally offset from the second via by a third non-zero distance in a third direction opposite to the second direction. In an embodiment, forming the redistribution structure further includes forming a second redistribution layer over the first redistribution layer, a second via of the second redistribution layer being directly over and in physical contact with the first via. In an embodiment, forming the redistribution structure further includes forming a third redistribution layer over the second redistribution layer, a third via of the third redistribution layer being directly over and in physical contact with the second via. In an embodiment, the method further includes, before attaching the die to the carrier substrate, forming a conductive column over the carrier substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a die encapsulated by an encapsulant, the die comprising a first pad, a second pad, a third pad, and a fourth pad;
a first connector electrically connected to the first pad;
a second connector electrically connected to the second pad;
a third connector electrically connected to the third pad;
a fourth connector electrically connected to the fourth pad;
a first via in physical contact with the first connector, the first via being laterally offset from the first connector by a first non-zero distance in a first direction, the first via having a tapered sidewall;
a second via in physical contact with the second connector, the second via being laterally offset from the second connector by a second non-zero distance in a second direction different from the first direction;
a third via in physical contact with the third connector, the third via being laterally offset from the third connector by a third non-zero distance in a third direction different from the first direction and the second direction; and
a fourth via in physical contact with the fourth connector, the fourth via fully landing on the fourth connector.

2. The semiconductor device of claim 1, further comprising a fifth via over and in physical contact with the first via, the fifth via being laterally offset from the first via by a fourth non-zero distance in a fourth direction.

3. The semiconductor device of claim 2, wherein the fourth direction is same as the first direction.

4. The semiconductor device of claim 2, wherein the fourth direction is opposite to the first direction.

5. The semiconductor device of claim 2, further comprising a sixth via over and in physical contact with the fifth via, the sixth via being laterally offset from the fifth via by a fifth non-zero distance in a fifth direction opposite to the fourth direction.

6. The semiconductor device of claim 1, further comprising a fifth via directly over and in physical contact with the first via.

7. The semiconductor device of claim 6, further comprising a sixth via directly over and in physical contact with the fifth via.

8. A semiconductor device comprising:
a die embedded in an encapsulant, the die comprising a first pad, a second pad, a third pad, and a fourth pad;
a first connector physically connected to the first pad;
a second connector physically connected to the second pad;
a third connector physically connected to the third pad; and
a redistribution structure physically coupled to the first connector, the second connector and the third connector, wherein a first via of the redistribution structure is physically connected to a top surface of the first connector, the first via laterally extending beyond an edge of the first connector in a first direction, the first via having a tapered sidewall, wherein a second via of the redistribution structure is physically connected to a top surface of the second connector, the second via laterally extending beyond an edge of the second connector in a second direction different from the first direction, and wherein a third via of the redistribution structure is physically connected to a top surface of the third connector, the third via laterally extending beyond an edge of the third connector in a third direction different from the first direction and the second direction.

9. The semiconductor device of claim 8, wherein a fourth via of the redistribution structure is over and physically connected to the first via, a vertical axis of the fourth via being laterally spaced apart from a vertical axis of the first via in a fourth direction, the vertical axis of the first via and the vertical axis of the fourth via being perpendicular to the top surface of the first connector.

10. The semiconductor device of claim 9, wherein a fifth via of the redistribution structure is over and physically connected to the fourth via, a vertical axis of the fifth via being laterally spaced apart from the vertical axis of the fourth via in a fifth direction opposite to the fourth direction, the vertical axis of the fifth via being perpendicular to the top surface of the first connector.

11. The semiconductor device of claim 10, wherein a sixth via of the redistribution structure is directly over and physically connected to the fifth via.

12. The semiconductor device of claim 8, further comprising a fourth connector physically connected to the fourth pad, wherein a fourth via of the redistribution structure is physically connected to a top surface of the fourth connector, the fourth via fully landing on the top surface of the fourth connector.

13. The semiconductor device of claim 12, wherein the first connector, the second connector, and the third connector have a first width, and wherein the fourth connector has a second width greater than the first width.

14. The semiconductor device of claim 8, further comprising a first conductive column and a second conductive column embedded in the encapsulant, the die being interposed between the first conductive column and the second conductive column.

15. A semiconductor device comprising:
a first die embedded in an encapsulant, the first die comprising a first connector and a second connector, wherein a first width of the first connector is greater than a second width of the second connector;
a second die embedded in the encapsulant adjacent the first die, the second die comprising a third connector and a fourth connector; and
a redistribution structure over and electrically coupled to the first die and the second die, wherein a first via of the redistribution structure is in physical contact with a top surface of the first connector and fully overlaps with the first connector in a plan view, wherein a second via of the redistribution structure is in physical contact with a top surface of the second connector and partially overlaps with the second connector in the plan view, the second via being laterally offset from the second connector by a first non-zero distance in a first direction, wherein a third via of the redistribution structure is in physical contact with a top surface of the third connector and partially overlaps with the third connector in the plan view, the third via being laterally offset from the third connector by a second non-zero distance in a second direction different from the first direction, and wherein a fourth via of the redistribution structure is in physical contact with a top surface of the fourth connector and partially overlaps with the fourth connector in the plan view, the fourth via being laterally offset from the fourth connector by a third non-zero distance in a third direction different from the first direction and the second direction.

16. The semiconductor device of claim 15, wherein a third width of the third connector is equal to the second width of the second connector.

17. The semiconductor device of claim 15, wherein the second direction is opposite to the first direction.

18. The semiconductor device of claim 15, wherein the first non-zero distance is less than or equal to ⅔ of a width of the second via at an interface between the second via and the second connector.

19. The semiconductor device of claim 15, further comprising a first conductive column and a second conductive column embedded in the encapsulant, the first die and the second die being interposed between the first conductive column and the second conductive column.

20. The semiconductor device of claim 15, wherein the first non-zero distance is same as the second non-zero distance.

* * * * *